(12) United States Patent
Jung et al.

(10) Patent No.: US 9,627,387 B2
(45) Date of Patent: Apr. 18, 2017

(54) SEMICONDUCTOR DEVICE AND METHOD FOR MANUFACTURING THE SAME

(71) Applicants: Hyeonok Jung, Daejeon (KR); Chan Ho Park, Incheon (KR); Chan-Sic Yoon, Anyang-si (KR); Kiseok Lee, Busan (KR); Wonwoo Lee, Yongin-si (KR); Sunghee Han, Hwaseong-si (KR)

(72) Inventors: Hyeonok Jung, Daejeon (KR); Chan Ho Park, Incheon (KR); Chan-Sic Yoon, Anyang-si (KR); Kiseok Lee, Busan (KR); Wonwoo Lee, Yongin-si (KR); Sunghee Han, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/955,078

(22) Filed: Dec. 1, 2015

(65) Prior Publication Data

US 2016/0163637 A1    Jun. 9, 2016

(30) Foreign Application Priority Data

Dec. 4, 2014 (KR) ........................ 10-2014-0172957

(51) Int. Cl.
*H01L 23/48* (2006.01)
*H01L 27/108* (2006.01)

(52) U.S. Cl.
CPC ...... *H01L 27/108* (2013.01); *H01L 27/10885* (2013.01); *H01L 27/10888* (2013.01); *H01L 27/10891* (2013.01); *H01L 27/10897* (2013.01)

(58) Field of Classification Search
CPC ......... H01L 21/76831; H01L 21/76897; H01L 21/76895; H01L 27/10888; H01L 27/108; H01L 23/5221; H01L 23/535
See application file for complete search history.

(56) References Cited

U.S. PATENT DOCUMENTS 7,728,375 B2    6/2010   Shin et al.
8,309,449 B2    11/2012  Jeong et al.
(Continued)

FOREIGN PATENT DOCUMENTS

JP     2004-103622 A    4/2004
KR     10-1119156 B1    3/2012
(Continued)

*Primary Examiner* — A. Sefer
(74) *Attorney, Agent, or Firm* — Harness, Dickey & Pierce, P.L.C.

(57) ABSTRACT

A semiconductor device includes a semiconductor substrate including active portions including first and second dopant regions, word lines on the substrate and extending in a first direction to intersect the active portions, first and second bit lines on the substrate and extending in a second direction to intersect the word lines, and contact structures in regions between the word lines and between the first and second bit lines when viewed from a plan view. The first and second bit lines are connected to the first dopant regions. The contact structures are in contact with the second dopant regions, respectively. The contact structures each include a contact plug and a contact pad. The contact pads contact the second dopant regions. A separation distance between the contact plugs and the first bit lines is less than separation distance between the contact pads and the first bit lines.

21 Claims, 60 Drawing Sheets

(56) References Cited

U.S. PATENT DOCUMENTS

| | | | |
|---|---|---|---|
| 8,557,660 B2 | 10/2013 | Kim | |
| 2012/0040528 A1* | 2/2012 | Kim | H01L 21/76816 |
| | | | 438/675 |
| 2012/0292690 A1 | 11/2012 | Seo | |
| 2013/0292847 A1* | 11/2013 | Choi | H01L 23/498 |
| | | | 257/774 |
| 2013/0344666 A1* | 12/2013 | Moon | H01L 27/10823 |
| | | | 438/259 |
| 2014/0061939 A1 | 3/2014 | Yu et al. | |
| 2014/0110816 A1 | 4/2014 | Kim et al. | |
| 2014/0299989 A1* | 10/2014 | Lim | H01L 23/48 |
| | | | 257/751 |
| 2015/0126013 A1* | 5/2015 | Hwang | H01L 27/10888 |
| | | | 438/381 |

FOREIGN PATENT DOCUMENTS

| | | |
|---|---|---|
| KR | 10-2013-0125595 A | 11/2013 |
| KR | 10-2014-0091842 A | 7/2014 |

\* cited by examiner

SEMICONDUCTOR DEVICE AND METHOD FOR MANUFACTURING THE SAME

CROSS-REFERENCE TO RELATED APPLICATION

This U.S. non-provisional patent application claims priority under 35 U.S.C. §119 to Korean Patent Application No. 10-2014-0172957, filed on Dec. 4, 2014, in the Korean Intellectual Property Office, the disclosure of which is hereby incorporated by reference in its entirety.

BACKGROUND

The present disclosure relates to a semiconductor device and/or a method for manufacturing the same. More particularly, the present disclosure relates to a semiconductor device with improved reliability and/or a method for manufacturing the same.

Semiconductor devices are widely used in an electronic industry because of their small sizes, multi-functional characteristics, and/or low manufacturing costs. However, as semiconductor devices have become more integrated with the development of the electronic industry, widths and spaces of patterns included in the semiconductor devices have been reduced but heights and/or aspect ratios of the patterns have been increased. Thus, dispersion characteristics of depositions processes and/or etching processes may affect the reliability of semiconductor devices.

SUMMARY

Example embodiments of inventive concepts relate to a semiconductor device capable of improving reliability and integration density.

Example embodiments of inventive concepts also relate to a method for manufacturing a semiconductor device capable of improving reliability and integration density.

According to example embodiments of inventive concepts, a semiconductor device may include: a semiconductor substrate including active portions, each of the active portions including first and second dopant regions; word lines on the substrate, the word lines extending in a first direction and intersecting the active portions; first and second bit lines on the substrate, the first and second bit lines intersecting the word lines and extending in a second direction that is perpendicular to the first direction, the first and second bit lines being adjacent to each other and connected to the first dopant regions; and contact structures in regions between the word lines and between the first and second bit lines when viewed from a plan view, the contact structures being in contact with the second dopant regions, respectively. Each of the contact structures may include a contact plug in contact with a portion of a contact pad. The contact pads of the contact structure may contact the second dopant regions. The contact plugs may be spaced apart from sidewalls of the first and second bit lines by a first distance between the first and second bit lines. The contact pads may be spaced apart from the sidewall of the first bit line by a second distance greater than the first distance and may be adjacent to the sidewall of the second bit line.

In example embodiments, the semiconductor device may further include: a bit line contact pattern between each of the first dopant regions and each of the first bit lines; a bit line contact spacer between the bit line contact pattern and the contact pad of one of the contact structures; and a bit line spacer between the contact plug of one of the contact structures and the first and second bit lines on the bit line contact spacer.

In example embodiments, a width of the bit line contact spacer may be greater than a width of the bit line spacer.

In example embodiments, widths of the bit line contact patterns may be substantially equal to widths of the first and second bit lines.

In example embodiments, a bottom surface of the contact pad in one of the contact structures may be lower than a top surface of the bit line contact spacer.

In example embodiments, the contact pad in one of the contact structures may have a rounded sidewall adjacent to the bit line contact spacer when viewed from the plan view.

In example embodiments, an overlapping area between the contact pad in one of the contact structures and the active portion may be greater than an overlapping area between the contact plug in one of the contact structures and the active portion when viewed from the plan view.

In example embodiments, a maximum distance between the contact pads adjacent to each other in the first direction may be greater than a width of each of the first and second bit lines.

In example embodiments, a minimum distance between the contact pads adjacent to each other in the first direction may be smaller than a width of each of the first and second bit lines.

According to example embodiments of inventive concepts, a semiconductor device may include: a semiconductor substrate including active portions defined by a device isolation layer, each of the active portions including first and second dopant regions that are spaced apart from each other; word lines on the substrate, the word lines extending in a first direction and intersecting the active portions; bit line contact patterns connected to the first dopant regions between the word lines; bit lines connected to the bit line contact patterns, the bit lines extending in a second direction perpendicular to the first direction to intersect the word lines; contact pads on the substrate in regions between the word lines and between the bit lines when viewed from a plan view, the contact pads being in contact with the second dopant regions, respectively; and bit line contact spacers on the substrate between the contact pads and the bit line contact patterns. Each of the bit line contact patterns may be between the contact pads adjacent to each other in the first direction. Each of the contact pads may have a rounded sidewall adjacent to one of the bit line contact spacers when viewed from a plan view.

In example embodiments, the rounded sidewalls of adjacent contact pads among the contact pads may face each other when viewed from the plan view, and each of the bit line contact patterns may be between the rounded sidewalls of an adjacent pair of the contact pads.

In example embodiments, the semiconductor device may further include: contact plugs in contact with portions of the contact pads, respectively; and bit line spacers between the bit lines and the contact plugs. The bit line spacers may contact top surfaces of the contact pads.

In example embodiments, a width of the bit line contact patterns may be substantially equal to a width of the bit line, and a distance between the bit line contact patterns and adjacent contact pads among the contact pad may be greater than a distance between the bit lines and adjacent contact plugs among the contact plugs.

In example embodiments, a bottom surface of the contact pads may be lower than a top surface of the bit line contact spacers.

In example embodiments, a bottom surface of the bit line contact patterns may be lower than a bottom surface of the contact pads.

In example embodiments, an overlapping area between the contact pads and the active portions may be greater than an overlapping area between the contact plugs and the active portions when viewed from the plan view.

In example embodiments, the semiconductor device may further include: a mold pattern between the contact plugs adjacent to each other between the bit lines. One of the bit line spacers may extend between the contact plug and the mold pattern.

According to example embodiments of inventive concepts, a method for manufacturing a semiconductor device may include: forming a device isolation layer on a semiconductor substrate, the semiconductor substrate including active portions exposed by the device isolation layer; forming first and second dopant regions in each of the active portions; forming an insulating layer on the active portions, the insulating layer defining openings that respectively expose the first dopant regions; forming bit lines and bit line contact patterns on the substrate, the bit lines intersecting the active portions on the insulating layer, and the bit line contact patterns in the openings, respectively; forming bit line contact spacers covering sidewalls of the bit line contact patterns in the openings; forming contact pads that penetrate the insulating layer and are connected to the second dopant regions, respectively, and the contact pads being adjacent to portions of sidewalls of adjacent bit line contact spacers among the bit line contact spacers; forming bit line spacers covering sidewalls of the bit lines, each of the bit line spacers defining an upper contact hole that exposes a portion of an adjacent one of the contact pads; and forming contact plug in each of the upper contact holes.

In example embodiments, the bit line contact spacers may include an insulating material having an etch selectivity with respect to the insulating layer.

In example embodiments, the forming the bit lines and the bit line contact patterns may include: forming a conductive layer filling the openings on the insulating layer; and patterning the conductive layer to expose sidewalls of the openings and sidewalls of the bit line contact patterns.

In example embodiments, forming the bit line contact spacers may include: forming a spacer layer that fills the openings and covers the bit lines and the insulating layer; and etching the spacer layer to expose a top surface of the insulating layer.

In example embodiments, the forming the contact pads may include: forming lower contact holes by etching portions of the insulating layer exposed between the bit lines, the lower contact holes exposing the second dopant regions and portions of sidewalls of the bit line contact spacers; forming a conductive layer filling the lower contact holes; and etching the conductive layer to expose top surfaces of the bit line contact spacers.

In example embodiments, the method may further include: forming a sub-spacer layer before the forming bit line contact spacers. The sub-spacer layer may conformally cover the bit lines and inner sidewalls of the openings in which the bit line contact patterns are formed. The bit line contact spacers may expose portions of the sub-spacer layer covering sidewalls of the bit lines.

In example embodiments, the method may further include: forming mold patterns on the insulating layer before the forming the bit line spacers. The mold patterns may define upper contact holes. The contact holes may expose respective portions of the insulating layer that cover the second dopant regions. The forming the bit line spacers may include forming the bit line spacers to cover inner sidewalls of the contact holes, respectively.

According to example embodiments of inventive concepts, a semiconductor device includes: a semiconductor substrate including a trench that defines a plurality of active portions spaced apart from each other, each of the active portions including first and second dopant regions that are spaced apart from each other; word lines on the substrate, the word lines intersecting the active portions and extending in a first direction, the word lines spaced apart from each other in a second direction crossing the first direction; bit lines on the substrate, the bit lines extending in the second direction and being spaced apart from each other in the first direction, bit line contact patterns spaced apart from each other, the bit line contact patterns electrically connecting the first dopant regions to the bit lines; contact pads on top of the second dopant regions, each of the contact pads including a portion that extends from a side of a corresponding one of the second dopant regions towards an adjacent one of the bit line contact patterns and is spaced apart from the adjacent one of the bit line contact patterns; and contact plugs electrically connected to the second dopant regions through the contact pads, each of the contact plugs having a bottom width that less than a width of the contact pads, each of the contact plugs being on top of the portion of a corresponding one of the contact pads and on top of a corresponding one of the second dopant regions.

In example embodiments, the contact pads and contact plugs may define contact structures. Each one of the contact structures may include one of the contact plugs on one of the contact pads. In at least one of the contact structures, a separation distance between a side of the contact plug of the contact structure and a side of one of the bit line contact structures closest to the contact structure may be less than a separation distance between the contact pad of the contact structure and the side of the one of the bit line contact structures closest to the contact structure.

In example embodiment, bit line spacers may be on the substrate between the contact plugs and the bit line contact patterns. Parts of the bit line spacers may be on top of the contact pads at sides of the contacts of the contact pads opposite the portions of the contact pads.

In example embodiments, data storage structures may be on the contact plugs.

In example embodiments, a top surface of the dopant regions may be below a top surface of the second dopant regions.

BRIEF DESCRIPTION OF THE DRAWINGS

The foregoing and other features of inventive concepts will be apparent from the more particular description of non-limiting embodiments of inventive concepts, as illustrated in the accompanying drawings in which like reference characters refer to like parts throughout the different views. The drawings are not necessarily to scale, emphasis instead being placed upon illustrating principles of inventive concepts. In the drawings:

FIGS. 9A to 19A are plan views illustrating a method for manufacturing a semiconductor device according to example embodiments of inventive concepts;

FIGS. 9B to 19B are cross-sectional views taken along lines I-I', II-II', and III-III' of FIGS. 9A to 19A, respectively, to illustrate a method for manufacturing a semiconductor device according to example embodiments of inventive concepts;

FIGS. 9C to 19C are enlarged views of portions 'B' of FIGS. 9B to 19B, respectively;

FIGS. 20A to 27A are plan views illustrating a method for manufacturing a semiconductor device according to example embodiments of inventive concepts;

FIGS. 20B to 27B are cross-sectional views taken along lines I-I' and II-IF of FIGS. 20A to 27A, respectively, to illustrate a method for manufacturing a semiconductor device according to example embodiments of inventive concepts;

DETAILED DESCRIPTION OF EXAMPLE EMBODIMENTS

Figure 1:
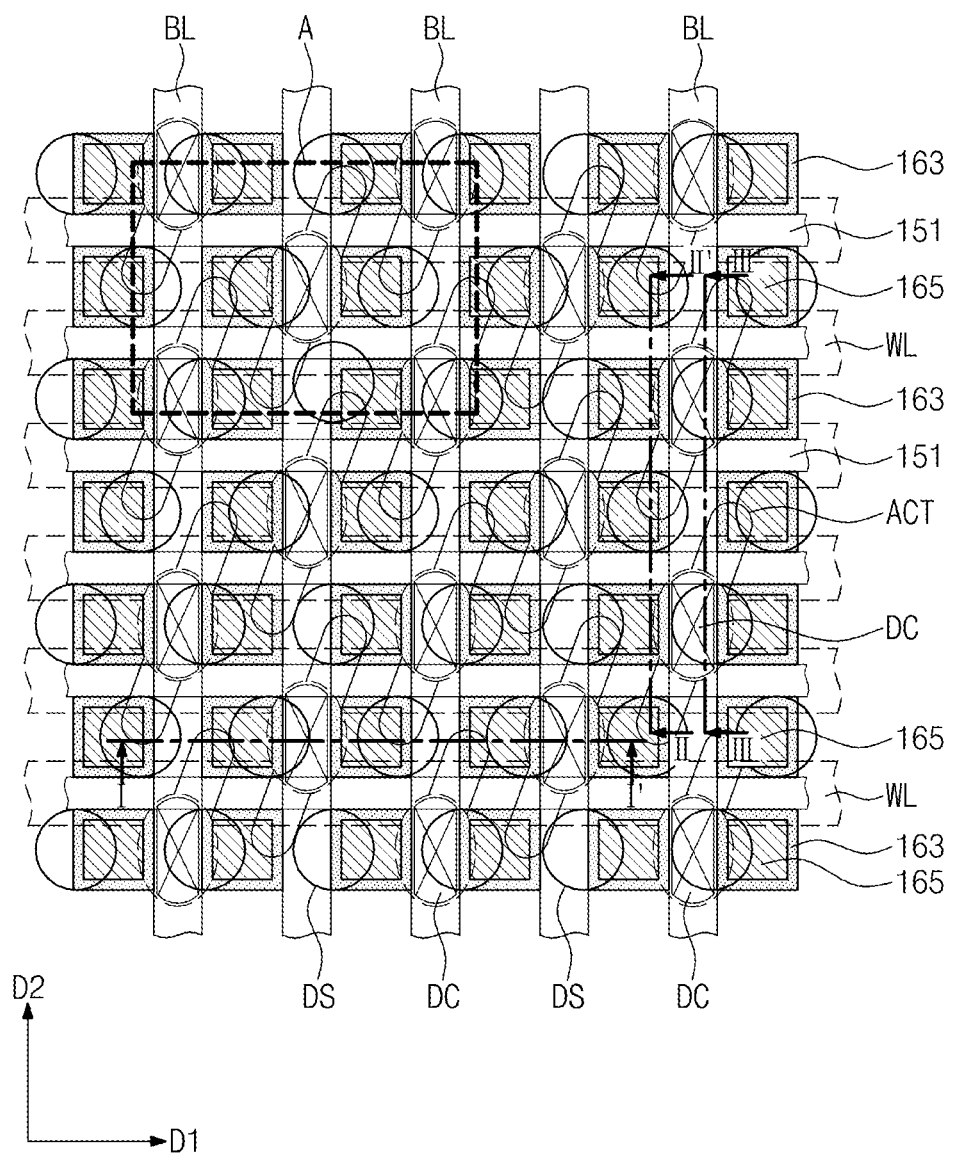
FIG. 1 is a plan view illustrating a semiconductor device according to example embodiments of inventive concepts.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference characters and/or numerals in the drawings denote like elements, and thus their description may not be repeated.

The terminology used herein is for the purpose of describing particular embodiments only and is not intended to limit example embodiments of inventive concepts. As used herein, the singular terms "a," "an" and "the" are intended to include the plural forms as well, unless the context clearly indicates otherwise. As used herein, the term "and/or" includes any and all combinations of one or more of the associated listed items. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

It will be also understood that although the terms first, second, third etc. may be used herein to describe various elements, these elements should not be limited by these terms. These terms are only used to distinguish one element from another element. Thus, a first element (component, region, layer, and/or section, etc.) discussed below could be termed a second element (component, region, layer, and/or section, etc.) without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Figure 2:
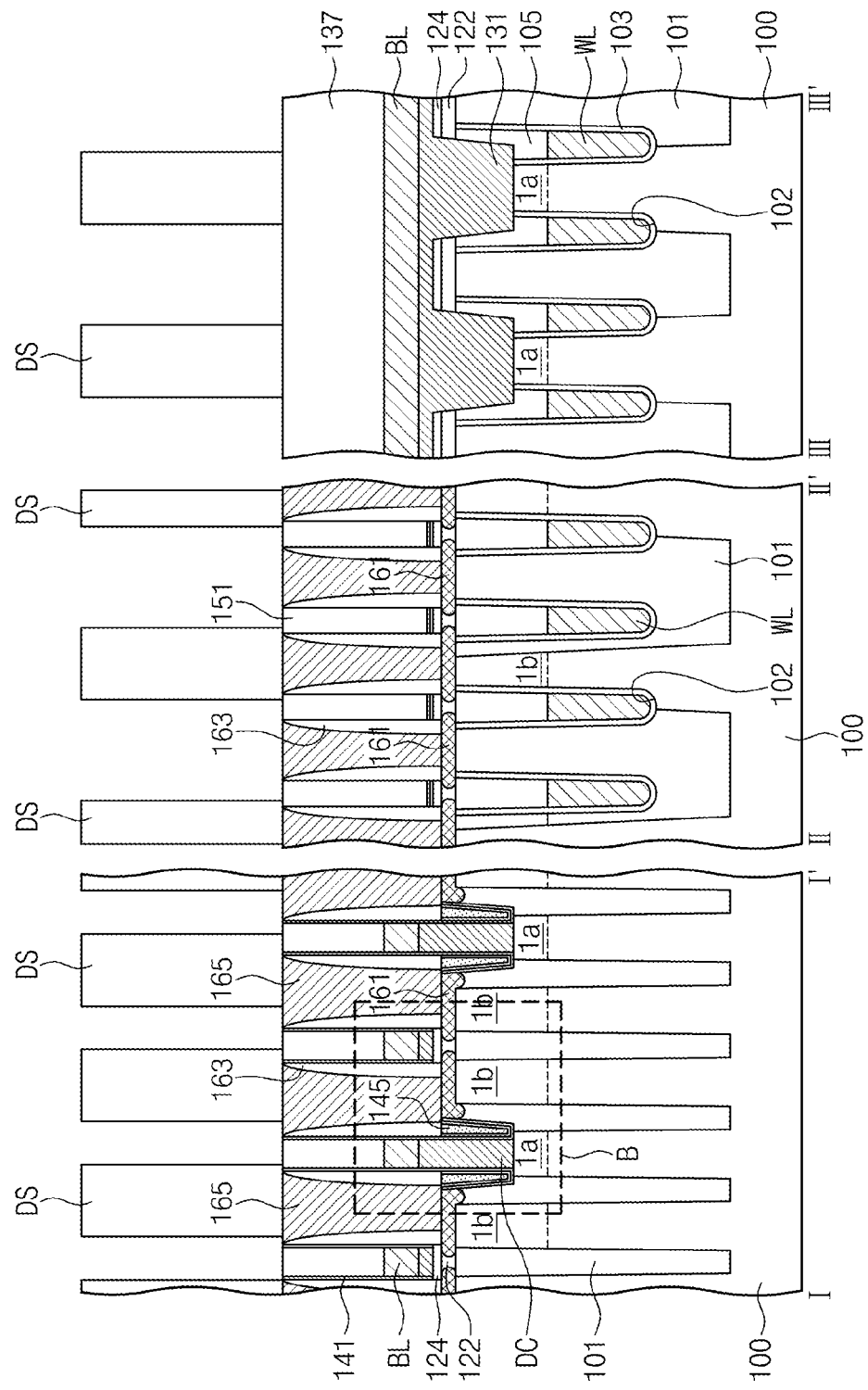
FIG. 2 is a cross-sectional view taken along lines I-I', II-II', and III-III' of FIG. 1 to illustrate a semiconductor device according to example embodiments of inventive concepts.
Figure 3:
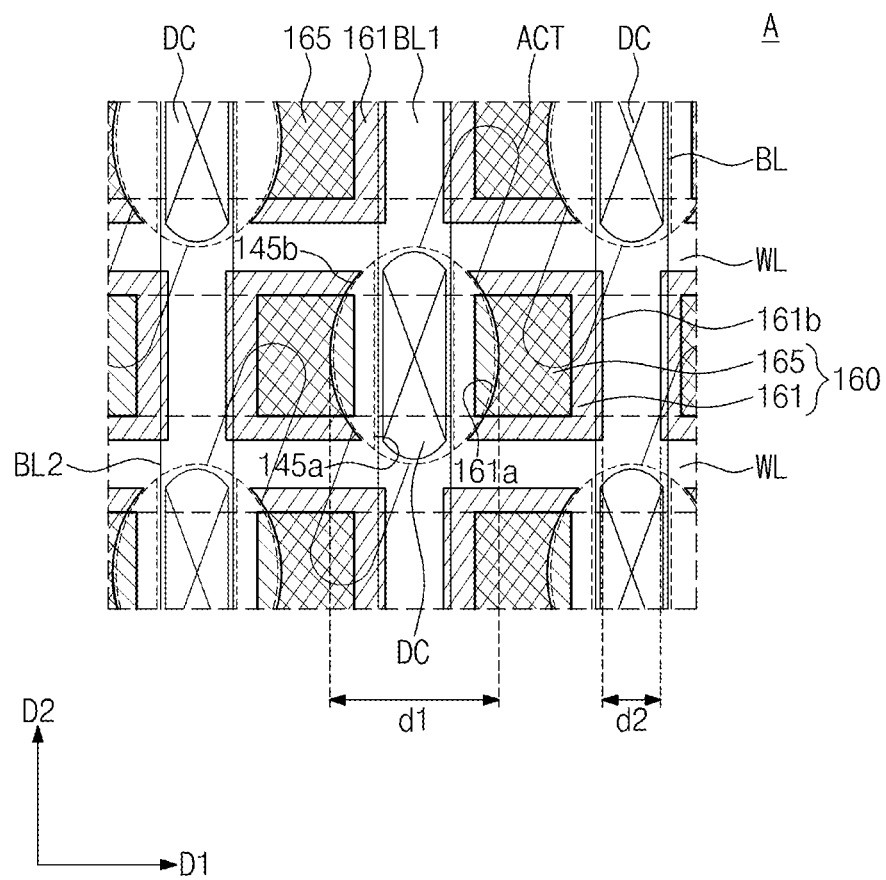
FIG. 3 is an enlarged view of a portion 'A' of FIG. 1 to illustrate a portion of a semiconductor device according to example embodiments of inventive concepts.
Figure 4:
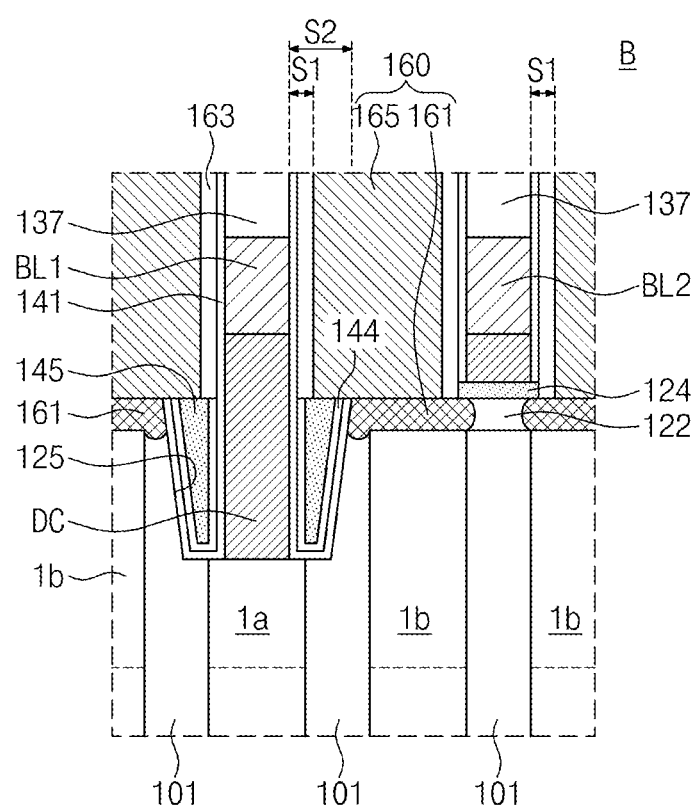
FIG. 4 is an enlarged view of a portion 'B' of FIG. 2 to illustrate a portion of a semiconductor device according to example embodiments of inventive concepts.
Figure 5:
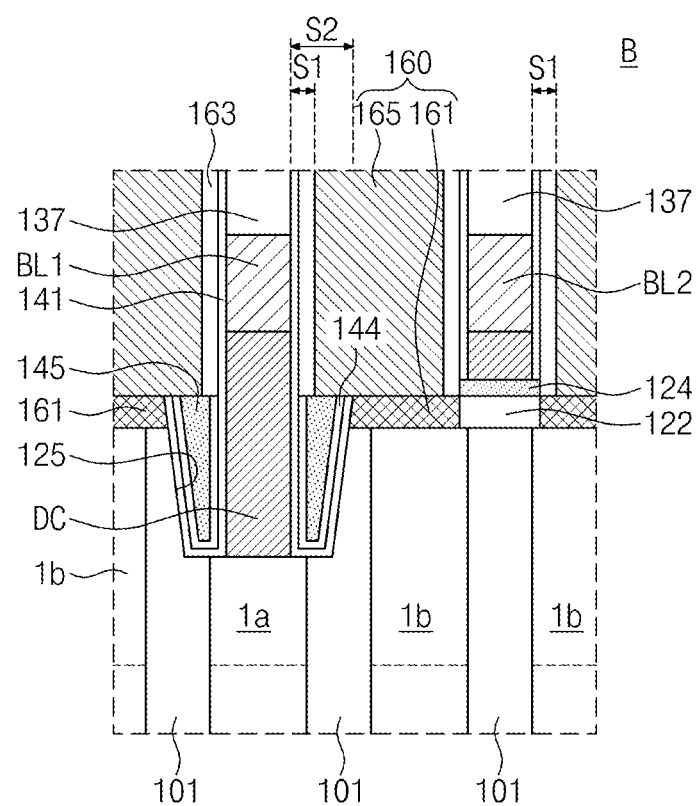
FIG. 5 is an enlarged view of a portion 'B' of FIG. 2 to illustrate a modification of a portion of a semiconductor device according to example embodiments of inventive concepts.

FIG. 1 is a plan view illustrating a semiconductor device according to example embodiments of inventive concepts. FIG. 2 is a cross-sectional view taken along lines I-I', II-II', and III-III' of FIG. 1 to illustrate a semiconductor device according to example embodiments of inventive concepts. FIG. 3 is an enlarged view of a portion 'A' of FIG. 1 to illustrate a portion of a semiconductor device according to example embodiments of inventive concepts. FIG. 4 is an enlarged view of a portion 'B' of FIG. 2 to illustrate a portion of a semiconductor device according to example embodiments of inventive concepts. FIG. 5 is an enlarged view of a portion 'B' of FIG. 2 to illustrate a modification of a portion of a semiconductor device according to example embodiments of inventive concepts.

Referring to FIGS. 1, 2, 3, and 4, a device isolation layer 101 may be disposed in a semiconductor substrate 100 to define active portions ACT. The semiconductor substrate 100 may be a silicon substrate, a germanium substrate, or a silicon-germanium substrate.

According to example embodiments, the active portions ACT may have rectangular shapes (or bar shapes) and may be two-dimensionally arranged along a first direction D1 and a second direction D2. In example embodiments, the active portions ACT may be arranged in a zigzag form when viewed from a plan view. Each of the active portions ACT may have a long axis extending in a direction diagonal to the first and second directions D1 and D2.

In more detail, the active portions ACT may be arranged along rows and columns when viewed from a plan view. The rows may be parallel to the first direction D1, and the columns may be parallel to the second direction D2. In some embodiments, the rows may include first, second, and third rows adjacent to each other. End portions of the active portions ACT of the first row adjacent to the second row may be disposed between the active portions ACT of the second row, respectively, when viewed from a plan view. In addition, end portions of the active portions ACT of the third row adjacent to the second row may also be disposed between the active portions ACT of the second row, respectively, when viewed from a plan view. The active portions ACT of the first to third rows may be spaced apart from each other. The end portion of the active portion ACT of the first row and the end portion of the active portion ACT of the third row may overlap with each other in the first direction D1 between the active portions ACT, adjacent to each other, of the second row. The active portions ACT may be doped with dopants of a first conductivity type.

Word lines WL may be disposed in the semiconductor substrate 100 and may extend in the first direction D1 in a plan view to intersect the active portions ACT and the device isolation layer 101. Each of the word lines WL may be formed in a gate recess region that is recessed by a predetermined depth from a top surface of the semiconductor substrate 100. A gate insulating layer 103 may be disposed between the each of the word lines WL and an inner surface of the gate recess region. Top surfaces of the word lines WL may be lower than the top surface of the semiconductor substrate 100, and gate hard mask patterns 105 may be disposed on the word lines WL, respectively.

The word lines WL may include at least one of a semiconductor material doped with dopants (e.g., doped silicon), a metal (e.g., tungsten, aluminum, titanium, and/or tantalum), a conductive metal nitride (e.g., titanium nitride, tantalum nitride, and/or tungsten nitride), or a metal-semiconductor compound (e.g., a metal silicide). The gate insulating layer 103 may include at least one of an oxide (e.g., silicon oxide), a nitride (e.g., silicon nitride), an oxynitride (e.g., silicon oxynitride), or a high-k dielectric material. The high-k dielectric material may be an insulating material having a dielectric constant higher than that of a nitride (e.g., silicon nitride). For example, the high-k dielectric material may include at least one of insulating metal oxides such as hafnium oxide and aluminum oxide. According to example embodiments, a cross section of the gate insulating layer 103 may have a U-shape that is in contact with an entire inner surface of the gate recess region. The gate hard mask patterns 105 may include at least one of an oxide (e.g., silicon oxide), a nitride (e.g., silicon nitride), or an oxynitride (e.g., silicon oxynitride).

First and second dopant regions 1a and 1b may be formed in each of the active portions ACT at both sides of the word line WL. Bottom surfaces of the first and second dopant regions 1a and 1b may be disposed at a predetermined depth from a top surface of the active portion ACT. The first dopant region 1a may be disposed in the active portion ACT between the word lines WL, and the second dopant regions 1b may be disposed in both end portions of the active portion ACT, respectively. The second dopant regions 1b are spaced apart from the first dopant region 1a. The first and second dopant regions 1a and 1b may be doped with dopants of a second conductivity type different from the first conductivity type of the active portion ACT. One of the first conductivity type and the second conductivity type may be an N-type, and the other of the first conductivity type and the second conductivity type may be a P-type.

Bit lines BL may be disposed on the semiconductor substrate 100 and may extend in the second direction D2 to intersect the word lines WL. An insulating pattern 122 may be disposed between the semiconductor substrate 100 and the bit lines BL. A bit line contact patterns DC may be disposed between each of the bit lines BL and each of the first dopant regions 1a. The bit line contact pattern DC may penetrate the insulating pattern 122 so as to be in contact with the first dopant region 1a. The bit line contact patterns DC may have the substantially same width as the bit line BL. In other words, sidewalls of the bit line contact patterns DC may be aligned with sidewalls of the bit lines BL. Bottom surfaces of the bit line contact patterns DC may be lower than the top surface of the semiconductor substrate 100 and may be higher than the top surfaces of the word lines WL. An etch stop pattern 124 may be disposed between the insulating pattern 122 and the bit lines BL. A bit line mask pattern 137 may be disposed on each of the bit line BL.

In example embodiments, each of the bit line contact patterns DC may be locally disposed in a recess region 125 formed in the semiconductor substrate 100. The recess region 125 may have a width that is greater than the width of the bit line BL.

A bit line contact spacer 145 may be disposed between the bit line contact pattern DC and a sidewall of the recess region 125. The bit line contact spacer 145 may have a first sidewall 145a adjacent to a sidewall of the bit line contact pattern DC and a second sidewall 145b opposite to the first sidewall 145a. The second sidewall 145b of the bit line contact spacer 145 may be rounded in a plan view, as illustrated in FIG. 3. According to example embodiments, the bit line contact spacer 145 may be formed of an insulating material having an etch selectivity with respect to the insulating pattern 122. For example, the insulating pattern 122 may be formed of silicon oxide, and the bit line contact spacer 145 may be formed of at least one of silicon nitride or silicon oxynitride.

In addition, first and second spacers 141 and 144 may be disposed between the bit line contact spacer 145 and the bit line contact pattern DC. The first spacer 141 may extend onto the sidewall of the bit line BL, and the second spacer 144 may be formed to surround the bit line contact spacer 145 in the recess region 125. The second spacer 144 may be formed of an insulating material having an etch selectivity with respect to the first spacer 141 and the bit line contact spacer 145.

According to example embodiments, contact structures 160 may be disposed between the bit lines BL. The contact structures 160 may be connected to the second dopant regions 1b, respectively. In other words, each of the contact structures 160 may be disposed between the word lines WL and between the bit lines BL when viewed from a plan view and may be connected to each of the second dopant regions 1b. In example embodiments, each of the contact structures 160 may include a contact pad 161 adjacent to the bit line contact spacer 145 and a contact plug 165 adjacent to the bit line BL. In addition, a mold pattern 151 may be disposed between the contact structures 160.

In more detail, as illustrated in FIGS. 3 and 4, first and second bit lines BL1 and BL2 adjacent to each other may extend in parallel to each other. The contact structure 160 may be disposed between the first and second bit lines BL1 and BL2. A reference numeral 163 is omitted in FIG. 3 for ease of description.

The contact pad 161 may be in contact with a top surface of the second dopant region 1b and may have a rounded sidewall 161a adjacent to the bit line contact spacer 145 when viewed from a plan view. A bottom surface of the contact pad 161 may be lower than a top surface of the bit line contact spacer 145. The rounded sidewalls 161a of the contact pads 161 respectively disposed at both sides of the bit line contact pattern DC may face each other when viewed from a plan view. According to the embodiment illustrated in FIG. 3, the rounded sidewalls 161a of the contact pads 161 may be concave with respect to both sidewalls of the bit line contact pattern DC. In other words, a width of the contact pad 161 in the first direction D1 may be progressively greater toward the word lines WL when viewed from a plan view. In addition, the maximum distance d1 between the contact pads 161 adjacent to each other with the bit line contact pattern DC interposed therebetween may be greater than a distance d2 between the contact pads 161 adjacent to each other with the bit line interposed therebetween. In other words, the maximum distance d1 between the contact pads 161 adjacent to each other in the first direction D1 may be greater than the width of the bit line BL. The minimum distance d2 between the contact pads 161 adjacent to each other in the first direction D1 may be smaller than the width of the bit line BL.

The contact plug 165 may be in contact with a portion of the contact pad 161 and a portion of the bit line contact spacer 145. According to example embodiments, a width of the contact plug 165 between the bit lines BL may be smaller than a width of the contact pad 161 between the bit lines BL. In more detail, referring to FIGS. 3 and 4, the contact plug 165 disposed between the first and second bit lines BL1 and BL2 adjacent to each other may be spaced apart from each of the sidewalls of the first and second bit lines BL1 and BL2 by a first distance S1. The contact pad 161 may have the rounded sidewall 161a (hereinafter, referred to as 'a first sidewall 161a) adjacent to the bit line contact spacer 145 and a second sidewall 161b opposite to the first sidewall 161a. The first sidewall 161a of the contact pad 161 may be spaced apart from one sidewall of the bit line contact pattern DC of the first bit line BL1 by a second distance S2 greater than the first distance S1. The second sidewall 161b of the contact pad 161 may be adjacent to one sidewall of the second bit line BL2. In other words, the contact pad 161 disposed between the first and second bit lines BL1 and BL2 may have the first sidewall 161a spaced apart from one sidewall of the first bit line BL1 by the second distance S2, and the second sidewall 161b adjacent to the one sidewall of the second bit line BL2. In more detail, as illustrated in FIG. 4, the second sidewall 161b of the contact pad 161 may be disposed under the second bit line BL2. Alternatively, the second sidewalls 161b of the contact pads 161 adjacent to each other with the second bit line BL2 interposed therebetween may be aligned with both sidewalls of the second bit line BL2, as illustrated in FIG. 5. According to these embodiments, an overlapping area between the contact pad 161 and the active portion ACT may be greater than an overlapping area between the contact plug 165 and the active portion ACT when viewed from a plan view.

A bit line spacer 163 may be disposed between the contact plug 165 and the bit line BL and may be disposed on the contact pad 161 to cover the sidewall of the bit line BL. The bit line spacer 163 may be in contact with a portion of the contact pad 161 and a portion of the bit line contact spacer 145. A width of the bit line spacer 163 may be smaller than a width of the bit line contact spacer 145. The bit line spacer 163 may extend into between the mold pattern 151 and the contact plug 165. In other words, the bit line spacer 163 may surround the contact plug 165.

According to example embodiments, a data storage pattern DS may be formed on each of the contact plugs 165. The data storage patterns DS may be electrically connected to the second dopant regions 1b through the contact plugs 165 and the contact pads 161, respectively. In some embodiments, the data storage patterns DS may be arranged in a honeycomb form or a zigzag form when viewed from a plan view.

In example embodiments, the data storage pattern DS may be an electrode of a capacitor. Alternatively, the data storage pattern DS may be a variable resistance pattern that is switchable between two resistance states by an electrical pulse applied thereto. For example, the data storage pattern DS may include a phase-change material of which a phase is changed according to a current amount, an perovskite compound, a transition metal oxide, a magnetic material, a ferromagnetic material, or an anti-ferromagnetic material.

Figure 6:
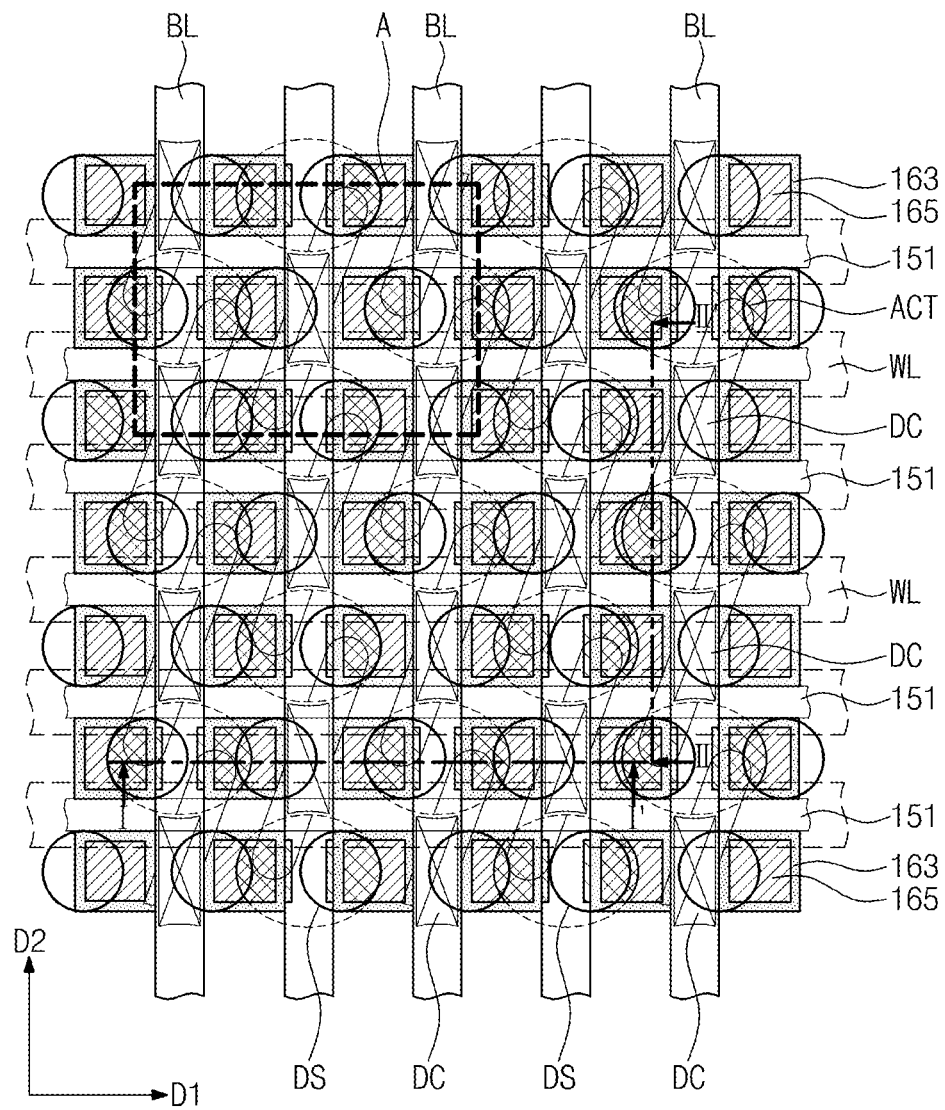
FIG. 6 is a plan view illustrating a semiconductor device according to example embodiments of inventive concepts.
Figure 7:
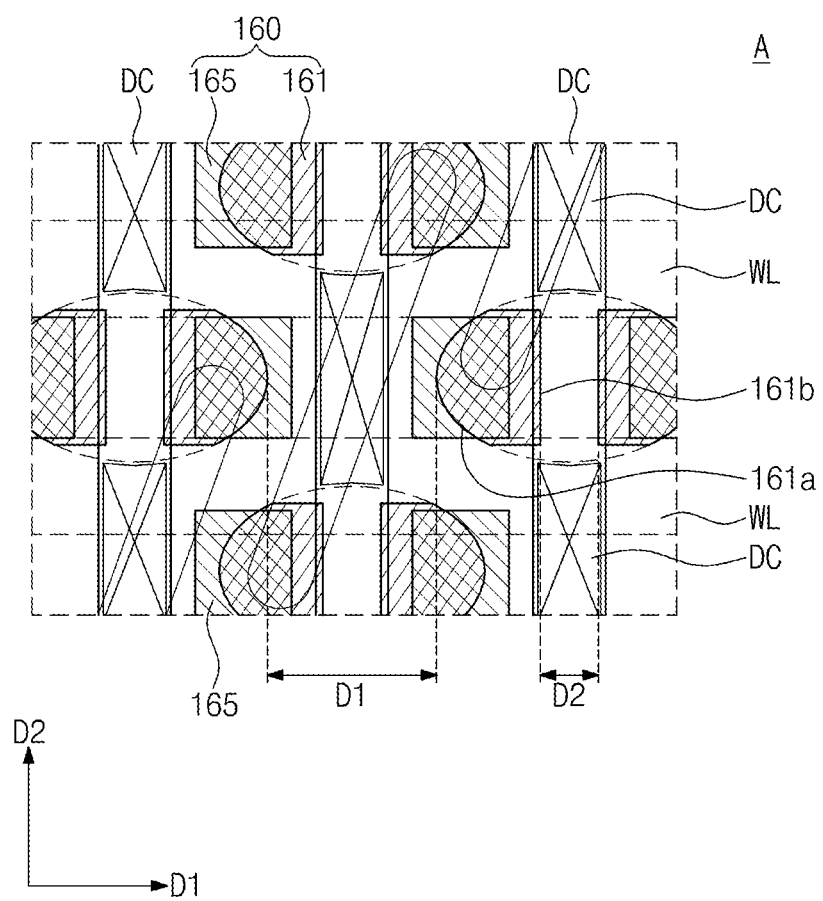
FIG. 7 is an enlarged view of a portion 'A' of FIG. 6 to illustrate a portion of a semiconductor device according to example embodiments of inventive concepts.
Figure 8:
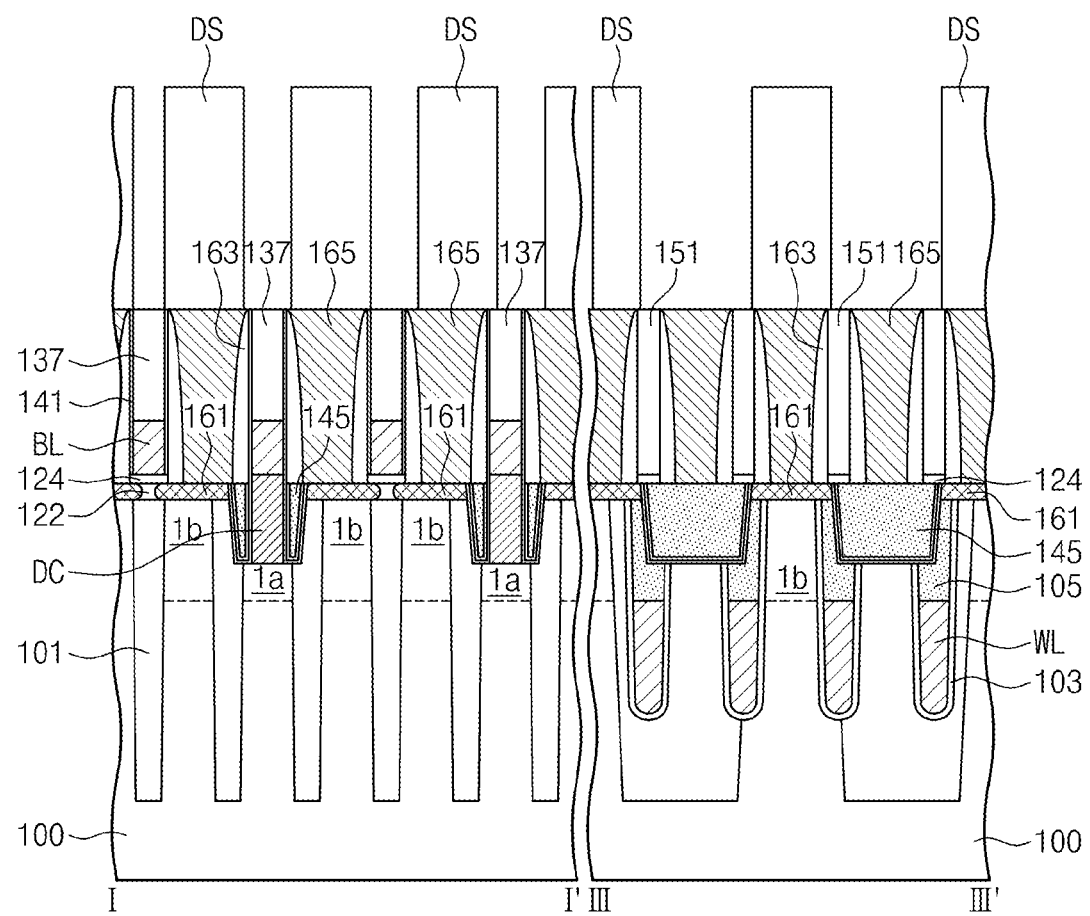
FIG. 8 is a cross-sectional view taken along lines I-I' and II-IF of FIG. 6 to illustrate a semiconductor device according to example embodiments of inventive concepts.

FIG. 6 is a plan view illustrating a semiconductor device according to example embodiments of inventive concepts. FIG. 7 is an enlarged view of a portion 'A' of FIG. 6 to illustrate a portion of a semiconductor device according to example embodiments of inventive concepts. FIG. 8 is a cross-sectional view taken along lines I-I' and II-II' of FIG. 6 to illustrate a semiconductor device according to example embodiments of inventive concepts.

Referring to FIGS. 6, 7, and 8, as described in the above embodiment, a device isolation layer 101 may be disposed in a semiconductor substrate 100 to define active portions ACT and word lines WL may be formed in the semiconductor substrate 100. The word lines WL may extend in the first direction D1 to intersect the active portions ACT.

First and second dopant regions 1a and 1b may be formed in each of the active portions ACT. The first dopant region 1a may be formed in a central portion of each of the active portions ACT, and the second dopant regions 1b may be formed in both edge portions of each of the active portions ACT, respectively.

Bit line contact patterns DC may be connected to the first dopant regions 1a, respectively, and bit lines BL may extend in the second direction D2 on an insulating pattern 122. The bit lines BL may be connected to the bit line contact patterns DC. An etch stop pattern 124 may be disposed between the insulating pattern 122 and the bit lines BL.

Contact structures 160 may be respectively disposed in spaces defined between the word lines WL and between the bit lines BL when viewed from a plan view. The contact structures 160 may penetrate the insulating pattern 122 so as to be connected to the second dopant regions 1b, respectively.

Each of the contact structures 160 may include a contact pad 161 being in contact with the second dopant region 1b and a contact plug 165 being in contact with a portion of the contact pad 161. Here, the contact plug 165 may be spaced apart from one-sidewalls of the bit lines BL adjacent to the contact plug 165 by a first distance. The contact pad 161 may have a first sidewall 161a adjacent to the bit line contact spacer 145 and a second sidewall 161b opposite to the first sidewall 161a. The first sidewall 161a of the contact pad 161 may be rounded when viewed from a plan view. The first sidewall 161a of the contact pad 161 may be spaced apart from one sidewall of the bit line contact pattern DC by a second distance greater than the first distance, and the second sidewall 161b of the contact pad 161 may be adjacent to one sidewall of the bit line BL.

Referring to FIG. 7, the rounded sidewalls 161a of the contact pads 161 adjacent to each other with the bit line contact pattern DC interposed therebetween may face each other when viewed from a plan view. In the present embodiment, the rounded sidewalls 161a of the contact pads 161 may be concave with respect to the both sidewalls of the bit line contact pattern DC when viewed from a plan view. In other words, a width of the contact pad 161 in the first direction D1 may be progressively less toward the word lines WL when viewed from a plan view. In addition, as illustrated in FIG. 7, the maximum distance d1 between the contact pads 161 adjacent to each other in the first direction D1 may be greater than a width of the bit line BL, and the minimum width d2 between the contact pads 161 adjacent to each other in the first direction D1 may be smaller than the width of the bit line BL.

As described in the aforementioned embodiment, the bit line contact spacer 145 may be disposed between the contact pad 161 and the bit line contact pattern DC, and the bit line spacer 163 may be disposed between the contact plug 165 and the sidewall of the bit line BL. Here, a width of the bit line spacer 163 may be smaller than that of the bit line contact spacer 145. According to example embodiments, a data storage pattern DS may be disposed on each of the contact plugs 165. The data storage patterns DS may be electrically connected to the second dopant regions 1b through the contact plugs 165 and the contact pads 161, respectively.

In example embodiments, the data storage pattern DS may be an electrode of a capacitor. Alternatively, the data storage pattern DS may be a variable resistance pattern that is switchable between two resistance states by an electrical pulse applied thereto. For example, the data storage pattern DS may include a phase-change material of which a phase is changed according to a current amount, an perovskite compound, a transition metal oxide, a magnetic material, a ferromagnetic material, or an anti-ferromagnetic material.

FIGS. 9A to 19A are plan views illustrating a method for manufacturing a semiconductor device according to example embodiments of inventive concepts. FIGS. 9B to 19B are cross-sectional views taken along lines I-I', II-II', and III-III' of FIGS. 9A to 19A, respectively, to illustrate a method for manufacturing a semiconductor device according to example embodiments of inventive concepts. FIGS. 9C to 19C are enlarged views of portions 'B' of FIGS. 9B to 19B, respectively.

Figure 9A:
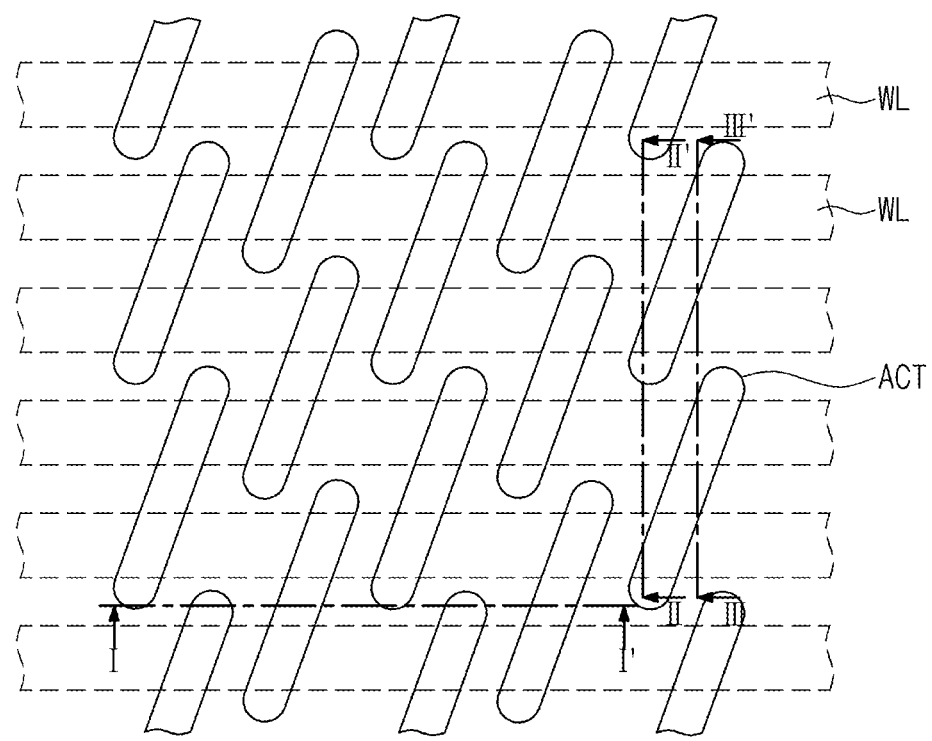
Figure 9A:
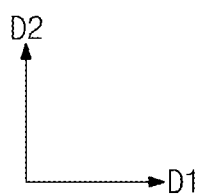
Figure 9B:
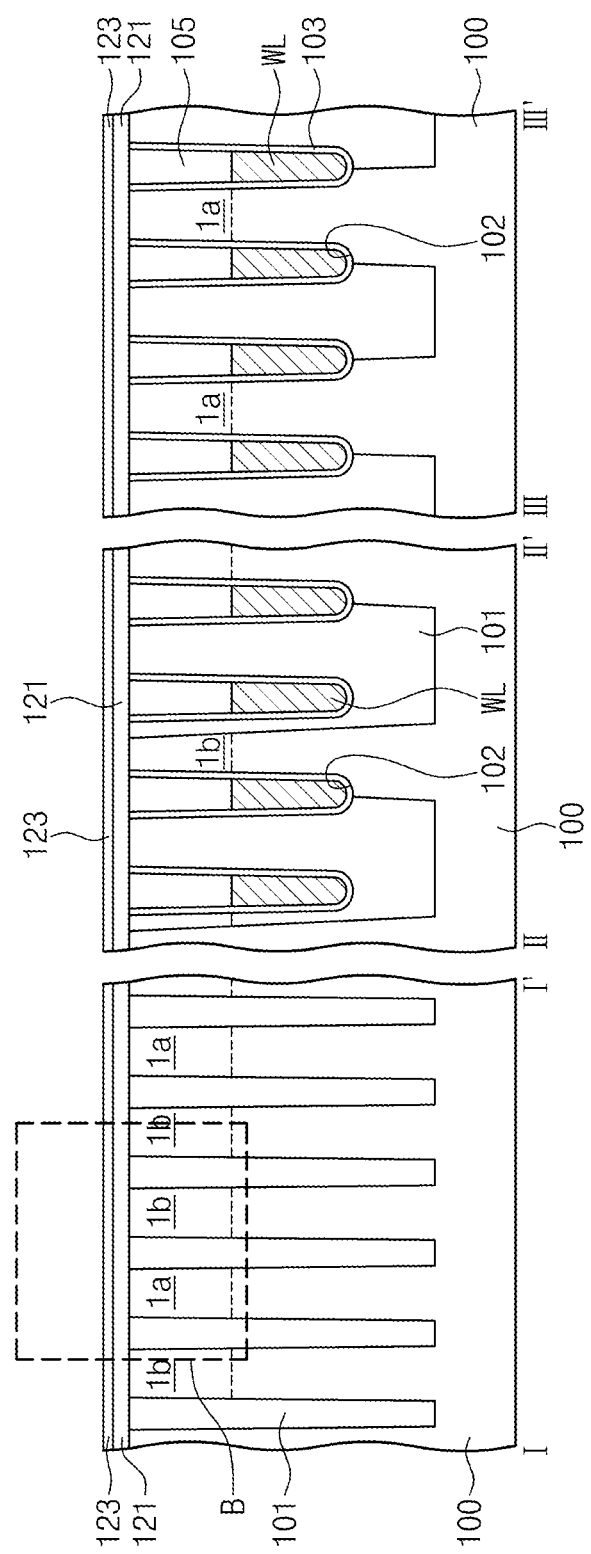
Figure 9C:
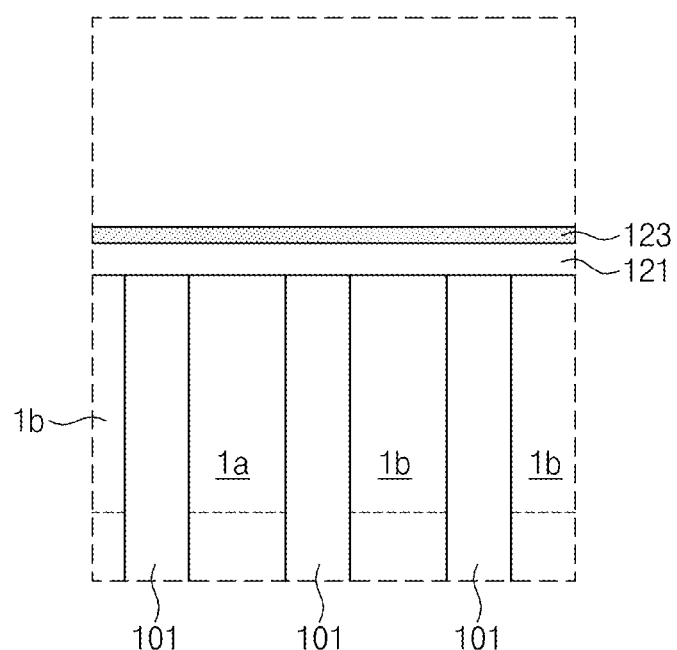

Referring to FIGS. 9A, 9B, and 9C, a device isolation layer 101 may be formed in a semiconductor substrate 100 to define active portions ACT.

The semiconductor substrate 100 may include a single-crystalline semiconductor material. For example, the semiconductor substrate 100 may be a silicon substrate, a silicon-on-insulator (SOI) substrate, a germanium substrate, a germanium-on-insulator (GOI) substrate, a silicon-germanium substrate, or a substrate including an epitaxial layer obtained by performing a selective epitaxial growth (SEG) process.

The semiconductor substrate 100 may be patterned to form a trench, and an insulating layer may be deposited to fill the trench. The insulating layer may be planarized until a top surface of the semiconductor substrate 100 is exposed, thereby forming the device isolation layer 101. For example, the device isolation layer 101 may include at least one of a silicon oxide layer, a silicon nitride layer, or a silicon oxynitride layer.

According to example embodiments, the active portions ACT may have rectangular shapes (or bar shapes) and may be two-dimensionally arranged along a first direction D1 and a second direction D2. In example embodiments, the active portions ACT may be arranged in a zigzag form when viewed from a plan view. Each of the active portions ACT may have a long axis extending in a direction diagonal to the first and second directions D1 and D2. In more detail, the active portions ACT may be arranged along rows and columns when viewed from a plan view. The rows may be parallel to the first direction D1, and the columns may be parallel to the second direction D2. In some embodiments, the rows may include first, second, and third rows adjacent to each other. End portions of the active portions ACT of the first row adjacent to the second row may be disposed between the active portions ACT of the second row, respectively, when viewed from a plan view. In addition, end portions of the active portions ACT of the third row adjacent to the second row may also be disposed between the active portions ACT of the second row, respectively. The active portions ACT of the first to third rows may be spaced apart from each other. The end portion of the active portion ACT of the first row and the end portion of the active portion ACT of the third row may overlap with each other in the first direction D1 between the active portions ACT, adjacent to each other, of the second row. The active portions ACT may be doped with dopants of a first conductivity type.

The active portions ACT and the device isolation layer 101 may be patterned to form first recess regions 102 (e.g., gate recess regions) extending in the first direction D1. Mask patterns (not shown) extending in the first direction D1 may be formed on the semiconductor substrate 100 having the active portions ACT, and the active portions ACT and the device isolation layer 101 may be anisotropically etched using the mask patterns as etch masks to form the first recess regions 102. In example embodiments, bottom surfaces of the first recess regions 102 may be higher than a bottom surface of the device isolation layer 101.

Next, a gate insulating layer 103 may be formed to conformally cover inner surfaces of the first recess regions 102. A conductive layer may be deposited to fill the first recess regions 102 having the gate insulating layer 103, and a portion of the conductive layer may be etched to form word lines WL in the first recess regions 102, respectively. At this time, top surfaces of the word lines WL may be lower than a top surface of the device isolation layer 101.

Gate hard mask patterns 105 may be formed on the word lines WL in the first regions 102. A hard mask layer may be formed to fill the first recess regions 102 in which the word lines WL are formed. Subsequently, the hard mask layer may be planarized until the top surface of the semiconductor substrate 100 is exposed, thereby forming the gate hard mask patterns 105.

After the formation of the word lines WL, first and second dopant regions 1a and 1b may be formed in the active portions ACT at both sides of each of the word lines WL. The first and second dopant regions 1a and 1b may be formed by performing an ion implantation process and may have a second conductivity type opposite to the first conductivity type of the active portion ACT.

An insulating layer 121 and an etch stop layer 123 may be sequentially deposited on an entire top surface of the semiconductor substrate 100. In example embodiments, the etch stop layer 123 may be formed of an insulating material having an etch selectivity with respect to the insulating layer 121. For example, the insulating layer 121 may be formed of silicon oxide, silicon nitride, or silicon oxynitride. The etch stop layer 123 may be formed of silicon oxide, silicon nitride, or silicon oxynitride. Here, the etch stop layer 123 is formed of a different material from the insulating layer 121. In example embodiments, the insulating layer 121 and the etch stop layer 123 may be formed using a chemical vapor deposition (CVD) method.

Figure 10A:
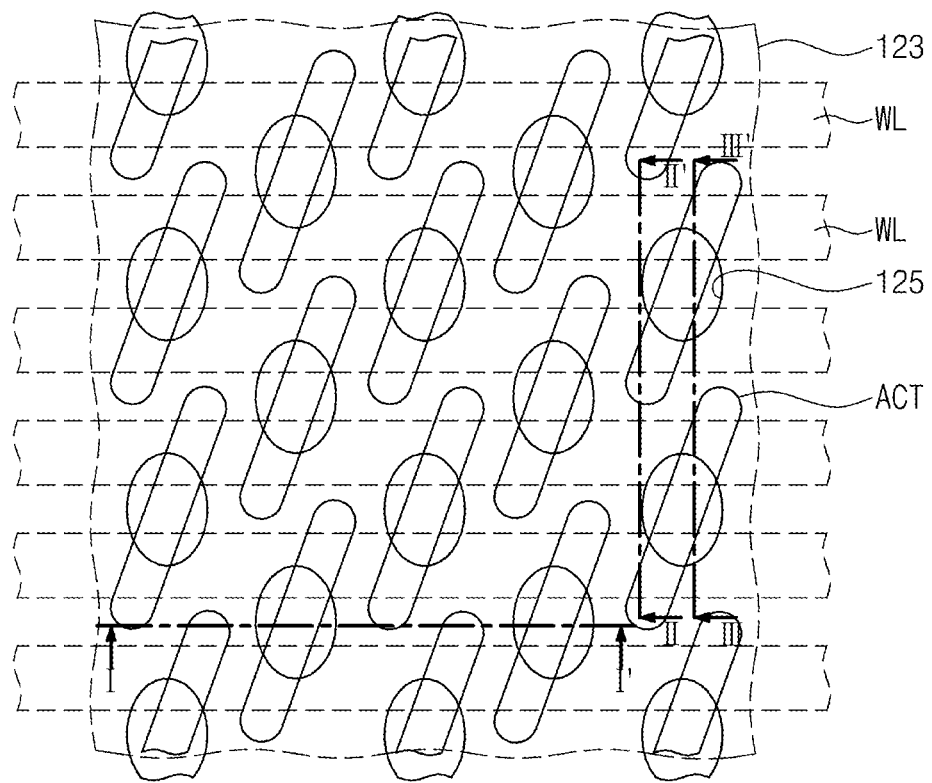
Figure 10A:
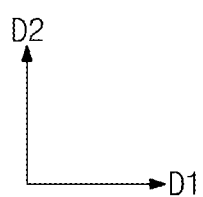
Figure 10B:
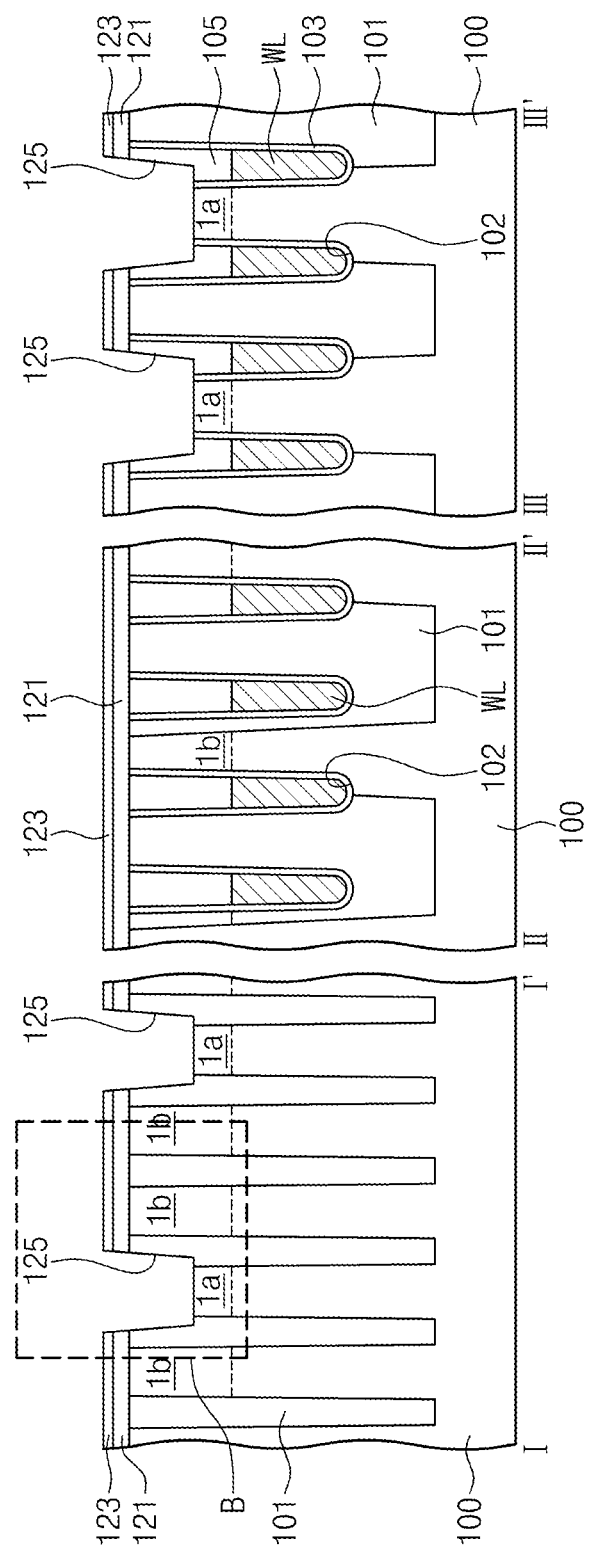
Figure 10C:
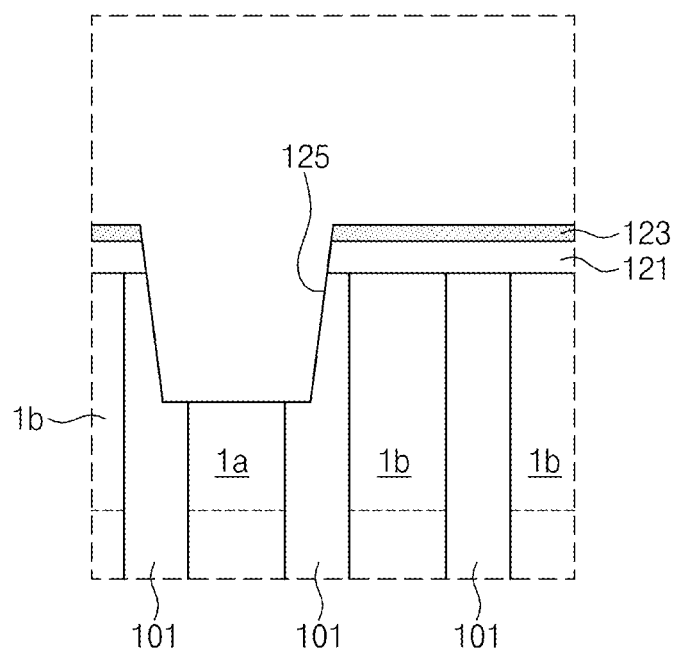

Referring to FIGS. 10A, 10B, and 10C, the etch stop layer 123, the insulating layer 121, and the semiconductor substrate 100 may be patterned to form second recess regions 125 exposing the first dopant regions 1a, respectively. In example embodiments, a mask pattern having openings overlapping with the first dopant regions 1a may be formed on the etch stop layer 123, and the etch stop layer 123, the insulating layer 121 and the semiconductor substrate 100 may be anisotropically etched using the mask pattern as an etch mask to form the second recess regions 125. Here, widths of the openings of the mask pattern may be greater than a width of the active portion ACT and a distance between the word lines WL. Thus, the device isolation layer 101 and the gate hard mask pattern 105 which are adjacent to the first dopant regions 1a may also be etched during the anisotropic etching process for the formation of the second recess regions 125. Bottom surfaces of the second recess regions 125 may be higher than bottom surfaces of the first dopant regions 1a. Portions of the device isolation layer 101 and the gate hard mask pattern 105 may be exposed by the second recess region 125. In some embodiments, the second recess regions 125 may be arranged in a zigzag form or a honeycomb form when viewed from a plan view.

Figure 11A:
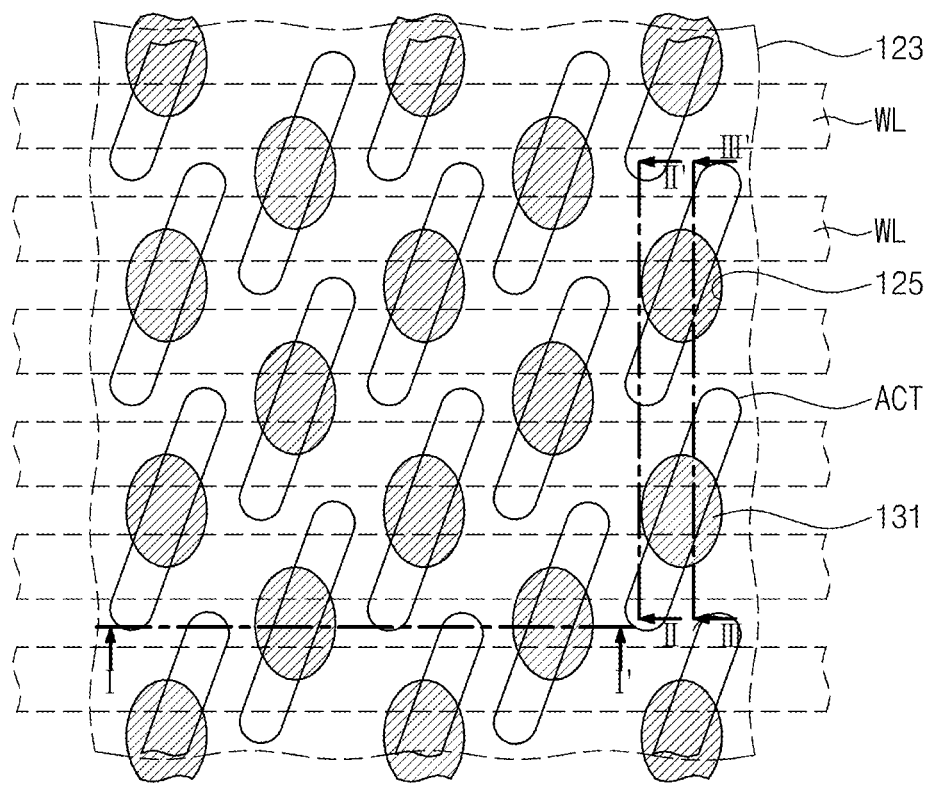
Figure 11B:
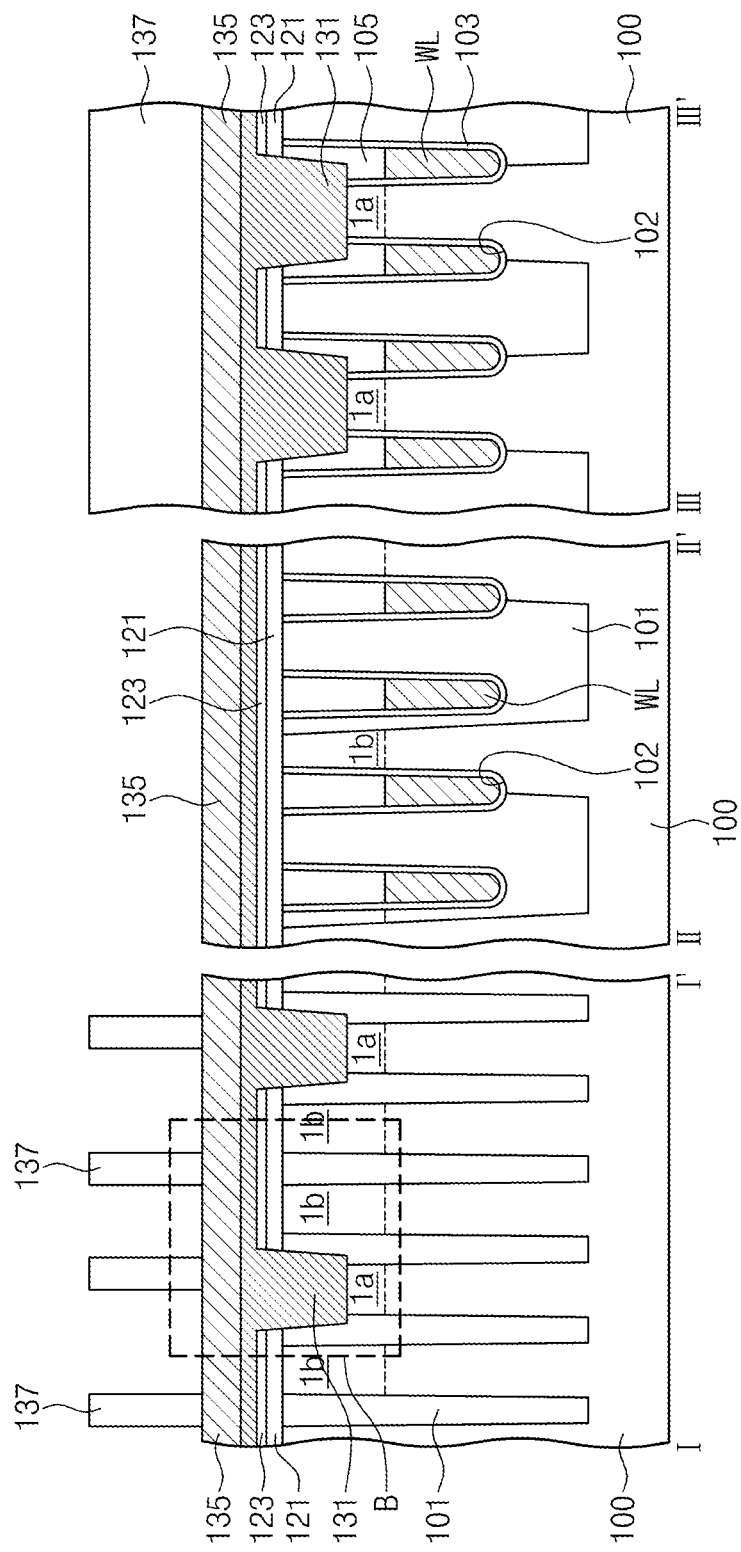
Figure 11C:
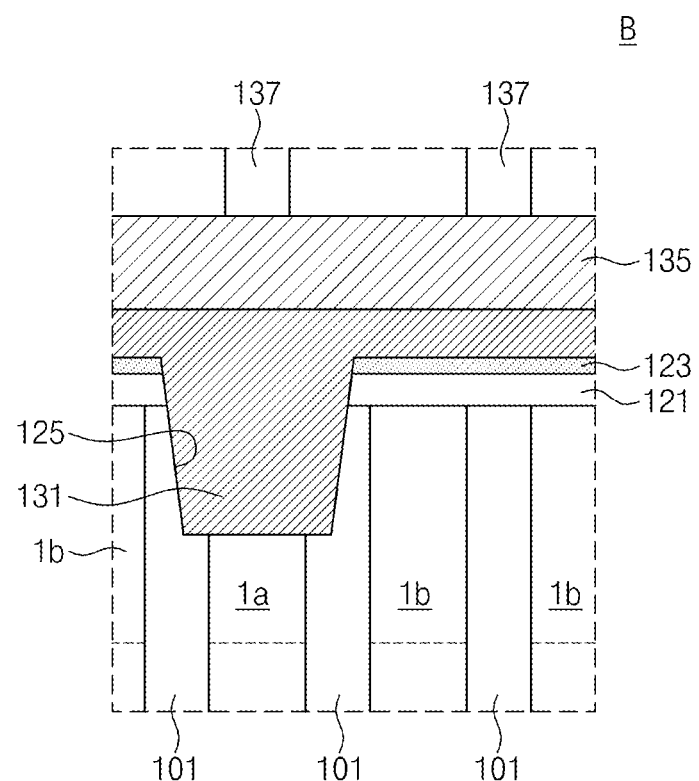

Referring to FIGS. 11A, 11B, and 11C, conductive pads 131 may be formed in the second recess regions 125. In example embodiments, a conductive layer may be formed on the etch stop layer 123 to fill the second recess regions 125, and then a planarization process may be performed on the conductive layer until the etch stop layer 123 is exposed. Thus, the conductive pads 131 may be formed. In this case, the conductive pads 131 may be spaced apart from each other and may fill the second recess regions 125, respectively. Alternatively, the conductive layer having a planarized top surface may remain on the etch stop layer 123 as illustrated in FIG. 11B, so the conductive pads 131 may be connected to each other through the remaining conductive layer.

The conductive pads 131 may be in contact with the first dopant regions 1a, and sidewalls of the conductive pads 131 may be in contact with the device isolation layer 101 and the gate hard mask patterns 105. The conductive pads 131 may include at least one of a doped semiconductor material (e.g., doped silicon), a metal (e.g., tungsten, titanium, and/or tantalum), a conductive metal nitride (e.g., titanium nitride, tantalum nitride, or tungsten nitride), or a metal-semiconductor compound (e.g., a metal silicide).

Next, a bit line conductive layer 135 may be formed on a top surface of the conductive layer (or the etch stop layer 123), and bit line mask patterns 137 may be formed on the bit line conductive layer 135. The bit line mask patterns 137 may cross over the word lines WL and may extend in the second direction D2 perpendicular to the first direction D1.

Figure 12A:
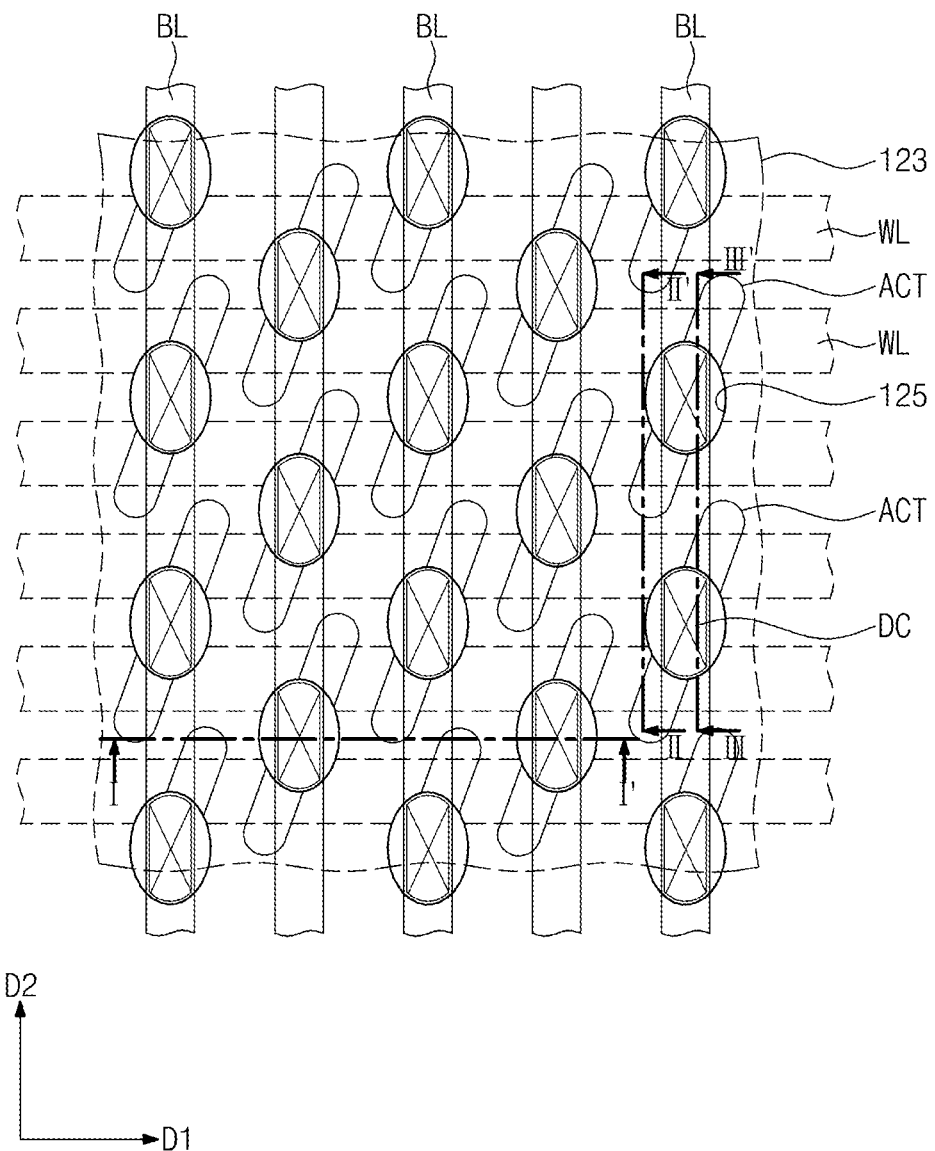
Figure 12B:
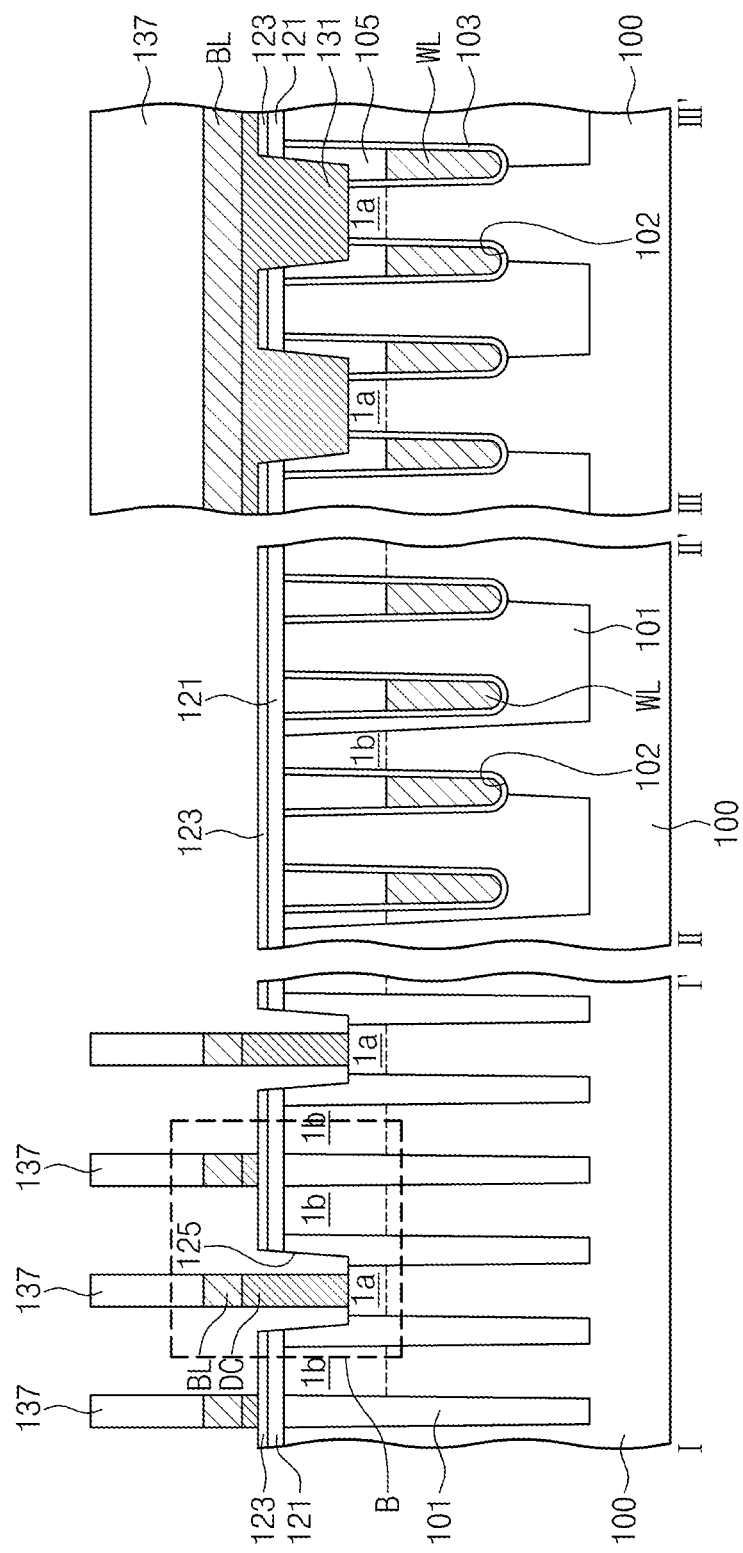
Figure 12C:
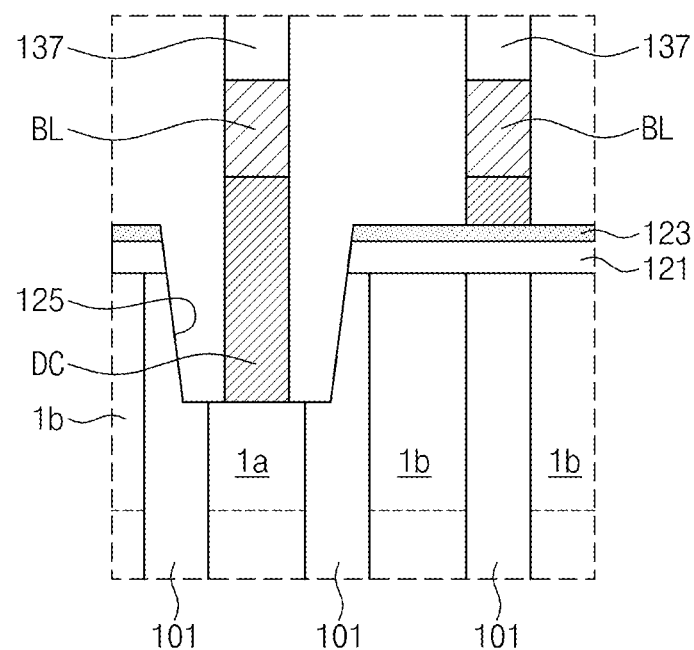

Referring to FIGS. 12A, 12B, and 12C, bit lines BL may be formed to extend in the second direction D2, and bit line contact patterns DC may be formed to electrically connect the bit lines BL to the first dopant regions 1a.

The bit line conductive layer 135 and the conductive pads 131 may be anisotropically etched using the bit line mask patterns 137 as etch masks to form the bit lines BL and the bit line contact patterns DC. The bit line contact patterns DC may be locally formed in the second recess regions 125, respectively. At this time, sidewalls of the bit line contact patterns DC may be spaced apart from inner sidewalls of the second recess regions 125. Since the bit lines BL and the bit line contact patterns DC are formed at the same time, widths of the bit line contact patterns DC may be substantially equal to widths of the bit lines BL.

Figure 13A:
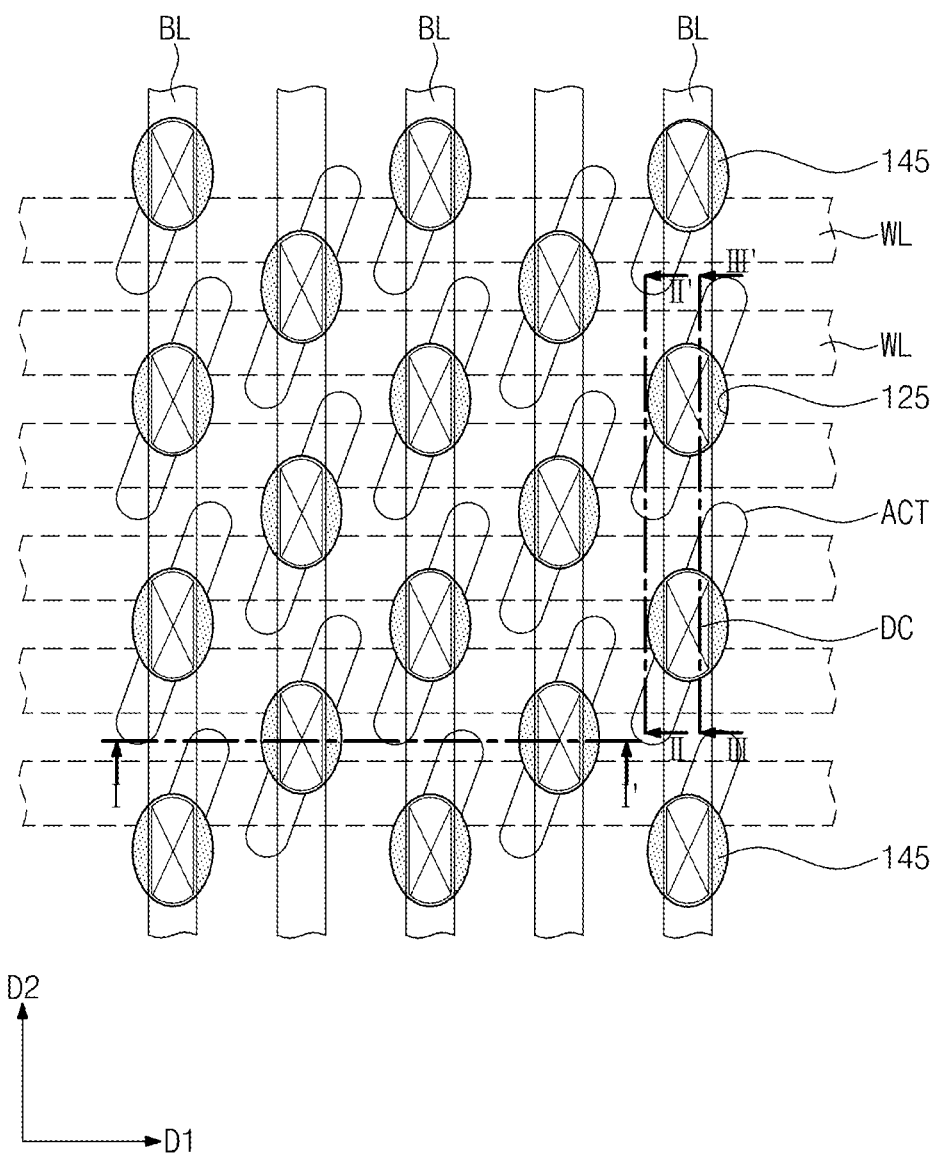
Figure 13B:
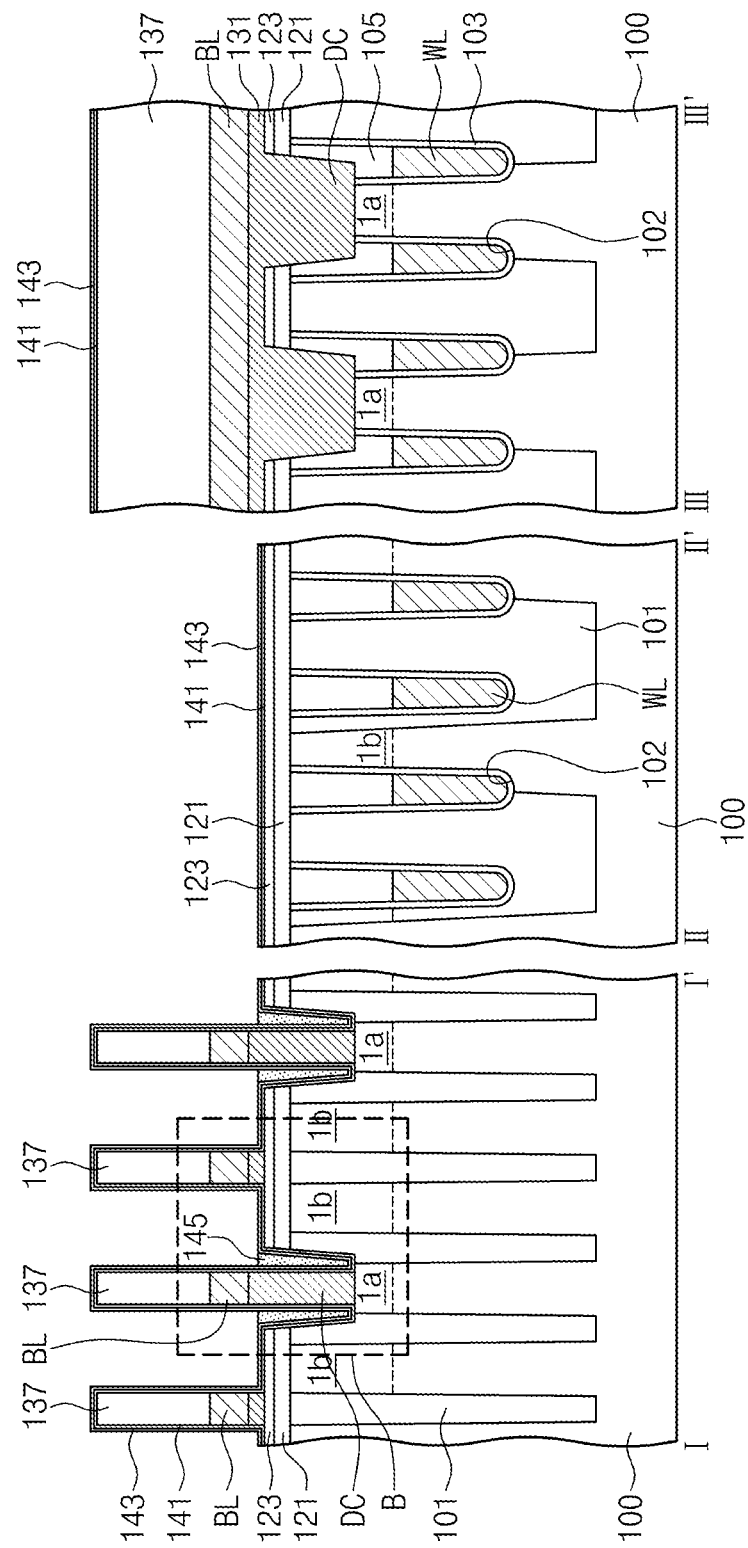
Figure 13C:
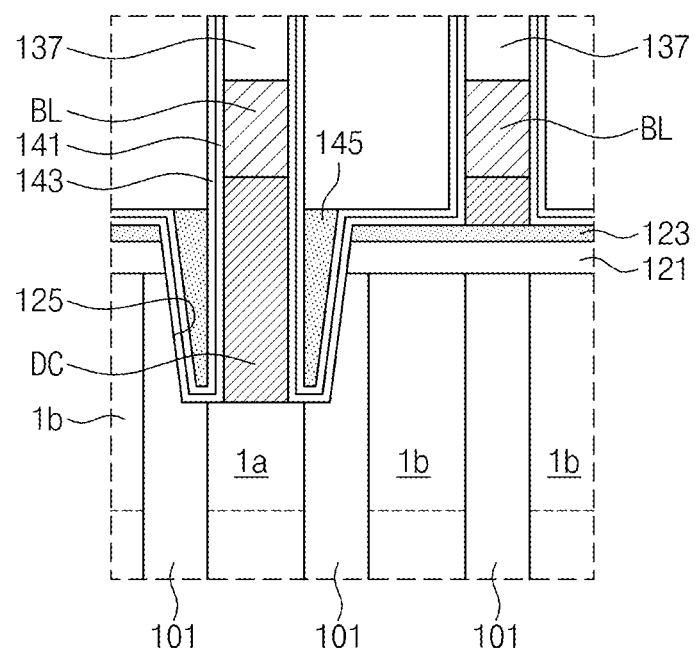

Referring to FIGS. 13A, 13B, and 13C, bit line contact spacers 145 may be formed to cover the sidewalls of the bit line contact patterns DC.

In detail, a first spacer layer 141 and a second spacer layer 143 may be formed to conformally cover sidewalls of the bit lines BL, the sidewalls of bit line contact patterns DC, and the inner sidewalls of the second recess region 125. Next, a third spacer layer may be formed on the second spacer layer 143 to fill the second recess regions 125. Here, the second spacer layer 143 may be formed of an insulating material having an etch selectivity with respect to the first spacer layer 141, and the third spacer layer may be formed of an insulating material having an etch selectivity with respect to the second spacer layer 143. For example, the first spacer layer 141 may be formed of silicon nitride or silicon oxynitride, the second spacer layer 143 may be formed of silicon oxide, and the third spacer layer may be formed of silicon nitride or silicon oxynitride.

Subsequently, an isotropic etching process may be performed on the third spacer layer to form the bit line contact spacers 145 confined in the second recess regions 125. At this time, the second spacer layer 143 may be used as an etch stop layer. Thus, the second spacer layer 143 on the sidewalls of the bit lines BL may be exposed.

Figure 14A:
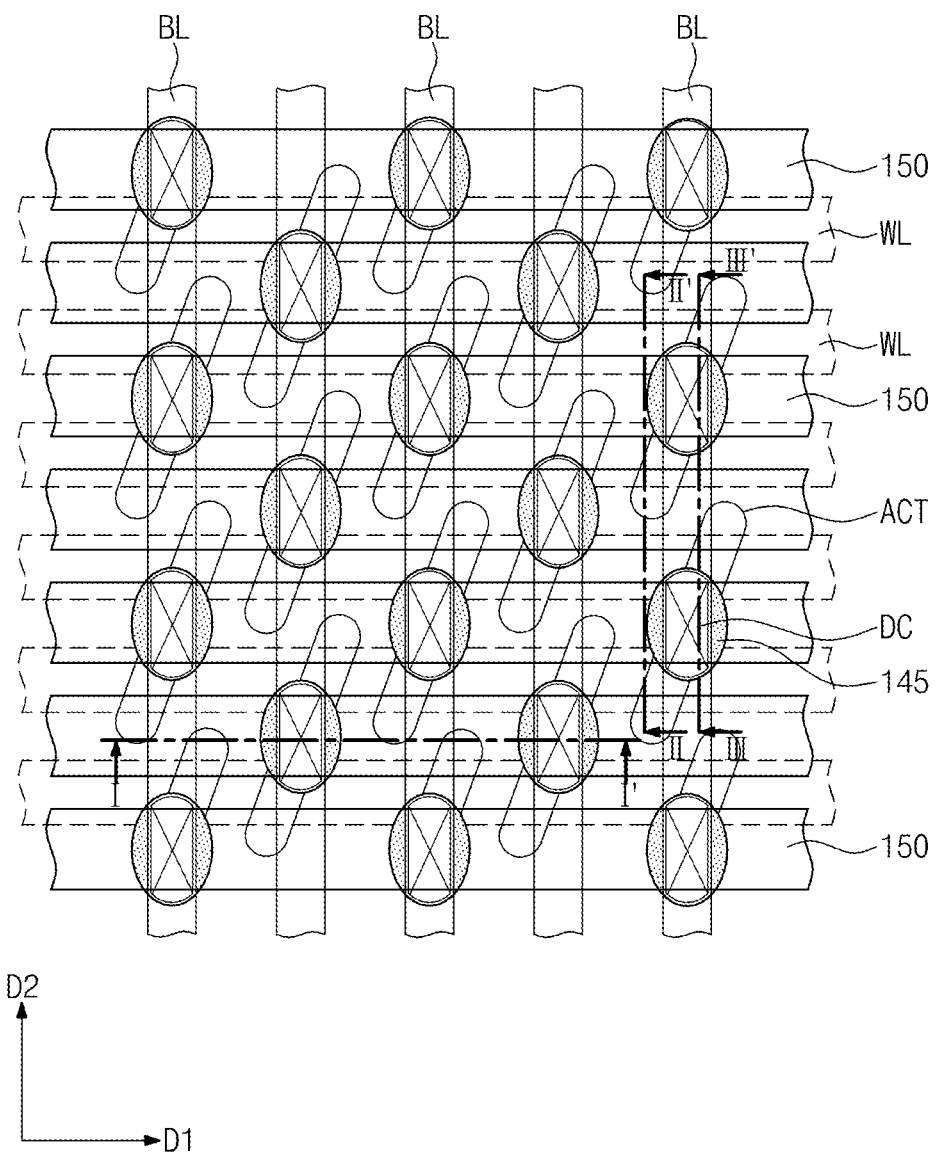
Figure 14B:
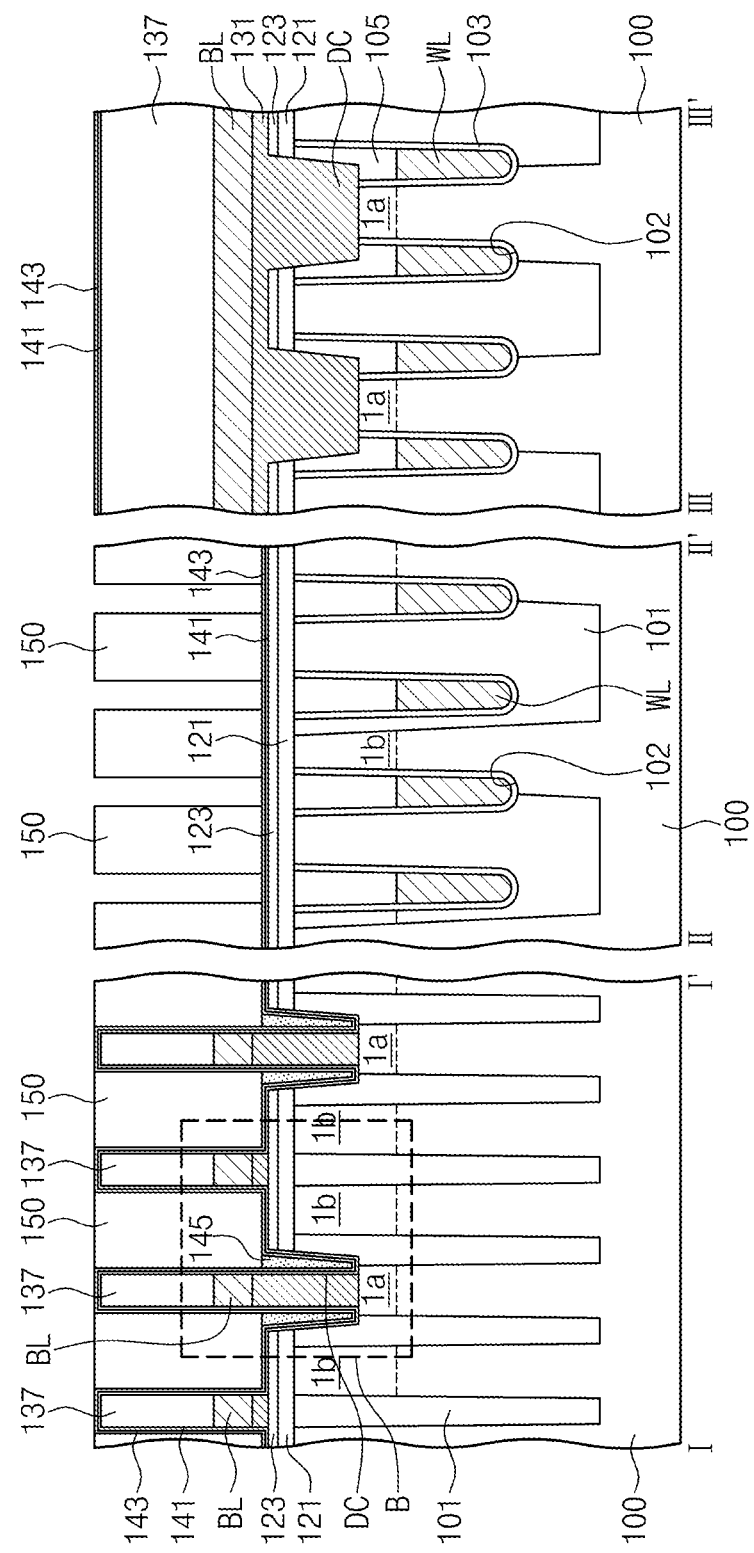
Figure 14C:
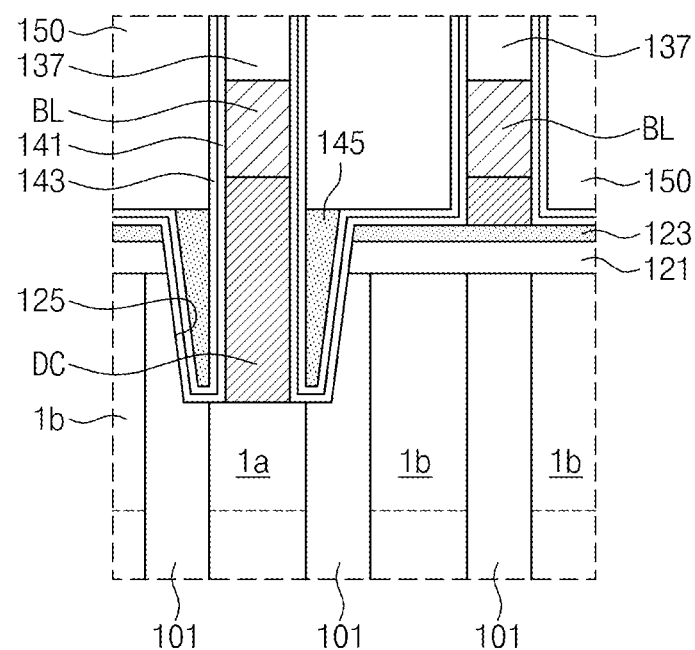

Referring to FIGS. 14A, 14B, and 14C, sacrificial patterns 150 may be formed to intersect the bit lines BL. The sacrificial patterns 150 may vertically overlap with the second dopant regions 1b. The sacrificial patterns 150 may be spaced apart from each other in the second direction D2 and may be disposed between the word lines WL, respectively, when viewed from a plan view. In other words, the sacrificial patterns 150 and the word lines WL may be alternately arranged in the second direction D2 when viewed from a plan view. The sacrificial patterns 150 may be formed of an oxide (e.g., silicon oxide), a nitride (e.g., silicon nitride), and/or an oxynitride (e.g., silicon oxynitride).

Figure 15A:
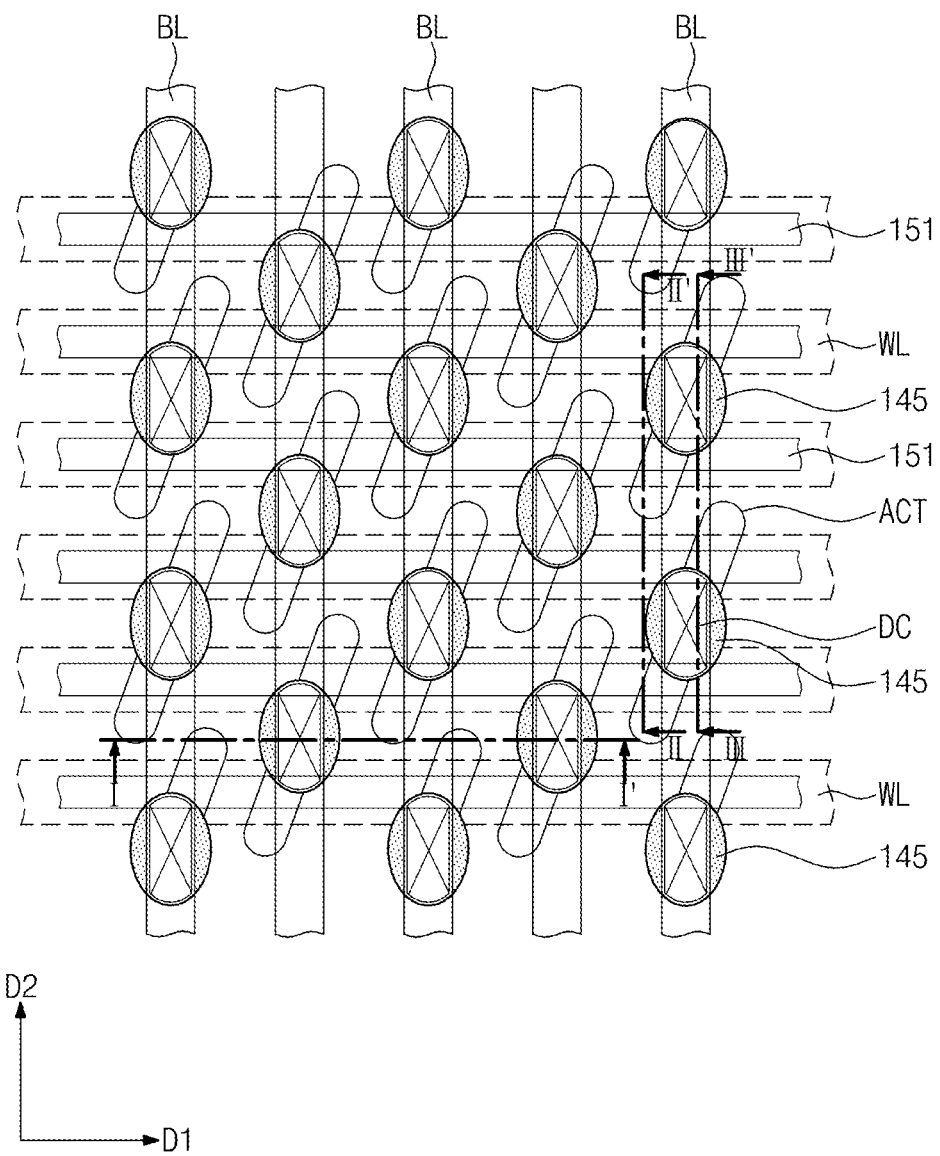
Figure 15B:
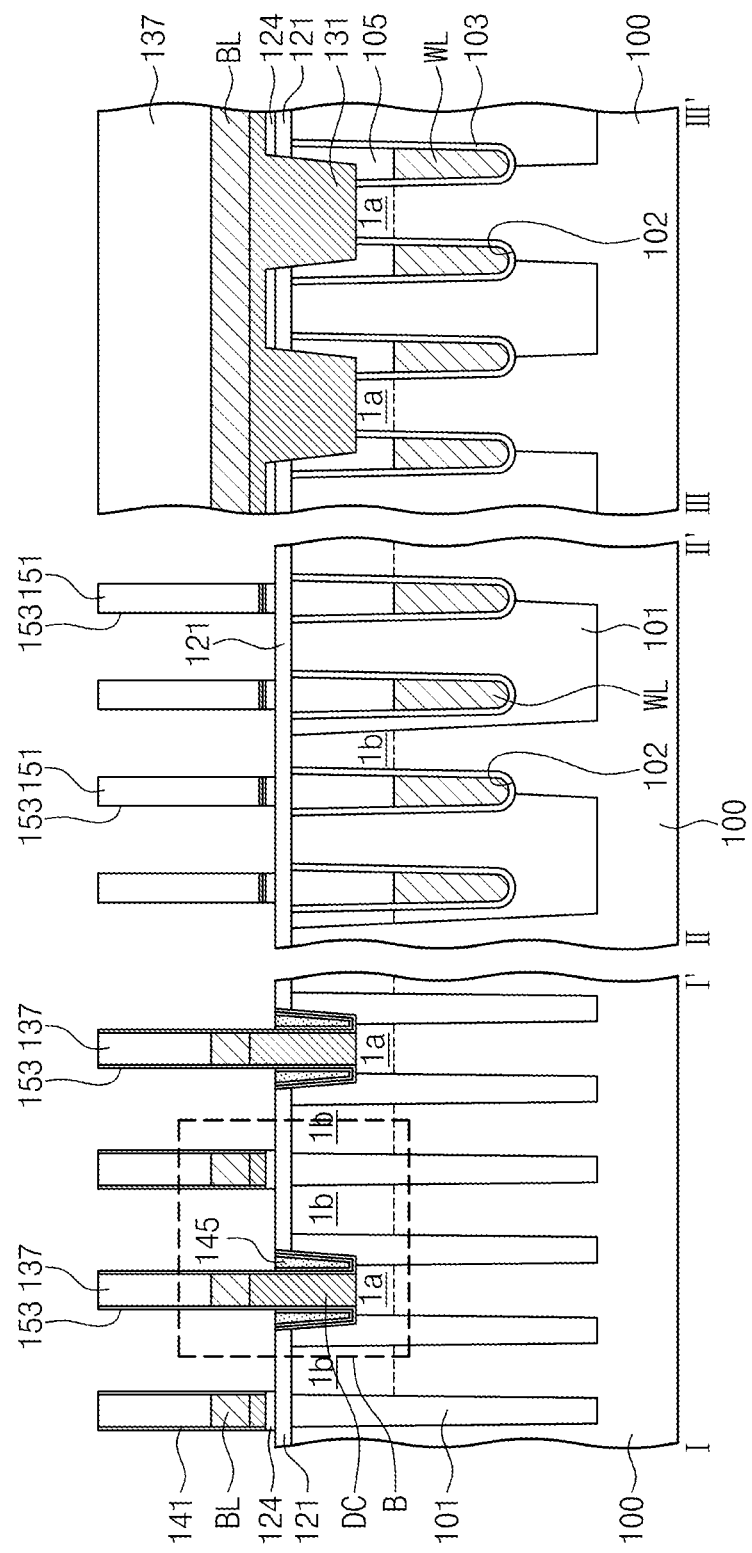
Figure 15C:
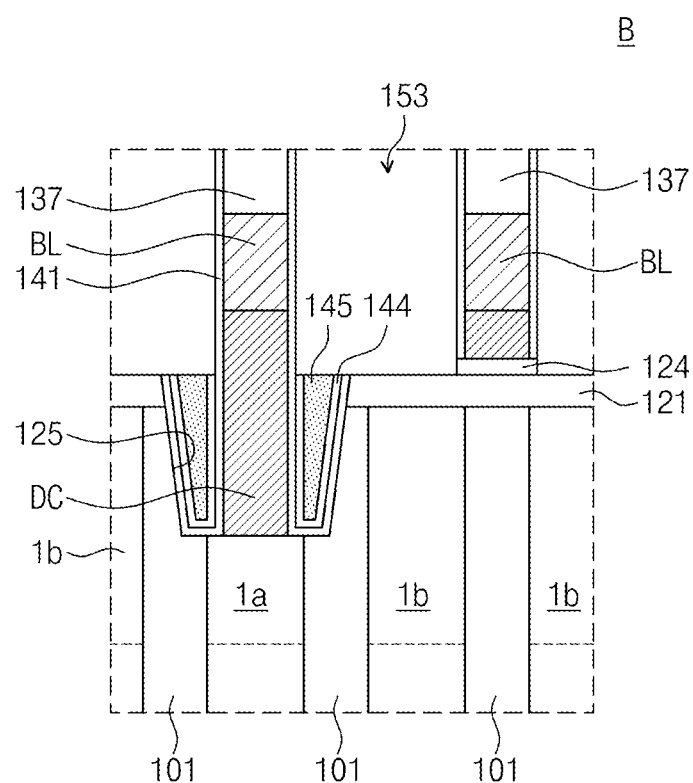

Referring to FIGS. 15A, 15B, and 15C, mold patterns 151 may be formed to fill spaces between the sacrificial patterns 150. The mold patterns 151 may be parallel to the sacrificial patterns 150 and may intersect the bit lines BL. The mold patterns 151 may be disposed over the word lines WL, respectively. The mold patterns 151 may be formed of an insulating material having an etch selectivity with respect to the sacrificial patterns 150. For example, the sacrificial patterns 150 may be formed of silicon oxide, and the mold patterns 151 may be formed of silicon nitride.

After the formation of the mold patterns 151, the sacrificial patterns 150 may be removed, so portions of the etch stop layer 123 may be exposed between the mold patterns 151 and between bit lines BL. The second spacer layer 143 disposed on the sidewalls of the bit lines BL and the etch stop layer 123 may be removed during the removal of the mold patterns 151 so that a second spacer 144 may be locally formed in the second recess region 125.

Since the mold patterns are formed, contact holes 153 may be defined by the mold patterns 151 and the bit lines BL. The contact holes 153 may be disposed over the second dopant regions 1b.

In other embodiments, an interlayer insulating layer may be formed on an entire top surface of the semiconductor substrate 100 having the bit lines BL, and the interlayer insulating layer may be patterned to form the contact holes 153 corresponding to the second dopant regions 1b, respectively.

The etch stop layer 123 exposed by the contact holes 153 may be anisotropically etched to locally expose portions of the insulating layer 121 which cover the second dopant regions 1b, respectively. Thus, an etch stop pattern 124 may be formed under the bit lines BL, and top surfaces of the bit line contact spacers 135 may be recessed.

Figure 16A:
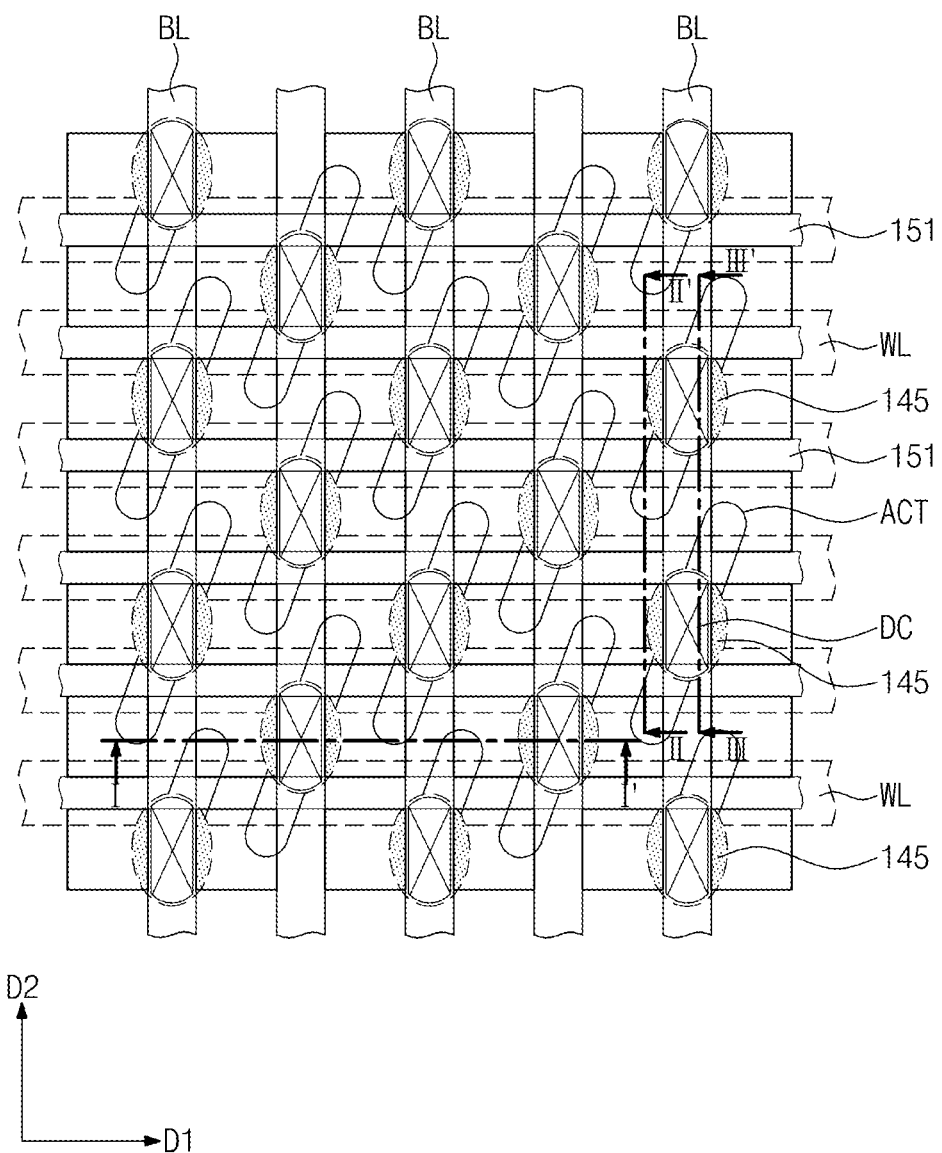
Figure 16B:
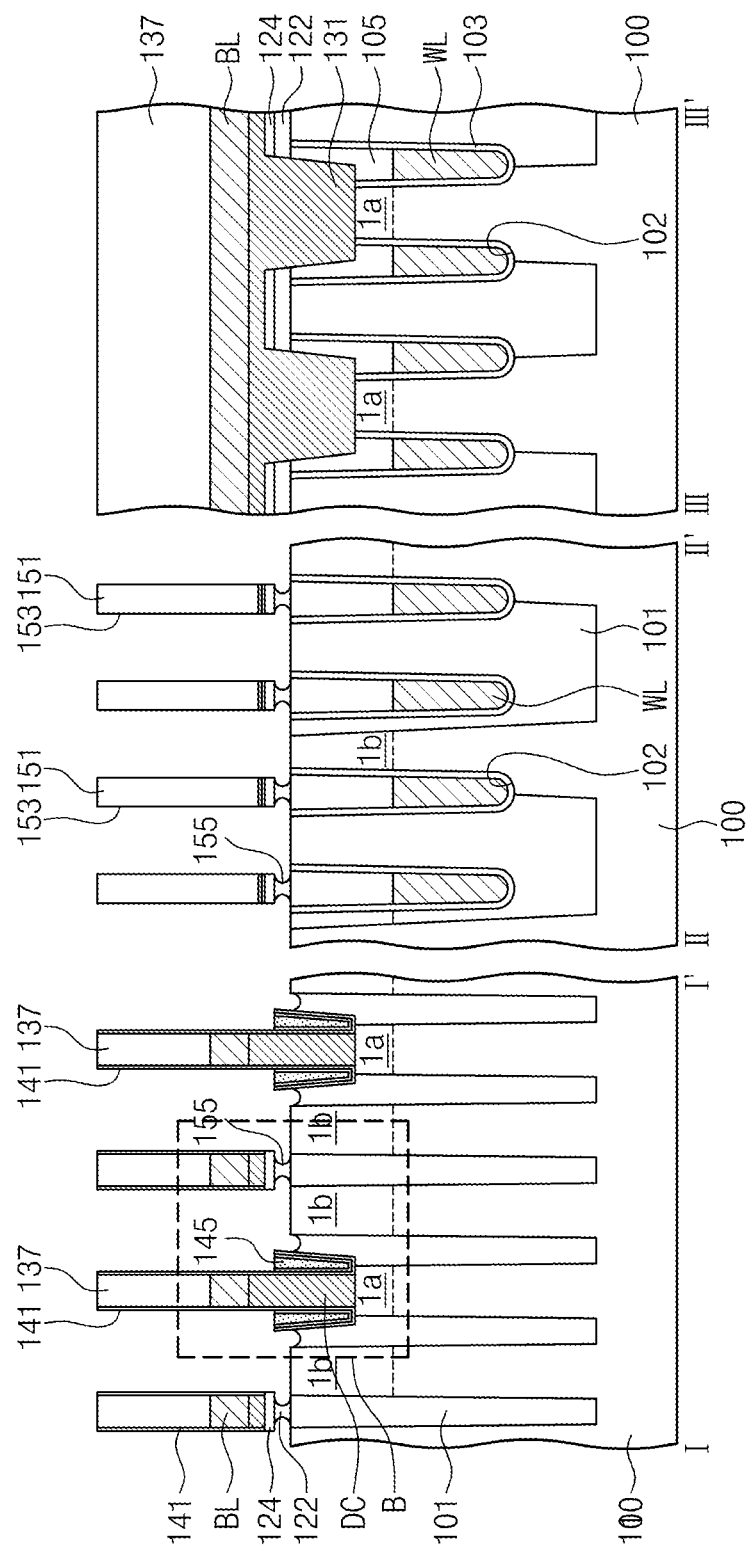
Figure 16C:
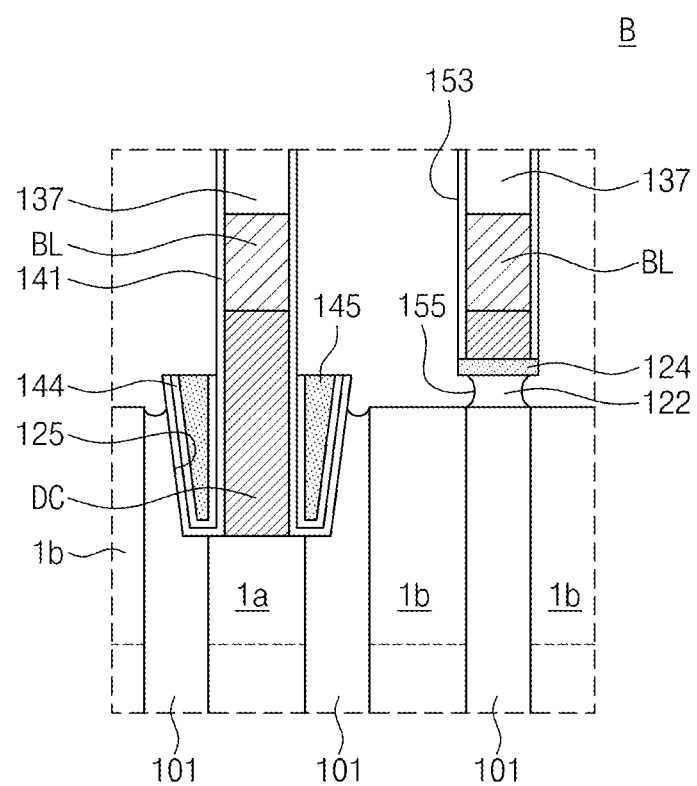

Referring to FIGS. 16A, 16B, and 16C, the portions of the insulating layer 121 exposed by the contact holes 153 may be removed to form lower contact holes 155 exposing the second dopant regions 1b, respectively.

According to example embodiments, the lower contact holes 155 may be formed by anisotropically etching the insulating layer 121 exposed by the contact holes 153. Portions of the device isolation layer 101 which are adjacent to the second dopant regions 1b may also be removed during the formation of the lower contact holes 155. Since the lower contact plugs 155 are formed, an insulating pattern 122 may be formed between the semiconductor substrate 100 and the bit line BL. In example embodiments, the insulating pattern 122 may have a rounded sidewall, and a width of the insulating pattern 122 under the bit line BL may be smaller than the width of the bit line BL.

The lower contact hole 155 may expose a portion of the sidewall of the bit line contact spacer 145 or the first spacer layer 141 covering the portion of the sidewall of the bit line contact spacer 145. During the formation of the lower contact holes 155, the bit line contact spacers 145 may limit (and/or prevent) the bit line contact patterns DC from being exposed and the etch stop pattern 124 may limit (and/or prevent) bottom surfaces of the bit lines BL from being exposed. Since the lower contact holes 155 are formed as described above, exposed areas of the second dopant regions 1b may be increased.

Figure 17A:
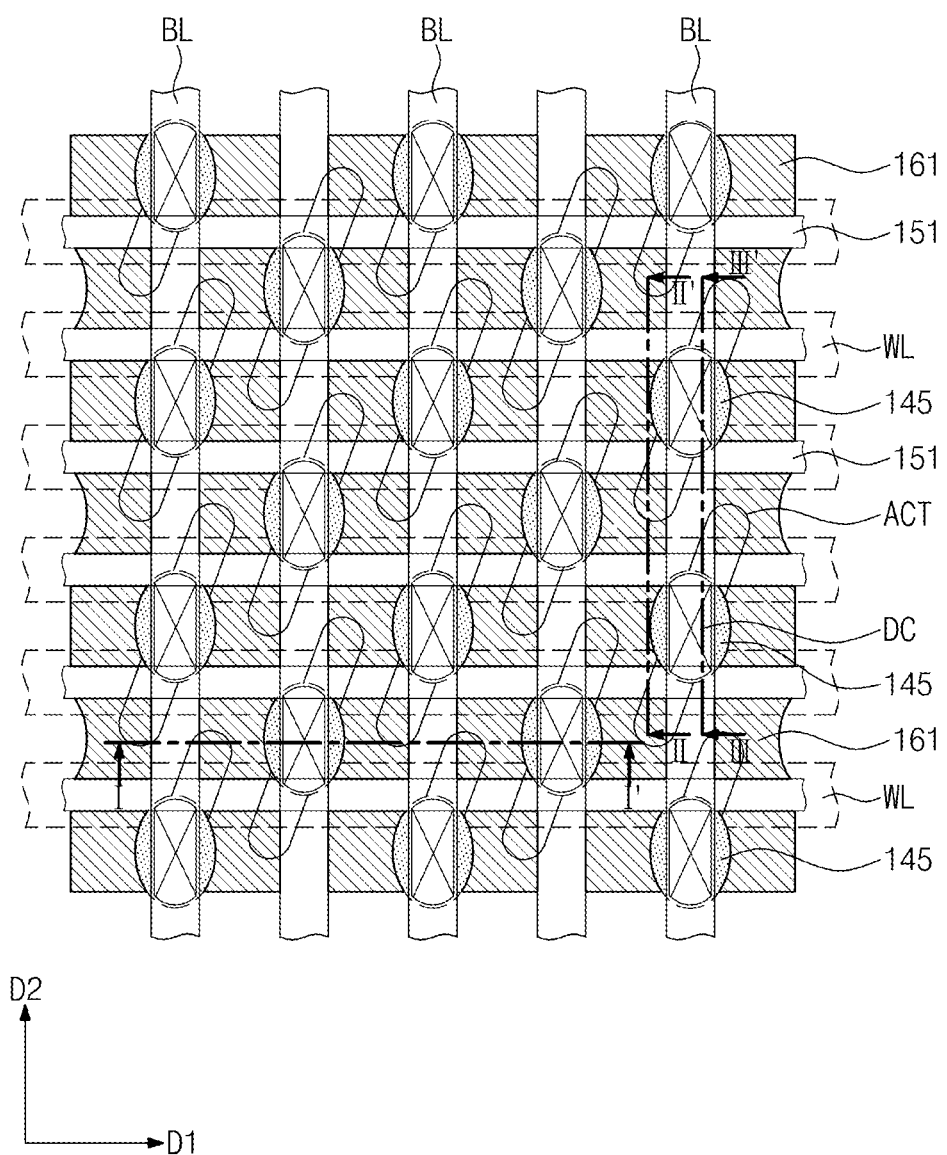
Figure 17B:
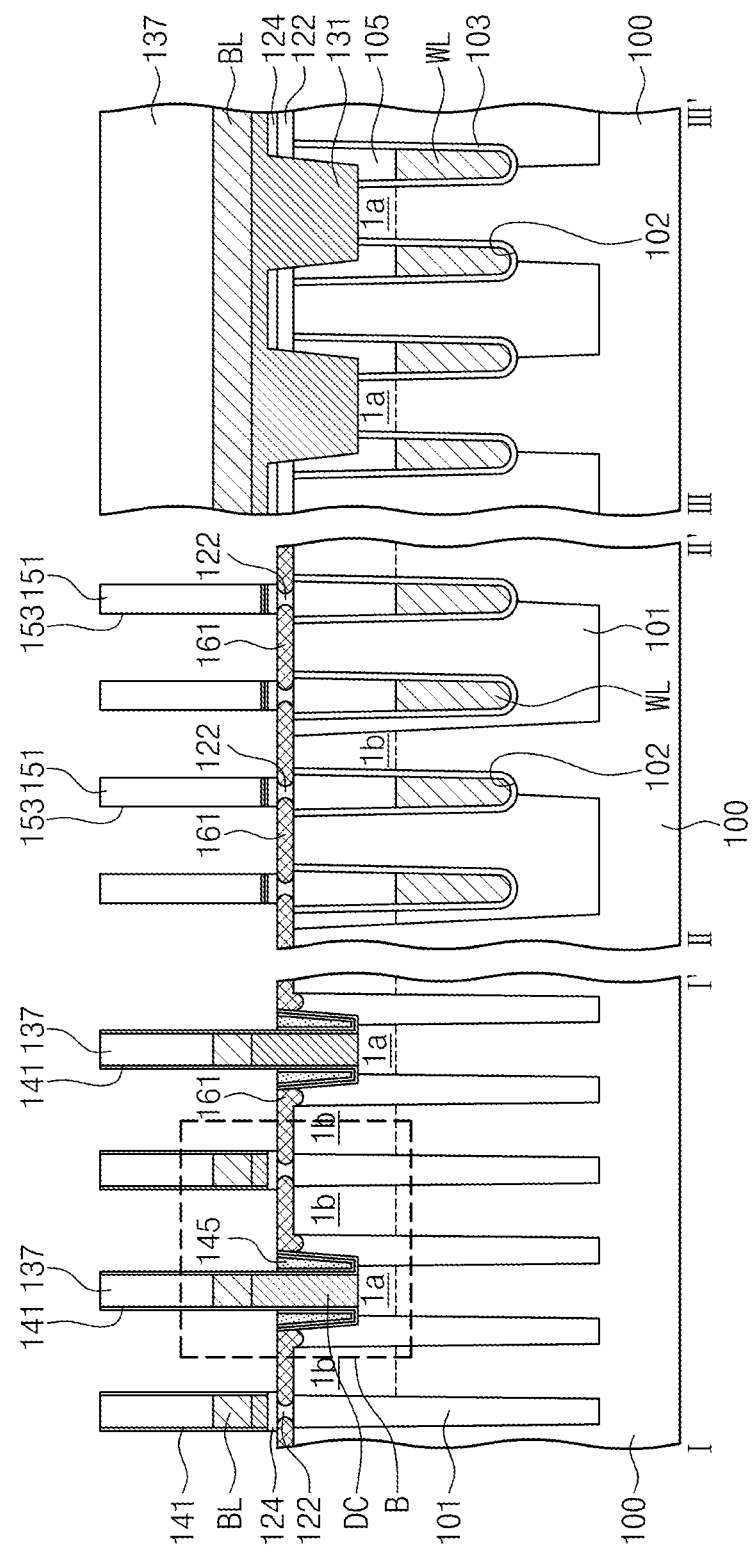
Figure 17C:
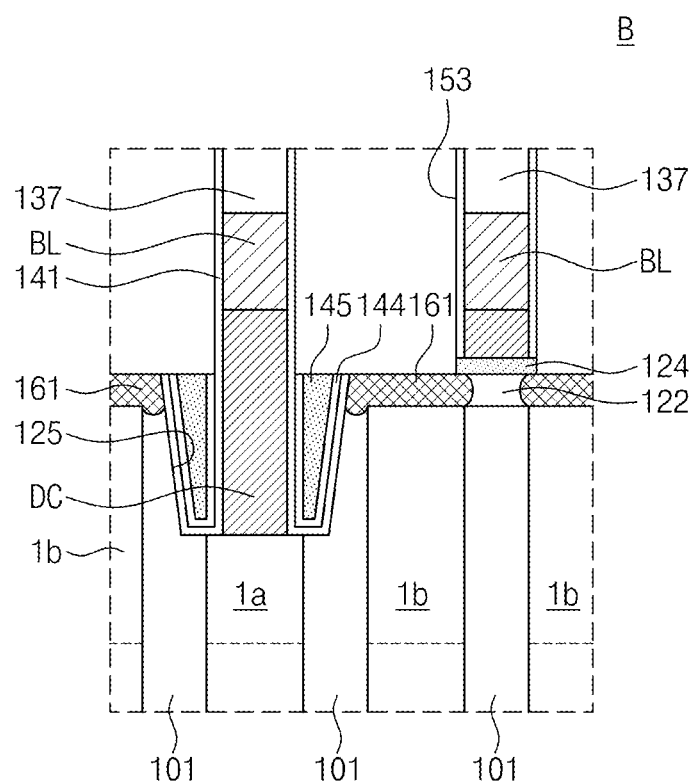

Referring to FIGS. 17A, 17B, and 17C, contact pads 161 may be formed to fill the lower contact holes 155, respectively.

Each of the contact pads 161 may cover the top surface of the second dopant region 1b and a portion of the device isolation layer 101. Each of the contact pads 161 may be adjacent to the bit line contact spacer 145. A pair of contact pads 161 may be disposed with the bit line BL interposed therebetween and may be symmetrical with respect to the bit line BL. The contact pads 161 may have rounded sidewalls by the bit line contact spacers 145 when viewed from a plan view.

A conductive layer may be formed to fill the lower contact holes 155 and the contact holes 153, and then the conductive layer may be anisotropically etched unit the top surfaces of the bit line contact spacers 145 are exposed, thereby forming the contact pads 161. The contact pads 161 may include at least one of, but not limited to, a semiconductor material doped with dopants (e.g., doped silicon), a metal (e.g., tungsten, aluminum, titanium, and/or tantalum), a conductive metal nitride (e.g., titanium nitride, tantalum nitride, and/or tungsten nitride), or a metal-semiconductor compound (e.g., a metal silicide).

Figure 18A:
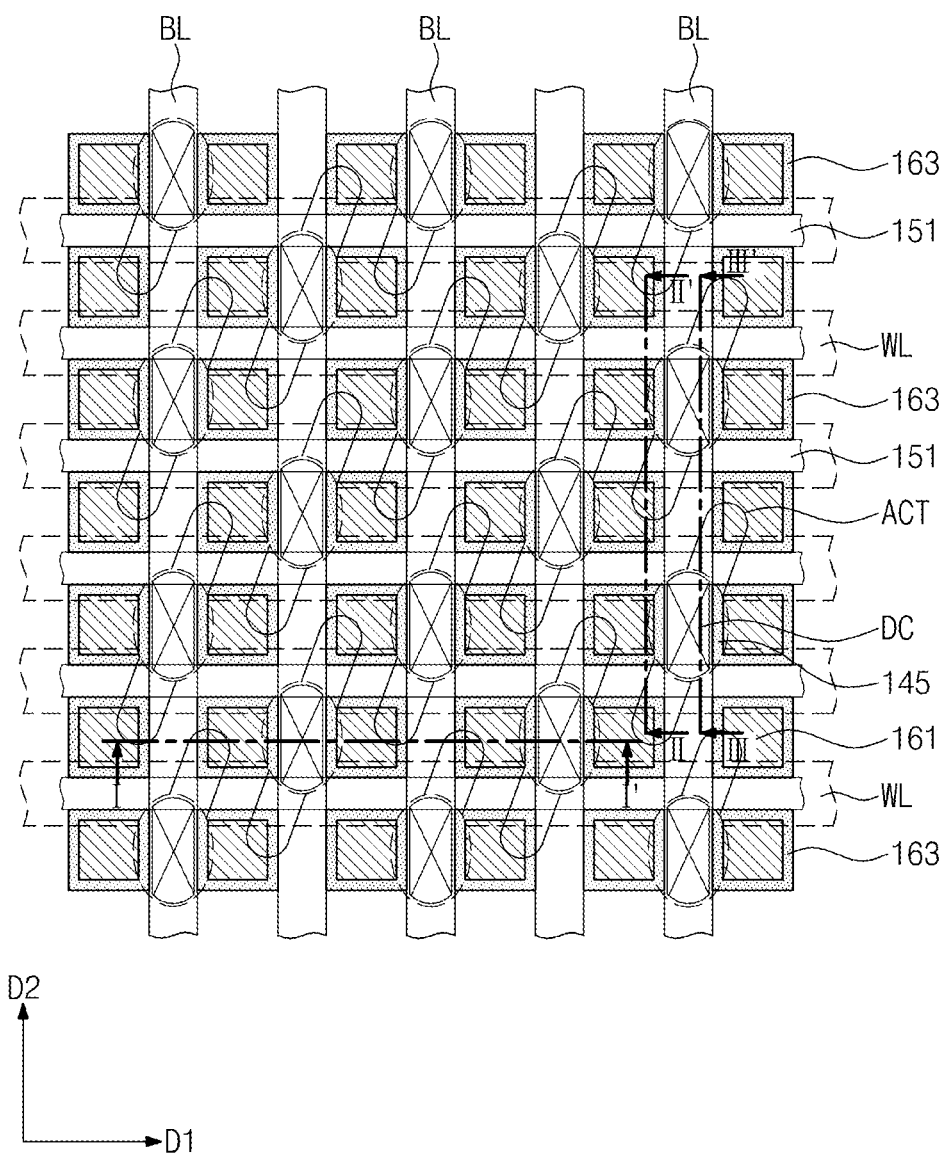
Figure 18B:
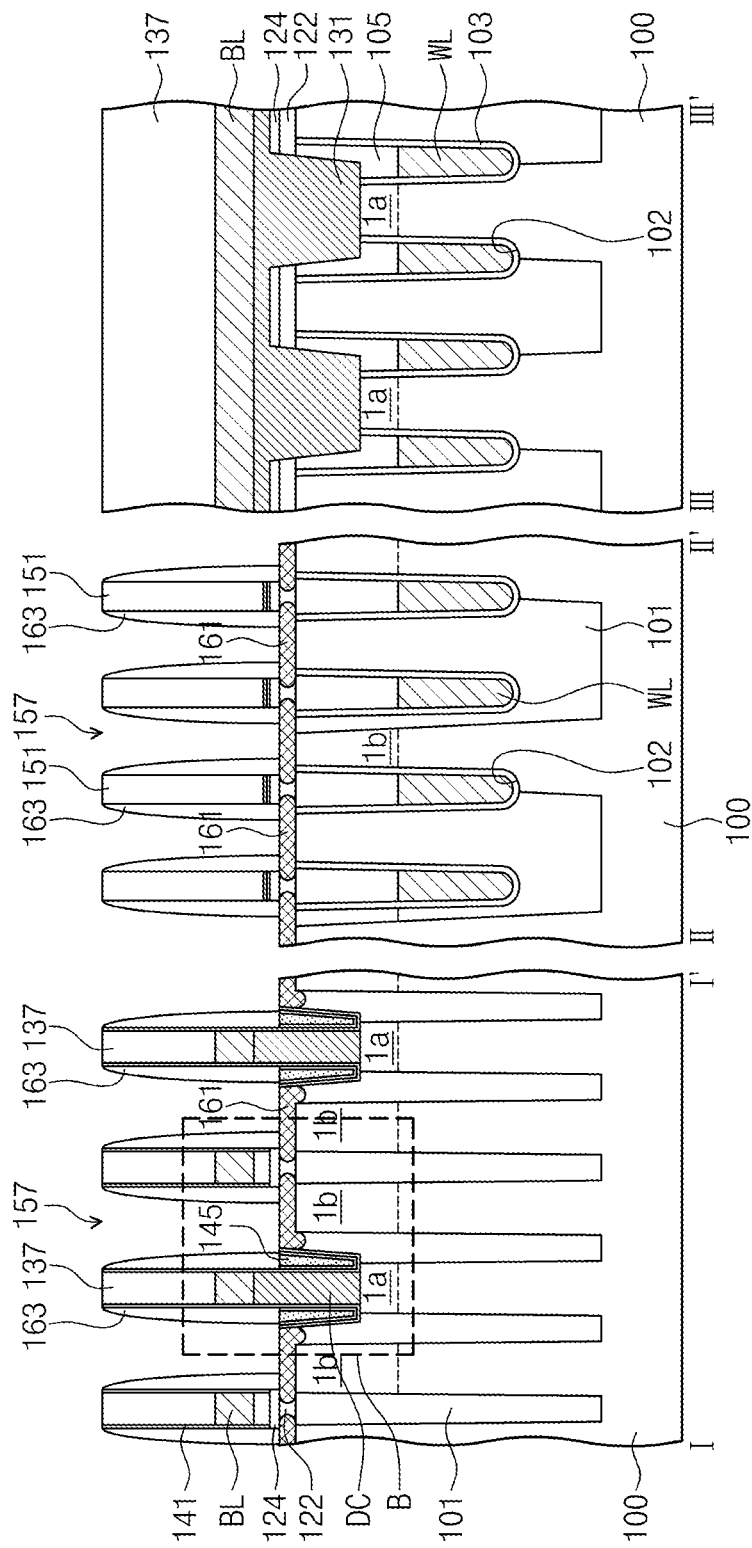
Figure 18C:
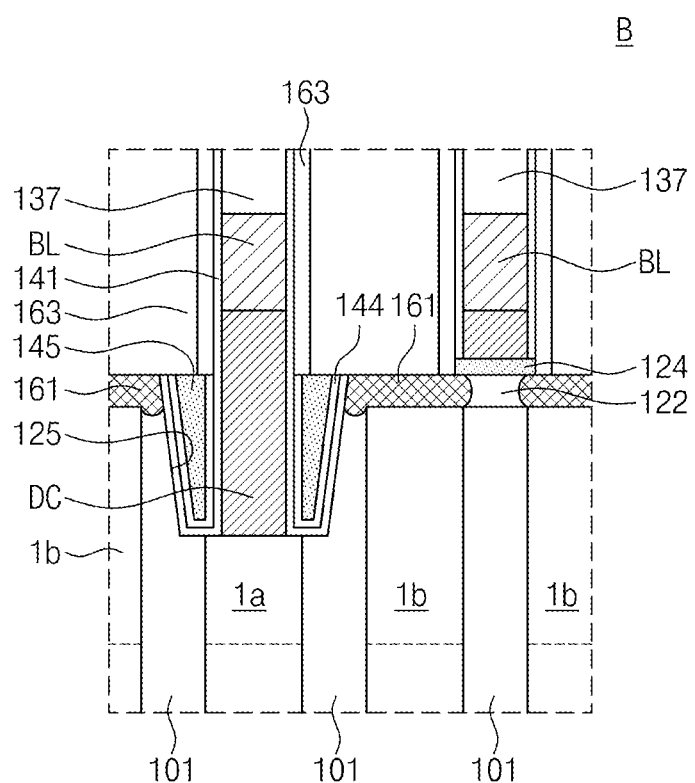

Referring to FIGS. 18A, 18B, and 18C, a bit line spacer 163 may be formed to cover an inner sidewall of each of the contact holes 153 on the contact pad 161. The bit line spacer 163 may define an upper contact hole 157 that exposes a portion of the contact pad 161. The upper contact hole 157 may also expose a portion of the bit line contact spacer 145. The bit line spacer 163 may cover portions of the sidewalls of the bit lines BL and the mold patterns 151 which are exposed by the contact 153.

An insulating layer may be formed to cover the inner sidewalls of the contact holes after the formation of the contact pads 161, and a blanket anisotropic etching process may be performed on the insulating layer to form the bit line spacers 163.

Figure 19A:
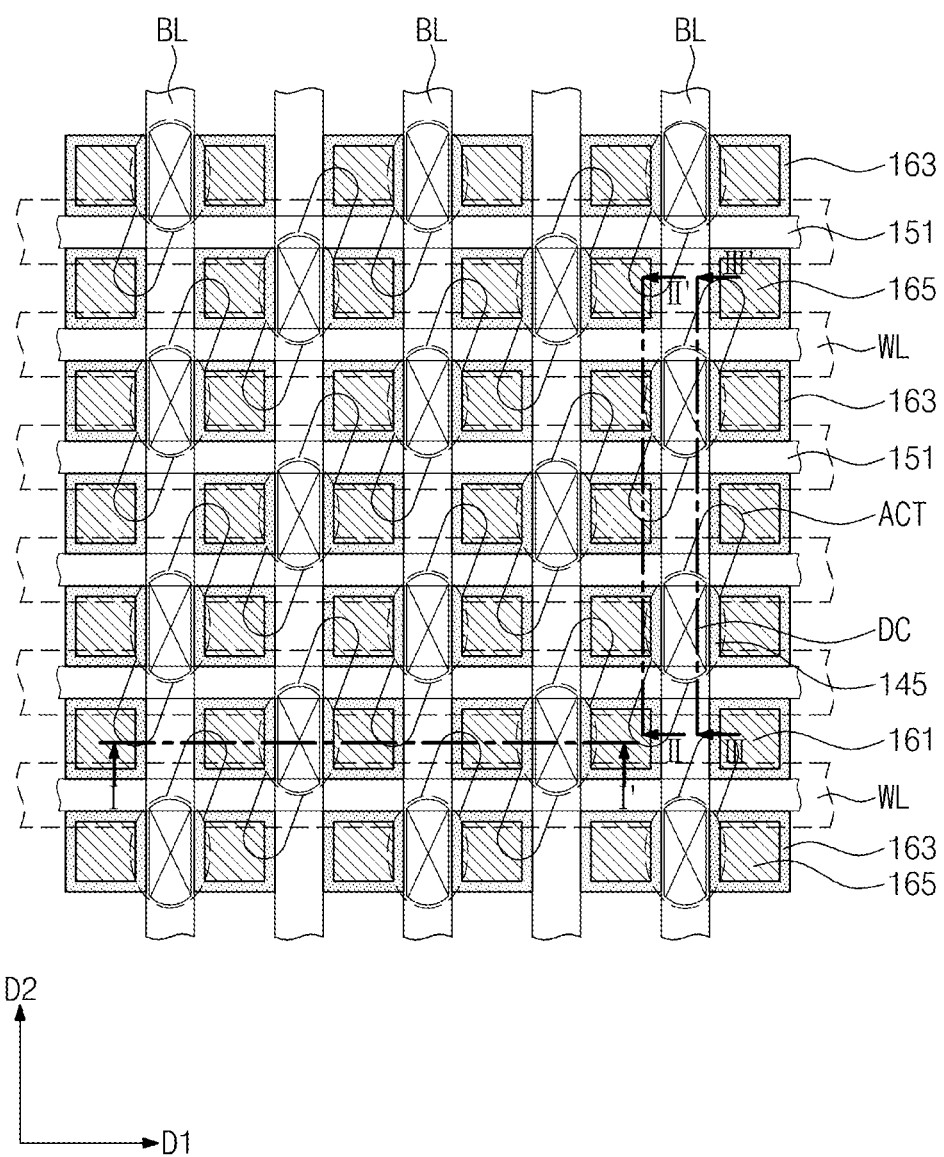
Figure 19B:
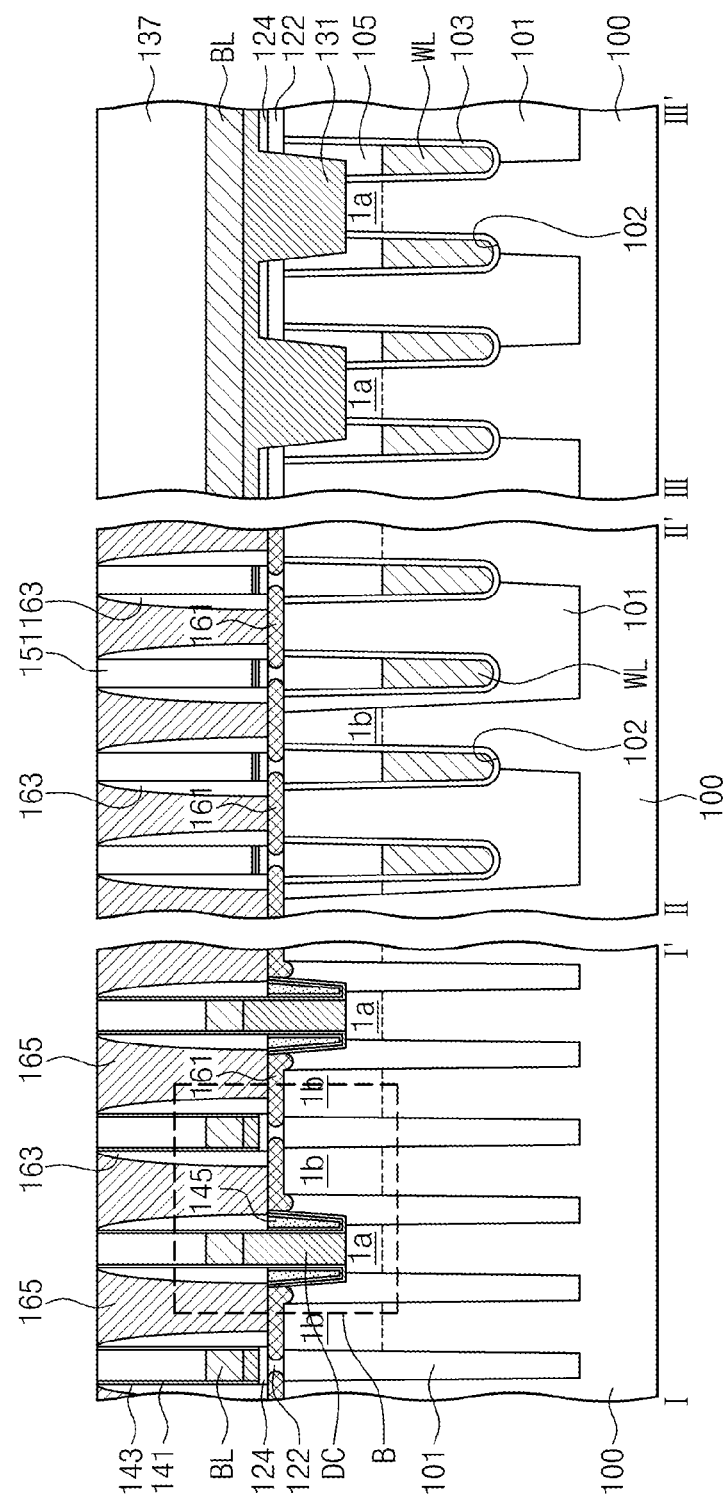
Figure 19C:
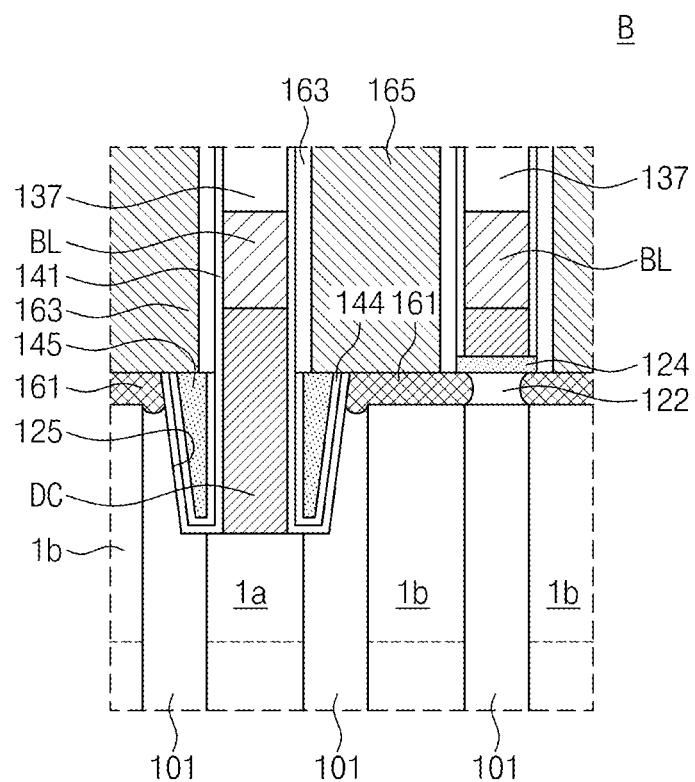

Referring to FIGS. 19A, 19B, and 19C, a contact plug 165 may be formed in each of the upper contact holes 157 so as to be connected to the contact pad 161. A conductive layer may be deposited to fill the upper contact holes 157, and then a planarization process may be performed on the deposited conductive layer until the bit line mask patterns 137 are exposed, thereby forming the contact plugs 165. The contact plug 165 may be in direct contact with the contact pad 161, and a width of a lower portion of the contact plug 165 may be smaller than a width of the contact pad 161.

According to example embodiments, even though the width upper contact hole 157 is reduced by the bit line spacer 163, the contact pad 161 may be formed in advance to limit (and/or prevent) a contact area between the contact plug 165 and the second dopant region 1b from being reduced.

For example, the contact plugs 165 may include at least one of a semiconductor material doped with dopants (e.g., doped silicon), a metal (e.g., tungsten, aluminum, titanium, and/or tantalum), a conductive metal nitride (e.g., titanium nitride, tantalum nitride, and/or tungsten nitride), or a metal-semiconductor compound (e.g., a metal silicide).

Next, a data storage pattern DS may be formed on each of the contact plugs 165, as illustrated in FIGS. 1 and 2. The data storage patterns DS may be electrically connected to the second dopant regions 1b through the contact plugs 165 and the contact pads 161.

In example embodiments, the data storage pattern DS may be an electrode of a capacitor. Alternatively, the data storage pattern DS may include a magnetic tunnel junction using magnetization directions, a transition metal oxide using an electrical path, or a phase-change material.

FIGS. 20A to 27A are plan views illustrating a method for manufacturing a semiconductor device according to example embodiments of inventive concepts. FIGS. 20B to 27B are cross-sectional views taken along lines I-I' and II-II' of FIGS. 20A to 27A, respectively, to illustrate a method for manufacturing a semiconductor device according to example embodiments of inventive concepts.

Figure 20A:
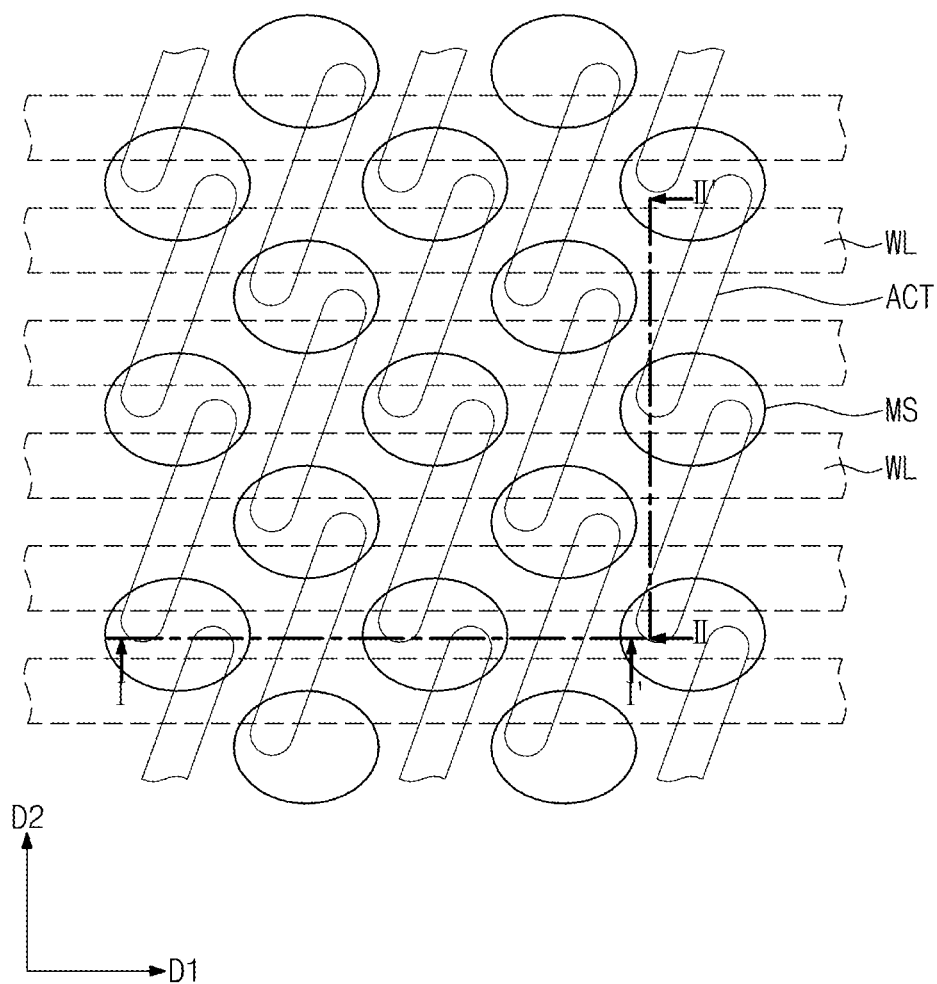
Figure 20B:
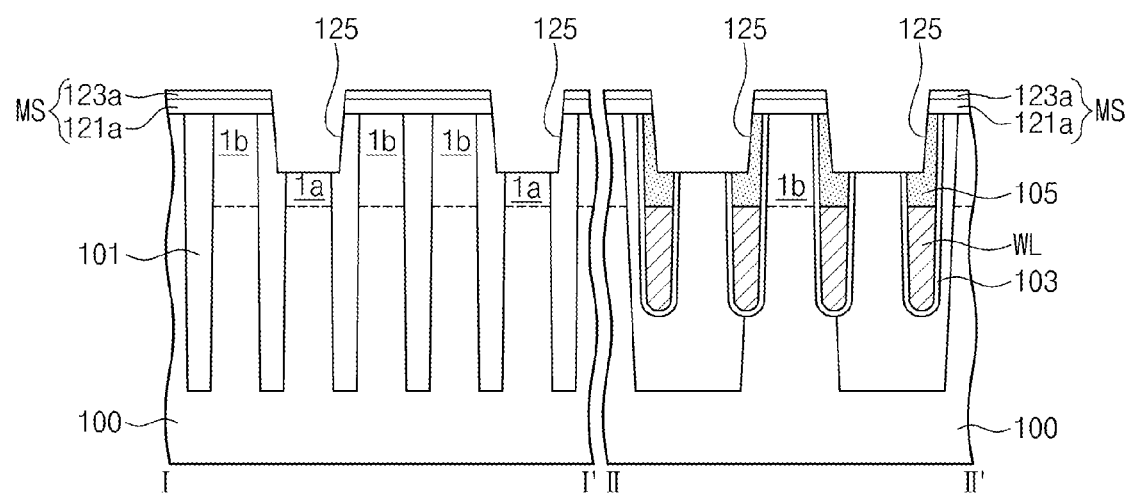

Referring to FIGS. 20A and 20B, a device isolation layer 101 may be formed in a semiconductor substrate 100 to define active portions ACT. The active portions ACT may be two-dimensionally arranged as described with reference to FIGS. 9A, 9B, and 9C.

Word lines WL may be formed in the semiconductor substrate 100 to intersect the active portions ACT, and a gate insulating layer 103 may be formed between the semiconductor substrate 100 and each of the word lines WL. Gate hard mask patterns 105 may be formed on the word lines WL. First and second dopant regions 1a and 1b may be formed in the active portions AP at both sides of each of the word lines WL.

Mask structures MS covering the second dopant regions 1b may be formed on the semiconductor substrate 100 having the word lines WL. The mask structures MS may have island shapes and may be spaced apart from each other. Each of the mask structures MS may cover end portions of the active portions ACT adjacent to each other. In other words, each of the mask structures MS may cover the second dopant regions 1b adjacent to each other in the first direction D1, and the first dopant regions 1a may be exposed between the mask structures MS when viewed from a plan view.

The insulating layer 121 and the etch stop layer 123 may be sequentially formed on the entire top surface of the semiconductor substrate 100 as described with reference to FIGS. 9A, 9B, and 9C, and a patterning process may be performed on the etch stop layer 123 and the insulating layer 121 to form the mask structures MS. Thus, each of the mask structures MS may include an insulating pad 121a and an etch stop pad 123a which are sequentially stacked.

Next, the device isolation layer 101 and the active portions ACT may be anisotropically etched using the mask structures MS as etch masks to form a recess region 125. A bottom surface of the recess region 125 may be higher than the bottom surfaces of the first dopant regions 1a. The device isolation layer 101 and the gate hard mask patterns 105 may be partially exposed by the recess region 125.

Figure 21A:
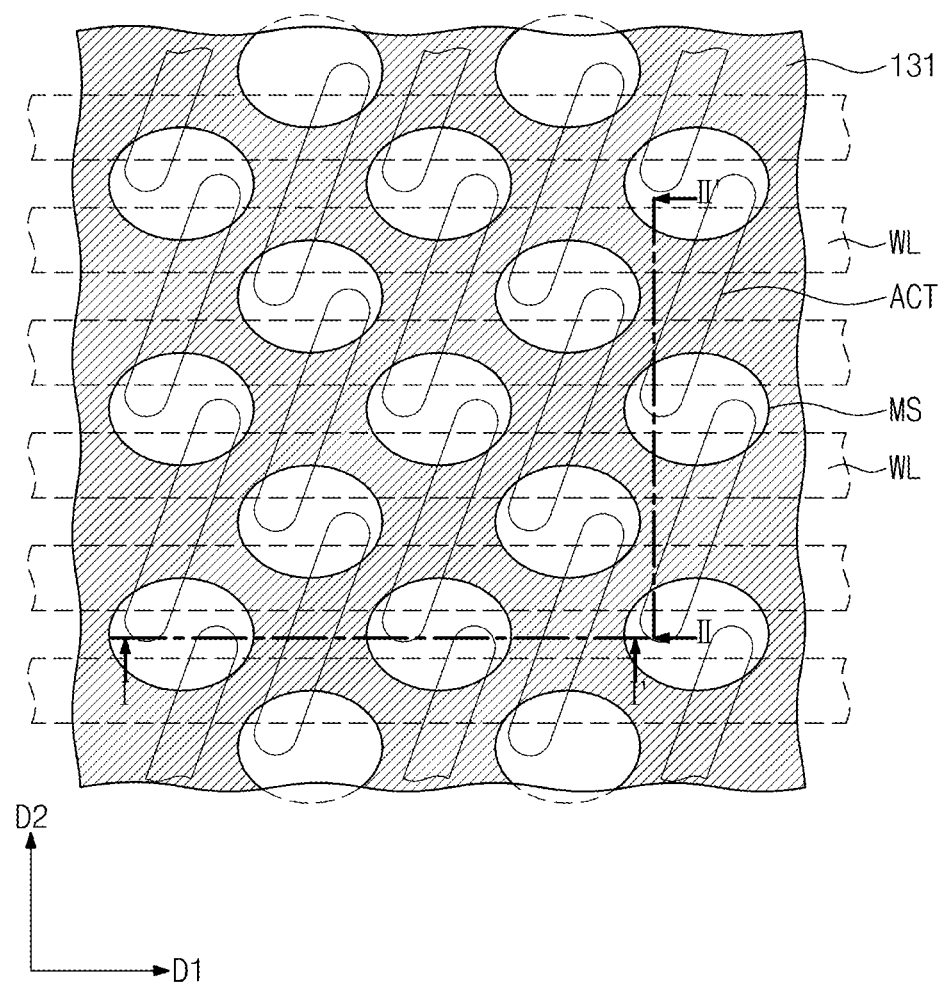
Figure 21B:
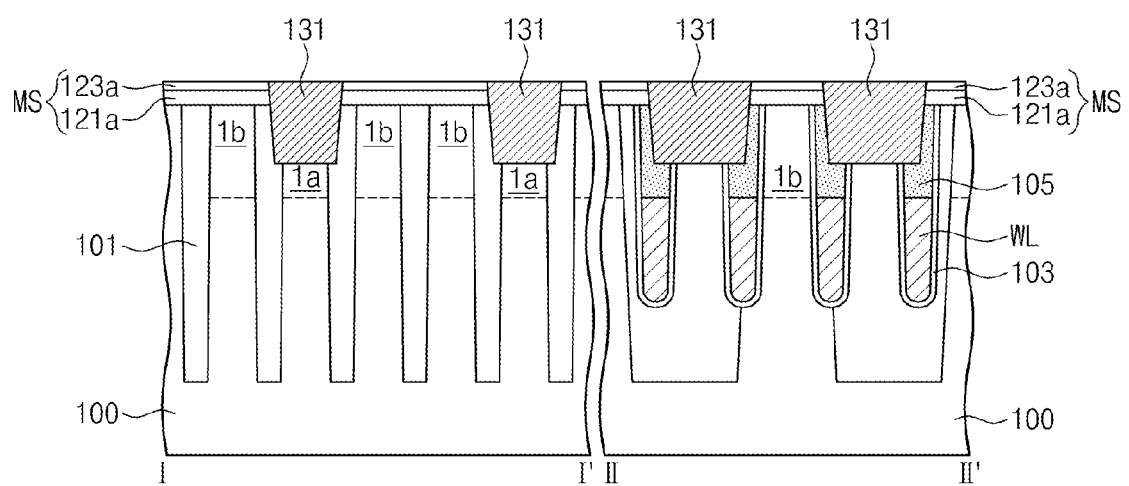

Referring to FIGS. 21A and 21B, a conductive pad 131 may be formed to fill the recess region 125. The conductive pad 131 may surround the mask structures MS when viewed from a plan view. The conductive pad 131 may be in contact with the first dopant regions 1a and may be in contact with the device isolation layer 101 and the gate hard mask patterns 105.

A conductive layer may be formed on the mask structures MS to fill the recess region 125, and then a planarization process may be performed on the conductive layer until top surfaces of the mask structures MS are exposed, thereby forming the conductive pad 131. For example, the conductive pad 131 may include at least one of a doped semiconductor material (e.g., doped silicon), a metal (e.g., tungsten, aluminum, titanium, and/or tantalum), a conductive metal nitride (e.g., titanium nitride, tantalum nitride, and/or tungsten nitride), or a metal-semiconductor compound (e.g., a metal silicide).

Figure 22A:
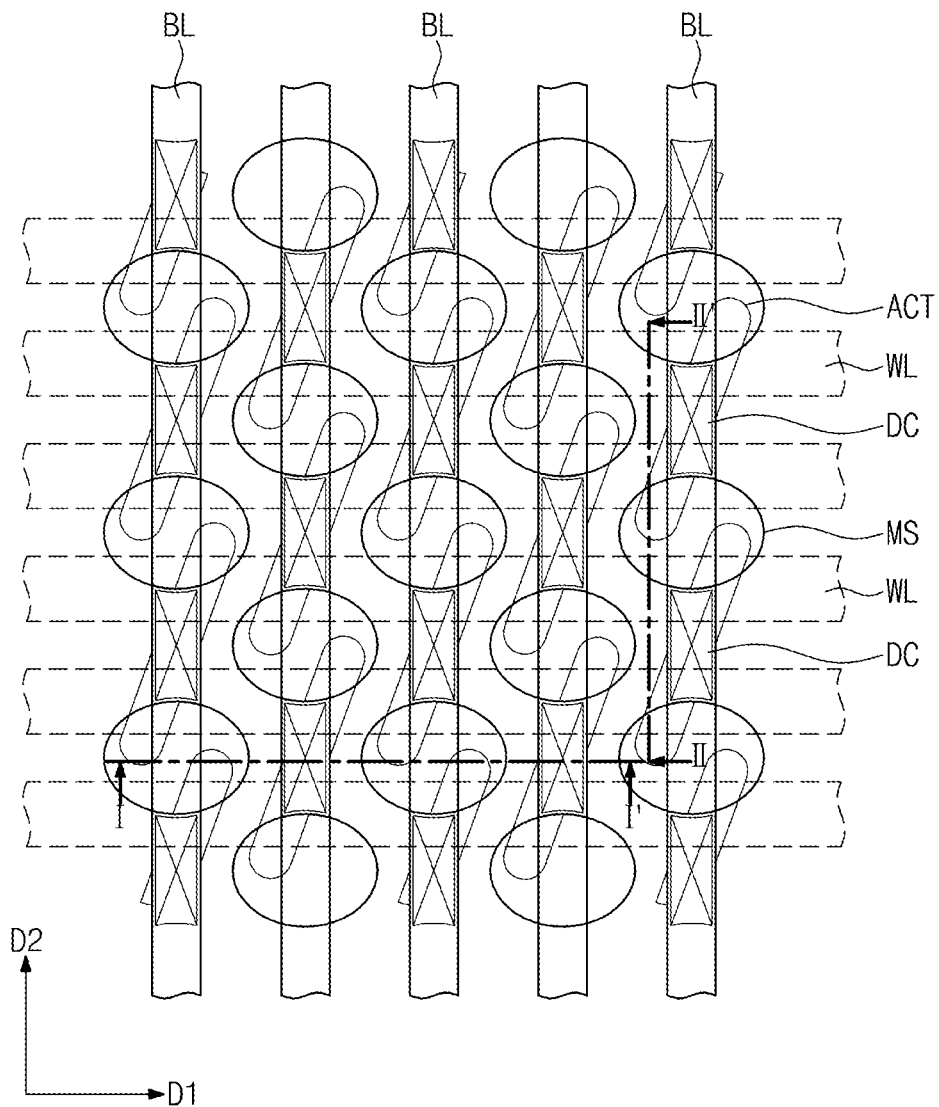
Figure 22B:
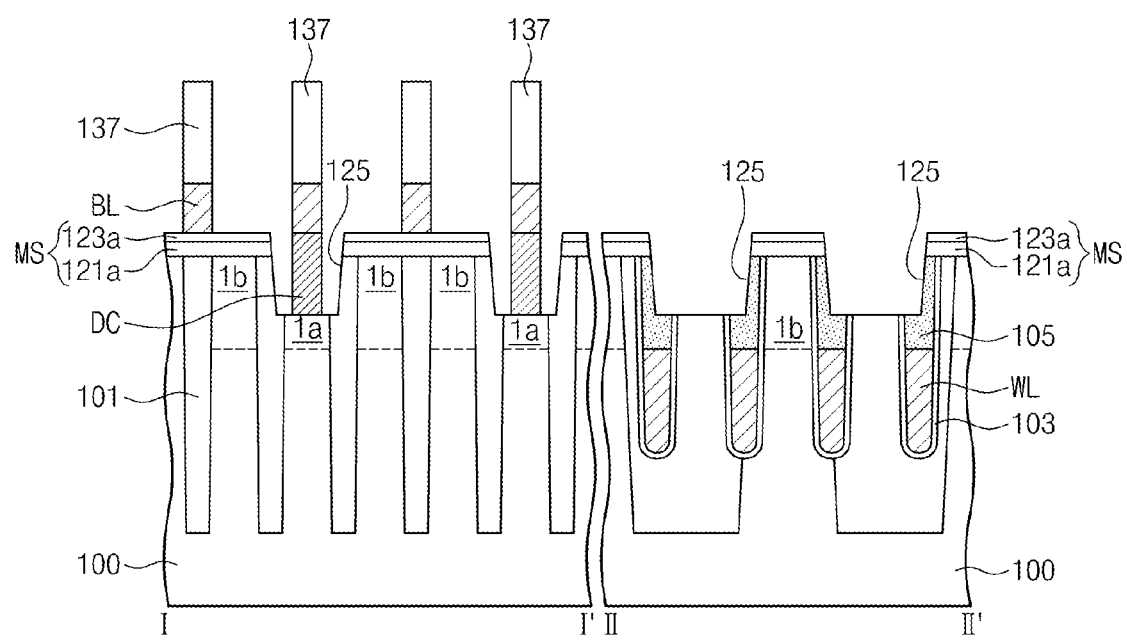

Referring to FIGS. 22A and 22B, bit lines BL may be formed to extend in the second direction D2, and bit line contact patterns DC may be formed to electrically connect the bit lines BL to the first dopant regions 1a.

A bit line conductive layer may be formed on the mask structures MS and the conductive pad 131, and bit line mask patterns 137 may be formed on the bit line conductive layer. The bit line conductive layer and the conductive pad 131 may be anisotropically etched using the bit line mask patterns 137 as etch masks to form the bit lines BL and the bit line contact patterns DC. The bit line contact patterns DC may be locally formed in the recess region 125, and sidewalls of the bit line contact patterns DC may be spaced apart from inner sidewalls of the recess region 125. In some embodiments, widths of the bit line contact patterns DC may be substantially equal to widths of the bit lines BL.

Figure 23A:
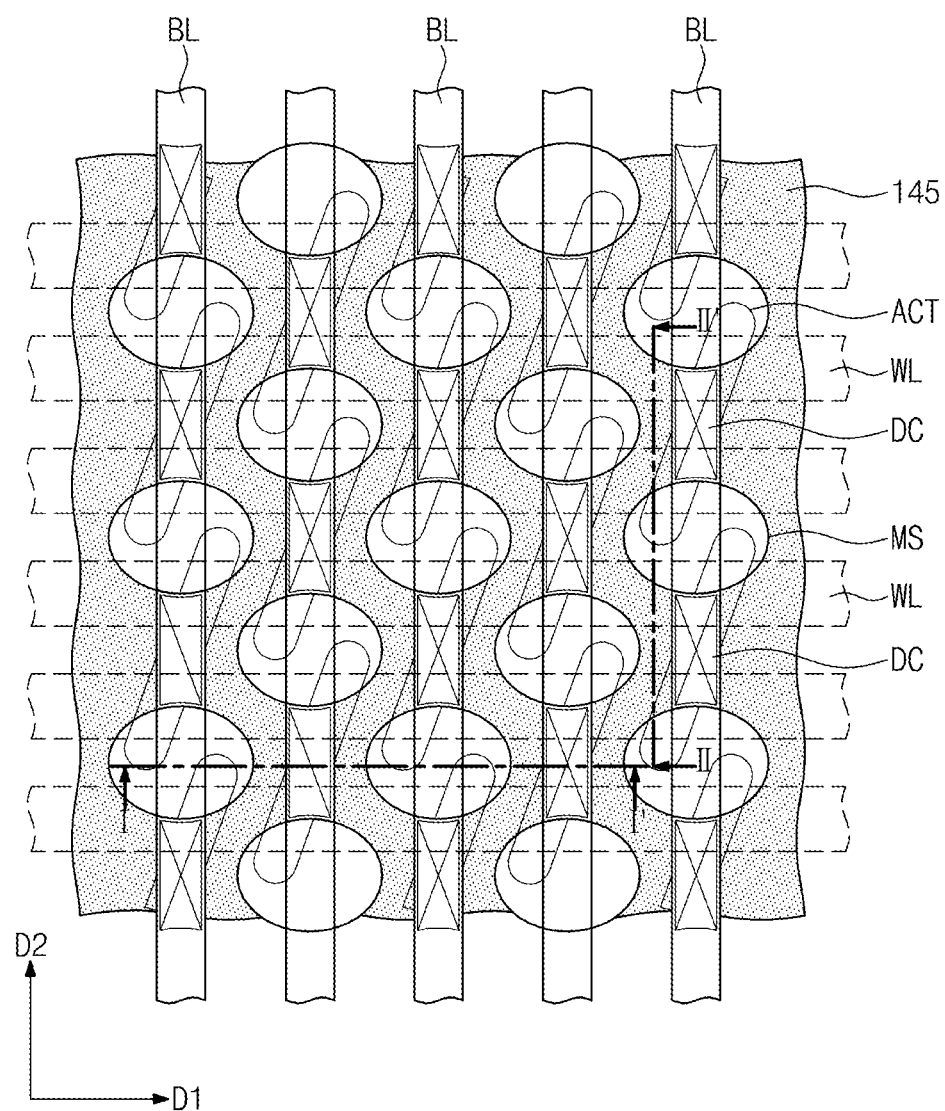
Figure 23B:
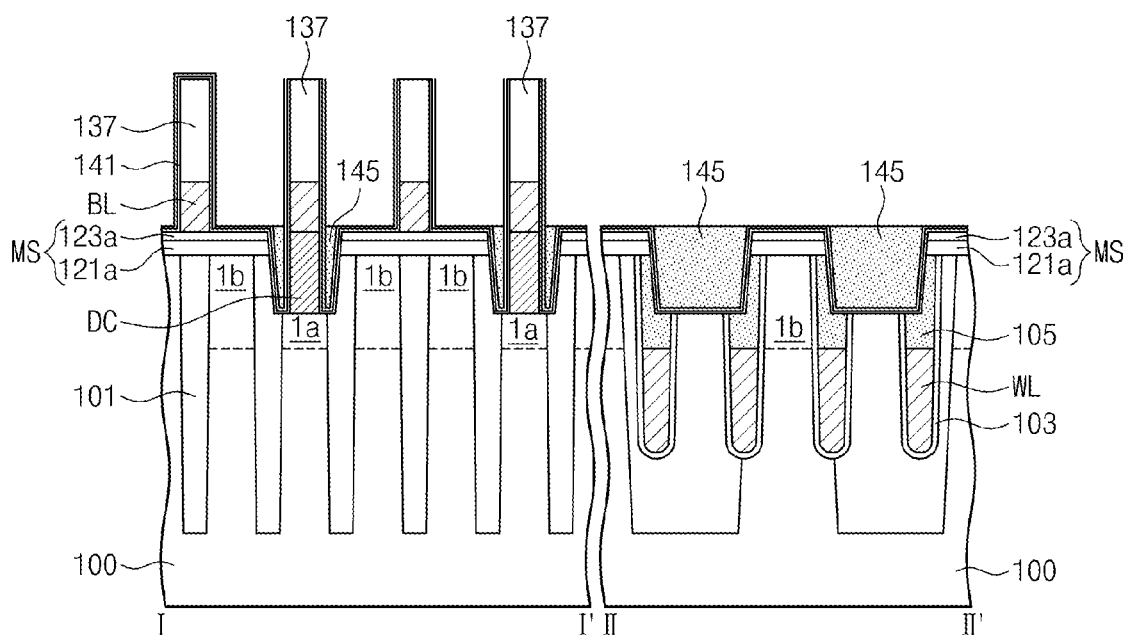

Referring to FIGS. 23A and 23B, bit line contact spacers 145 may be formed to cover the sidewalls of the bit line contact patterns DC. As described with reference to FIGS. 13A, 13B, and 13C, the bit line contact spacer 145 may be formed in the recess region, and the first and second spacer layers 141 and 143 may be formed to conformally cover the inner sidewalls of the recess region before the formation of the bit line contact spacers 145. The first and second spacer layers 141 and 143 may be formed of different insulating materials having an etch selectivity with respect to each other.

In example embodiments, the bit line contact spacers 145 may be formed to fill the recess region between the bit line contact patterns DC and the mask structures MS. In other words, the bit line contact spacers 145 may substantially extend in the second direction D2 and may have rounded sidewalls adjacent to the mask structures MS.

Figure 24A:
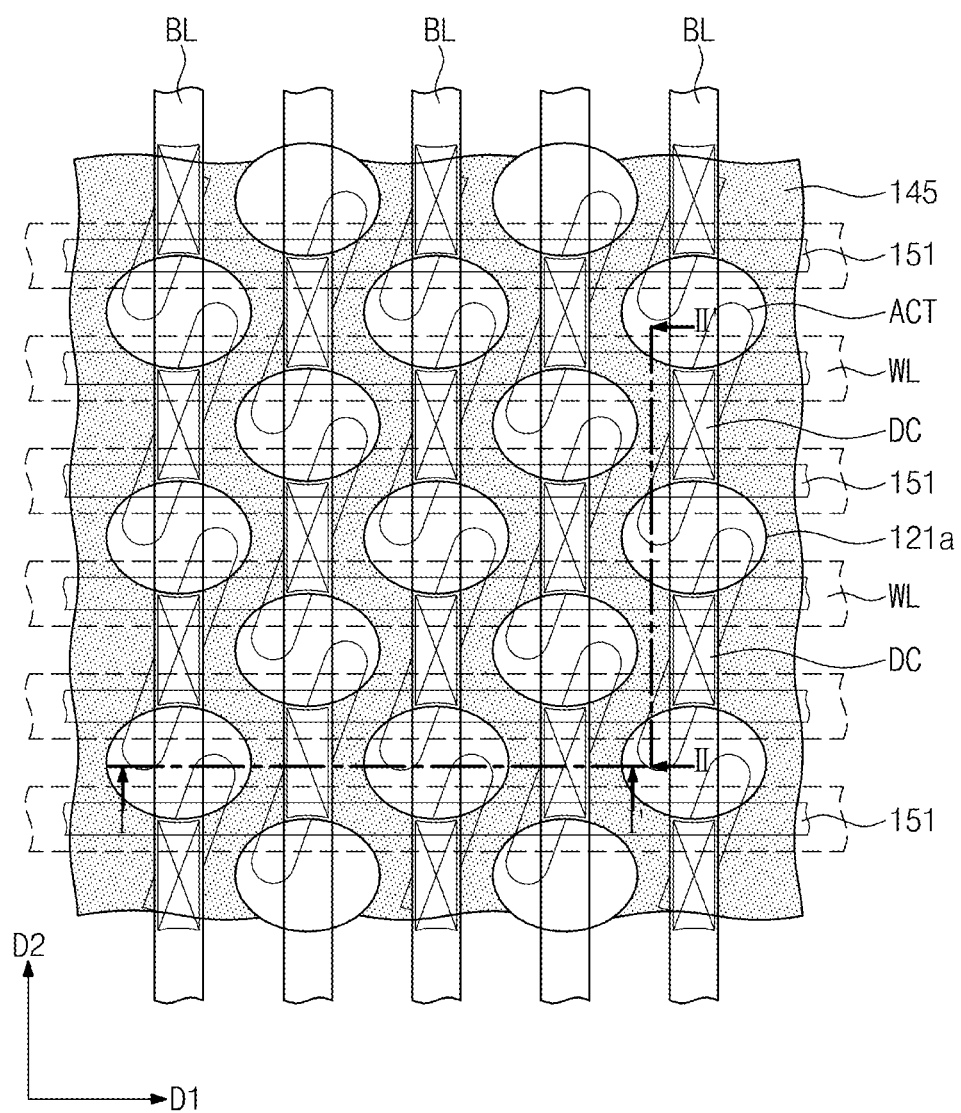
Figure 24B:
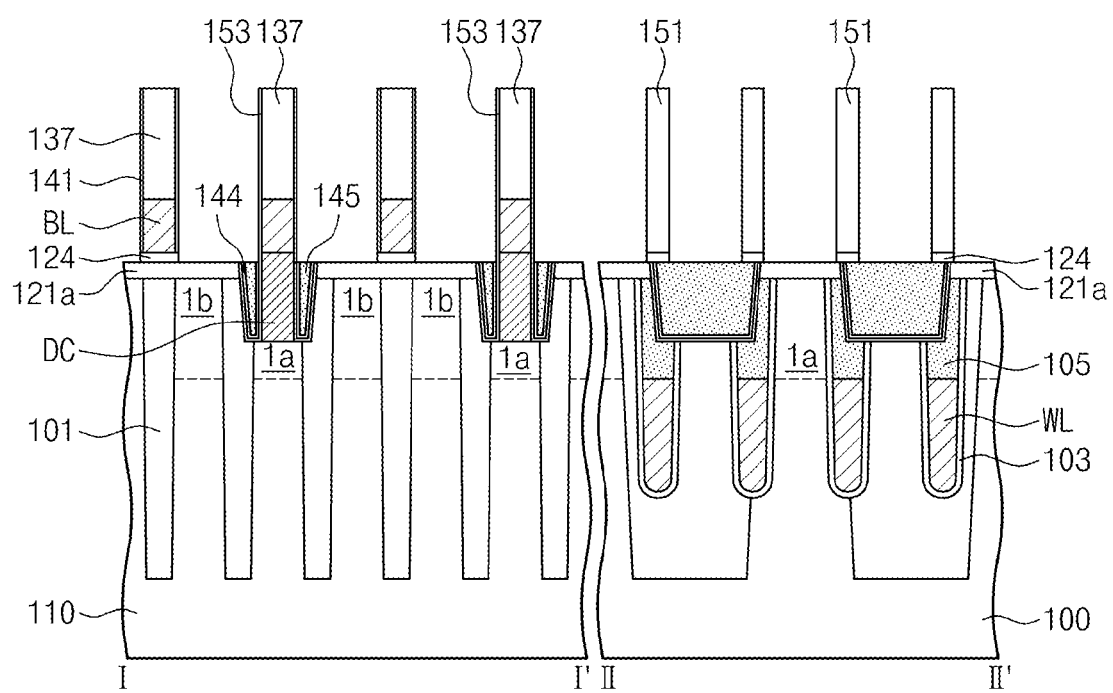

Referring to FIGS. 24A and 24B, mold patterns 151 may be formed to define contact holes 153 between the bit lines BL. As described with reference to FIGS. 14A to 14C and 15A to 15C, the sacrificial patterns 150 may be formed to intersect the bit lines BL and to overlap with the second dopant regions 1b, and then the spaces between the sacrificial patterns 150 may be filled with an insulating material to form the mold patterns 151. The sacrificial patterns 150 may be removed after the formation of the mold patterns 151, as described with reference to FIGS. 15A to 15C. The second spacer layer 143 on the sidewalls of the bit lines BL may be removed during the removal of the sacrificial patterns 150 so that the second spacer 144 may be locally formed in the recess region.

Next, the etch stop pads 123a exposed by the contact holes 153 may be anisotropically etched to locally expose the insulating pads 121a covering the second dopant regions 1b. Thus, etch stop patterns 124 may be formed under the bit lines BL, and top surfaces of the bit line contact spacers 145 may be recessed.

Figure 25A:
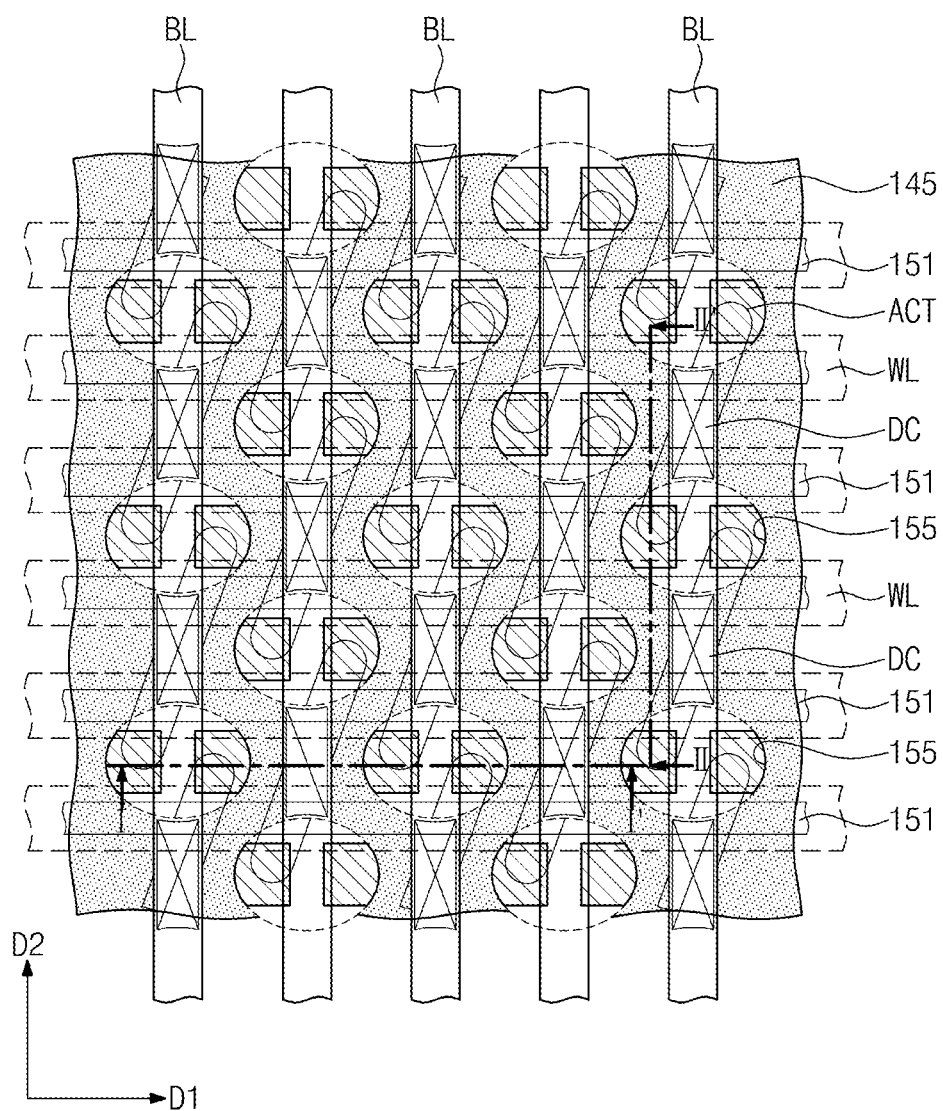
Figure 25B:
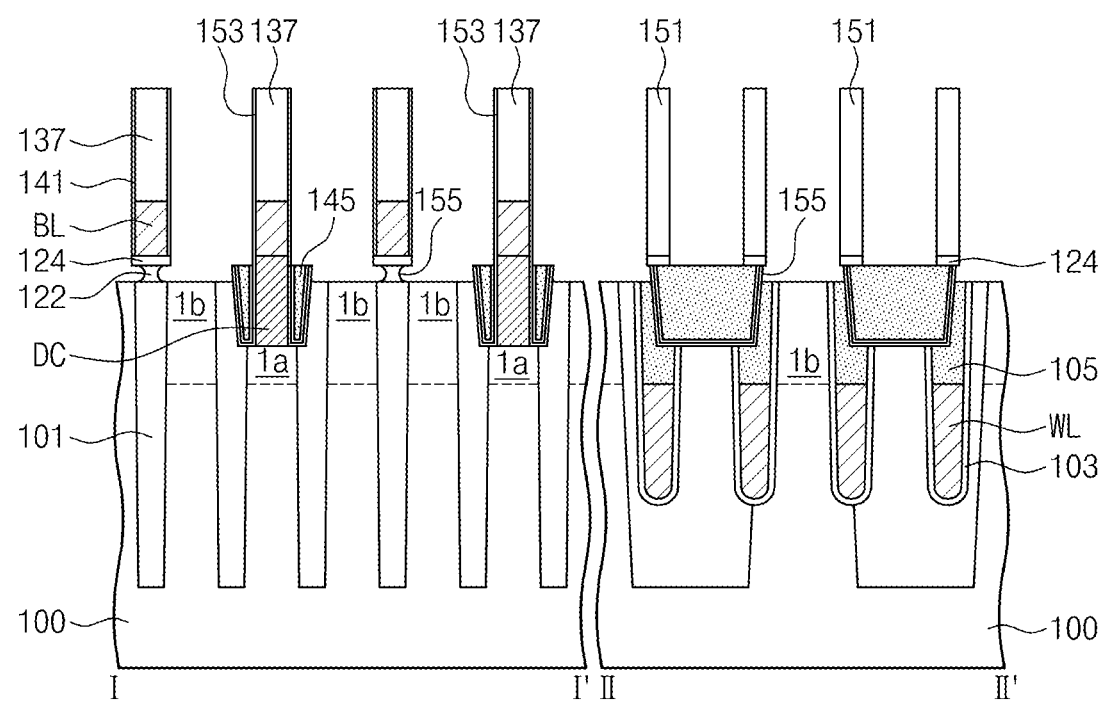

Referring to FIGS. 25A and 25B, the insulating pads 121a exposed by the contact holes 153 may be removed to form lower contact holes 155 exposing the second dopant regions 1b.

According to example embodiments, the lower contact holes 155 may be formed by anisotropically etching the insulating pads 121a exposed by the contact holes 153. Portions of the device isolation layer 101 adjacent to the second dopant regions 1b may be etched during the formation of the lower contact holes 155. Since the lower contact holes 155 are formed, an insulating pattern 122 may be formed between the device isolation layer 101 and the bit line BL. In example embodiments, the insulating pattern 122 may have a rounded sidewall. A width of the insulating pattern 122 under the bit line BL may be smaller than the width of the bit line BL.

During the formation of the lower contact holes 155, the bit line contact spacers 145 may limit (and/or prevent) the bit line contact patterns DC from being exposed and the etch stop patterns 124 may limit (and/or prevent) bottom surfaces of the bit lines BL from being exposed.

Figure 26A:
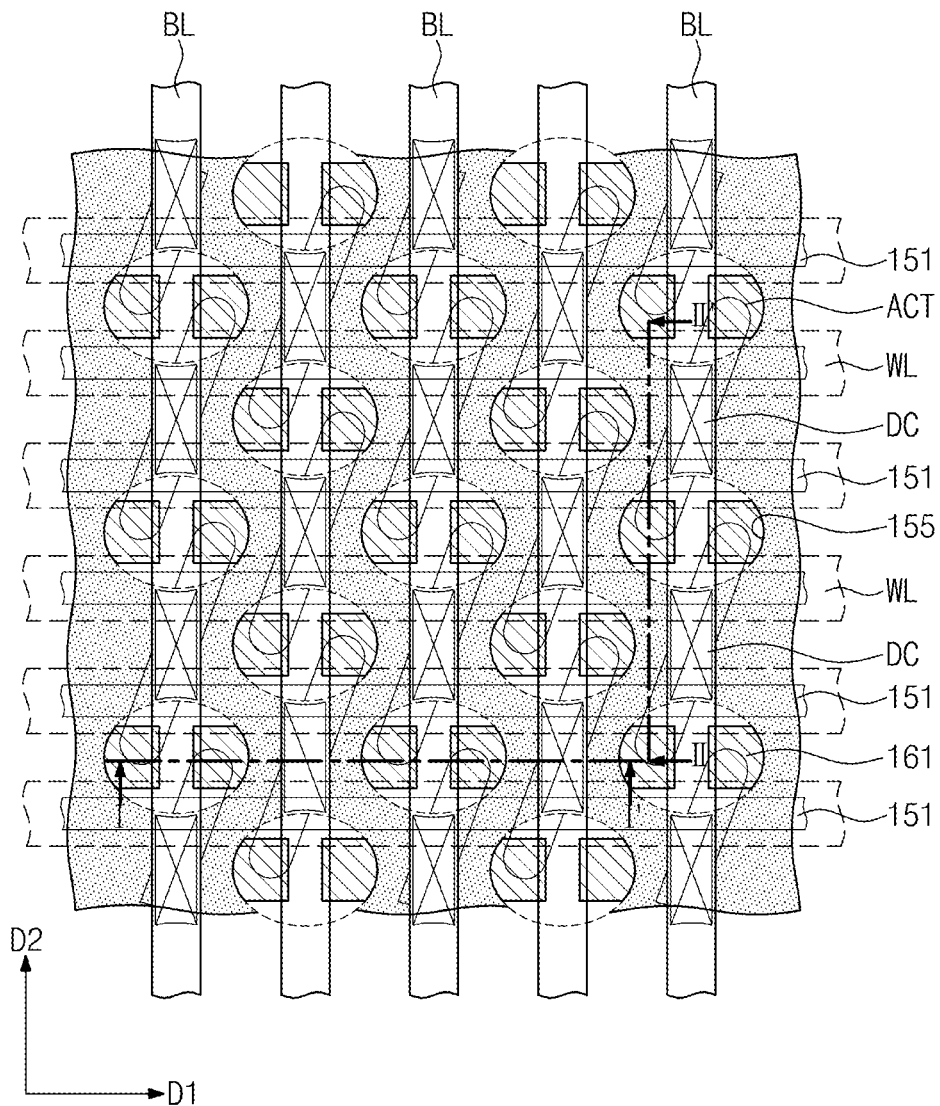
Figure 26B:
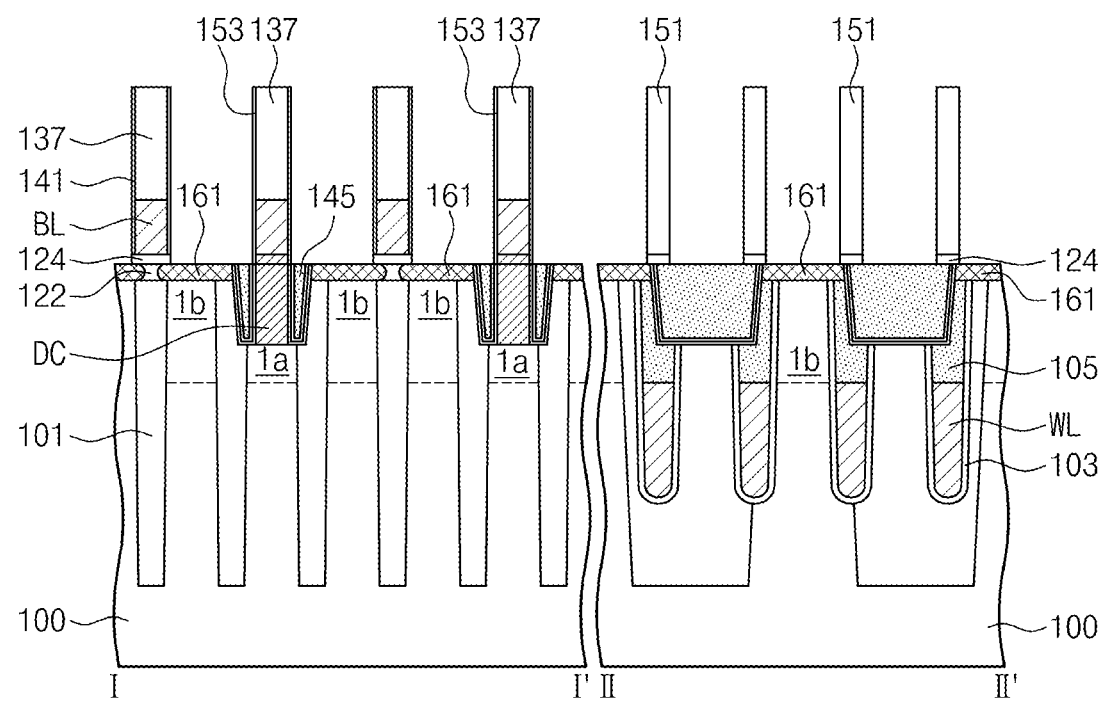

Referring to FIGS. 26A and 26B, contact pads 161 may be formed to fill the lower contact holes 155, respectively. Each of the contact pads 161 may cover the top surface of each of the second dopant regions 1b and a portion of the device isolation layer 101. The contact pads 161 may be adjacent to the bit line contact spacers 145. A pair of contact pads 161 may be disposed with the bit line BL interposed therebetween and may be symmetrical with respect to the bit line BL. The contact pads 161 may have rounded sidewalls by the bit line contact spacers 145, as illustrated in the plan view of FIG. 7.

Figure 27A:
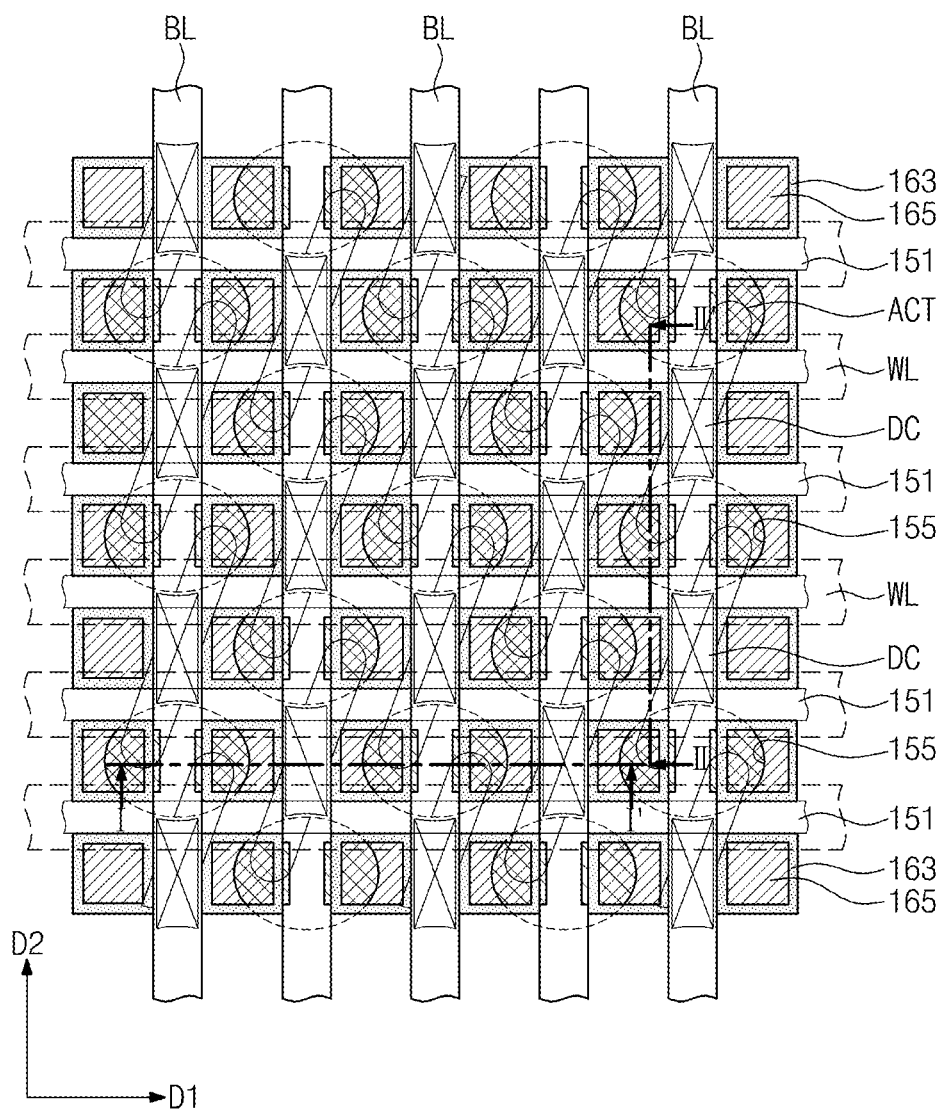
Figure 27B:
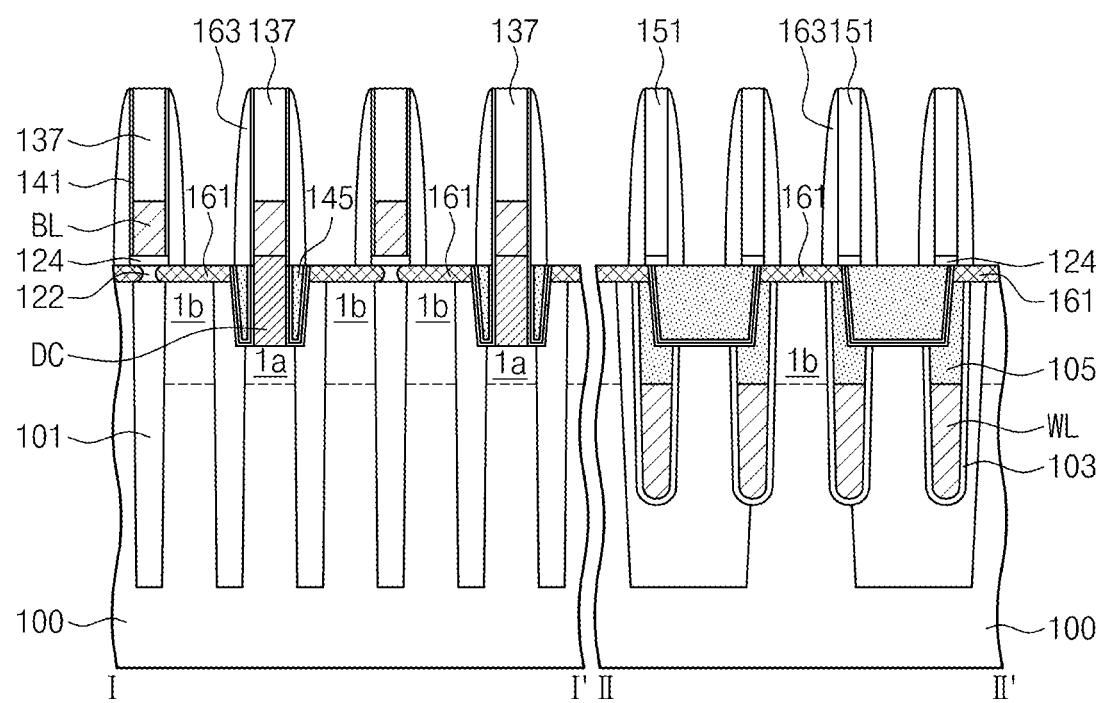

Referring to FIGS. 27A and 27B, a bit line spacer 163 covering an inner sidewall of each of the contact holes 153 may be formed on each of the contact pads 161. The bit line spacer 163 may have a hollow cylindrical shape and may expose a portion of the contact pad 161 and a portion of the bit line contact spacer 145. The bit line spacer 163 may cover portions of the sidewalls of the bit lines BL and portions of the sidewalls of the mold patterns 151, which are exposed by the contact hole 153.

As illustrated in FIGS. 5 and 7, the contact plug 165 may be formed in an upper contact hole defined by each of the bit line spacers 163. The contact plug 165 may be in direct contact with the contact pad 161, and a width of a lower portion of the contact plug 165 may be smaller than a width of the contact pad 161.

Figure 28:
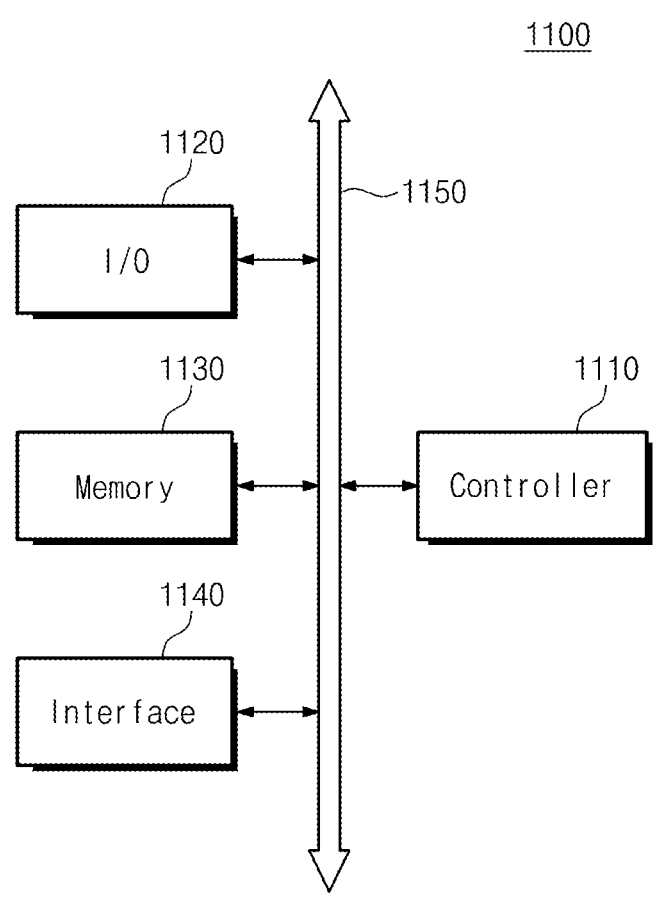
FIG. 28 is a schematic block diagram illustrating an embodiment of an electronic system including a semiconductor device according to example embodiments of inventive concepts.

FIG. 28 is a schematic block diagram illustrating an embodiment of an electronic system including a semiconductor device according to example embodiments of inventive concepts.

Referring to FIG. 28, an electronic system 1100 according to example embodiments of inventive concepts may include a controller 1110, an input/output (I/O) unit 1120, a memory device 1130, an interface unit 1140, and a data bus 1150. At least two of the controller 1110, the I/O unit 1120, the memory device 1130, and the interface unit 1140 may communicate with each other through the data bus 1150. The data bus 1150 may correspond to a path through which electrical data are transmitted. The controller 110, the I/O unit 1120, the memory device 1130, and/or the interface unit 1140 may include at least one of the semiconductor devices according to the aforementioned embodiments of inventive concepts.

The controller 1110 may include at least one of a microprocessor, a digital signal processor, a microcontroller, or other logic devices having a similar function to any one thereof. The I/O unit 1120 may include a keypad, a keyboard and/or a display device. The memory device 1130 may store data and/or commands. The interface unit 1140 may transmit electrical data to a communication network and/or may receive electrical data from a communication network. The interface unit 1140 may operate by wireless or cable. For example, the interface unit 1140 may include an antenna or a cable/wireless transceiver. Although not shown in the drawings, the electronic system 1100 may further include a fast dynamic random access memory (fast DRAM) device and/or a fast static random access memory (fast SRAM) device which acts as a cache memory for improving an operation of the controller 1110.

The electronic system 1100 may be applied to a personal digital assistant (PDA), a portable computer, a web tablet, a wireless phone, a mobile phone, a digital music player, a memory card, or other electronic products receiving and/or transmitting information data by wireless.

Figure 29:
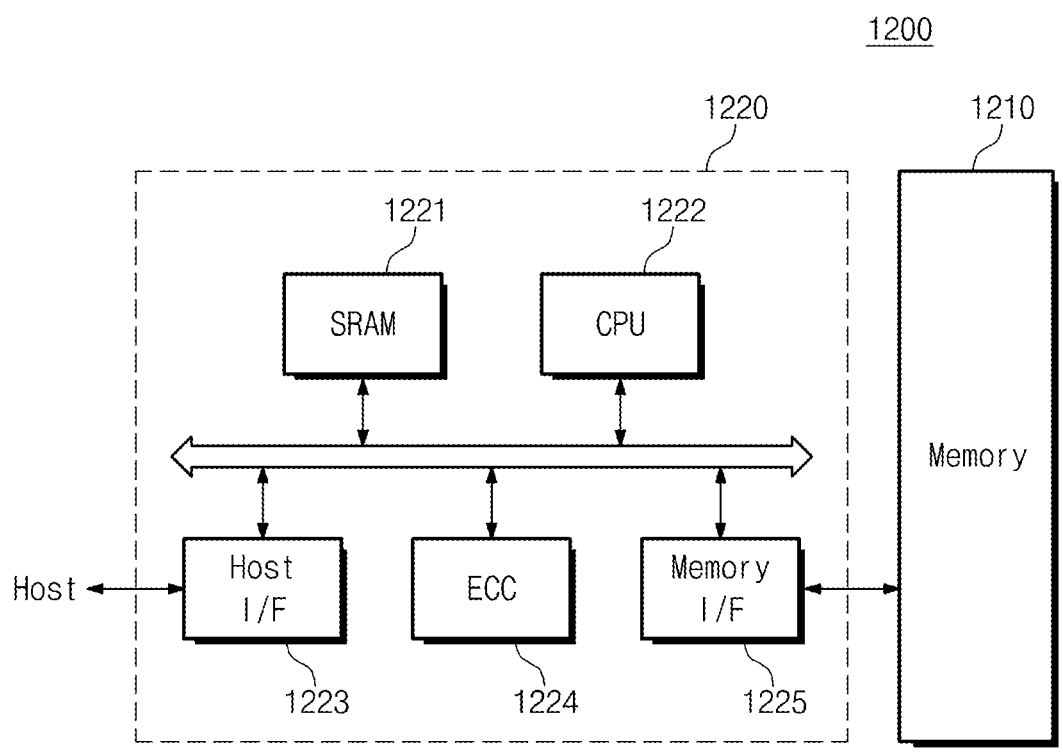
FIG. 29 is a schematic block diagram illustrating a memory card including a semiconductor device according to example embodiments of inventive concepts.

FIG. 29 is a schematic block diagram illustrating a memory card including a semiconductor device according to example embodiments of inventive concepts.

Referring to FIG. 29, a memory card 1200 used for storing massive data may include a memory device 1210 implemented with at least one of the semiconductor devices according to the above mentioned embodiments of inventive concepts. The memory card 1200 may include a memory controller 1220 that controls data communication between a host and the memory device 1210.

A SRAM device 1221 may be used as a working memory of a central processing unit (CPU) 1222. A host interface unit 1223 may be configured to include a data communication protocol between the memory card 1200 and the host. An error check and correction (ECC) block 1224 may detect and correct errors of which data are read out from the memory device 1210. A memory interface unit 1225 may interface with the memory device 1210. The CPU 1222 may control overall operations for data communication of the memory controller 1220. Even though not shown in the drawings, the memory card 1200 may further include a read only memory (ROM) device that stores code data used for interfacing with the host.

Figure 30:
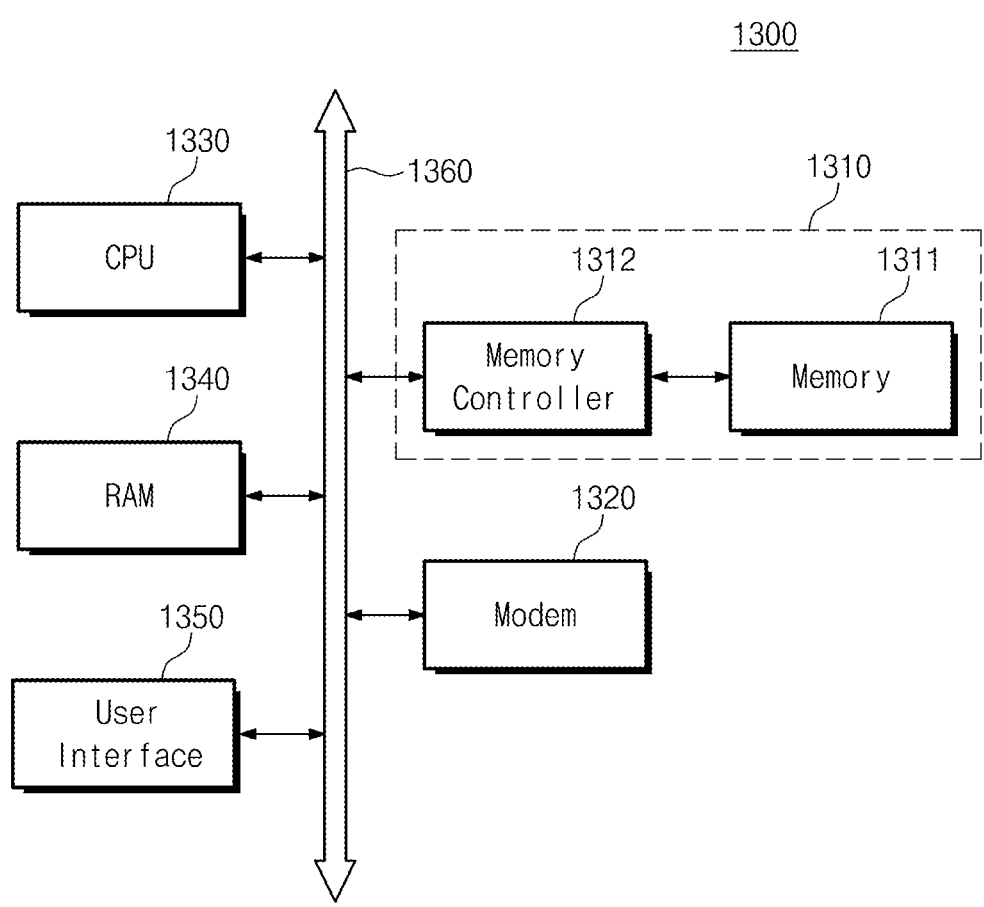
FIG. 30 is a schematic block diagram illustrating an electronic system including a semiconductor device according to example embodiments of inventive concepts.

FIG. 30 is a schematic block diagram illustrating an electronic system including a semiconductor device according to example embodiments of inventive concepts.

Referring to FIG. 30, a memory system 1310 may be installed in an information processing system such as a mobile device or a desk top computer. An information processing system 1300 may include a modem 1320, a central processing unit (CPU) 1330, a random access memory (RAM) 1340, and a user interface unit 1350 that are electrically connected to the memory system 1310 through a system bus 1360. The memory system 1310 may have the substantially same structure as the memory card 1200 described with reference to FIG. 29. The memory system 1310 may include a memory device 1311 and a memory controller 1312. The memory system 1310 may store data processed by the CPU 1330 or data inputted from an external system. In some embodiments, the memory system 1310 may be realized as a solid state disk (SSD). In this case, the information processing system 1300 may stably store massive data into the memory system 1310. In addition, as reliability of the memory system 1310 increases, the memory system 1310 may reduce a resource consumed for correcting errors. Thus, the information processing system 1300 may perform a fast data communication function. Even though not shown in the drawings, the information processing system 1300 may further include an application chipset, a camera image processor (CIS), and/or an input/output (I/O) unit.

According to example embodiments of inventive concepts, the contact structure connected to the second dopant region between the bit lines may include the contact pad being in contact with the second dopant region and the contact plug disposed between the bit lines. Here, the width of the contact pad may be greater than the width of the contact plug. Thus, the contact area between the contact structure and the second dopant region may be increased to improve electrical characteristics of the semiconductor device.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been particularly shown and described, it will be understood by one of ordinary skill in the art that variations in form and detail may be made therein without departing from the spirit and scope of the claims.

What is claimed is:

1. A semiconductor device comprising:
    a semiconductor substrate including active portions, each of the active portions including first and second dopant regions;
    word lines on the substrate, the word lines extending in a first direction and intersecting the active portions;
    first and second bit lines on the substrate, the first and second bit lines intersecting the word lines and extending in a second direction that is perpendicular to the first direction, the first and second bit lines being adjacent to each other and connected to the first dopant regions; and
    contact structures in regions between the word lines and between the first and second bit lines when viewed from a plan view, the contact structures being in contact with the second dopant regions, respectively,
    the contact structures each including a contact plug in contact with a portion of a contact pad, the contact pads of the contact structures contacting the second dopant regions,
    the contact plugs being spaced apart from sidewalls of the first and second bit lines by a first distance between the first and second bit lines, each of the contact plugs having a bottom width that is less than a width of the contact pads, and
    the contact pads being spaced apart from the sidewall of the first bit line by a second distance greater than the first distance and being adjacent to the sidewall of the second bit line.

2. The semiconductor device of claim 1, further comprising:
    a bit line contact pattern between each of the first dopant regions and each of the first bit lines;
    a bit line contact spacer between the bit line contact pattern and the contact pad of one of the contact structures; and
    a bit line spacer between the contact plug of one of the contact structures and the first and second bit lines on the bit line contact spacer.

3. The semiconductor device of claim 2, wherein a width of the bit line contact spacer is greater than a width of the bit line spacer.

4. The semiconductor device of claim 2, wherein widths of the bit line contact patterns are substantially equal to widths of the first and second bit lines.

5. The semiconductor device of claim 2, wherein a bottom surface of the contact pad in one of the contact structures is lower than a top surface of the bit line contact spacer.

6. The semiconductor device of claim 2, wherein the contact pad in one of the contact structures has a rounded sidewall adjacent to the bit line contact spacer when viewed from the plan view.

7. The semiconductor device of claim 1, wherein an overlapping area between the contact pad in one of the contact structures and the active portion is greater than an overlapping area between the contact plug in one of the contact structures and the active portion when viewed from the plan view.

8. The semiconductor device of claim 1, wherein a maximum distance between the contact pads adjacent to each other in the first direction is greater than a width of each of the first and second bit lines.

9. The semiconductor device of claim 1, wherein
    the portion of the contact pad is a first portion,
    the contact pad includes a second portion opposite the first portion,
    the second portion extends horizontally from a bottom of the contact plug, and
    a thickness of the second portion is less than a thickness of the first portion.

10. A semiconductor device comprising:
    a semiconductor substrate including active portions defined by a device isolation layer, each of the active portions including first and second dopant regions that are spaced apart from each other;
    word lines on the substrate, the word lines extending in a first direction and intersecting the active portions;
    bit line contact patterns connected to the first dopant regions between the word lines;
    bit lines connected to the bit line contact patterns, the bit lines extending in a second direction perpendicular to the first direction to intersect the word lines;
    contact pads on the substrate in regions between the word lines and between the bit lines when viewed from a plan view, the contact pads being in contact with the second dopant regions, respectively;
    contact plugs electrically connected to the second dopant regions through the contact pads, each of the contact plugs having a bottom width that is less than a width of the contact pads;
    bit line contact spacers on the substrate between the contact pads and the bit line contact patterns, each of the contact pads having a rounded sidewall adjacent to a corresponding one of the bit line contact spacers when viewed from a plan view; and
    bit line spacers covering sidewalls of the bit lines and being in contact with top surfaces of the contact pads,
    wherein each of the bit line contact patterns is between the contact pads adjacent to each other in the first direction.

11. The semiconductor device of claim 10, wherein
the rounded sidewalls of adjacent contact pads among the contact pads face each other when viewed from the plan view, and
each of the bit line contact patterns between the rounded sidewalls of an adjacent pair of the contact pads.

12. The semiconductor device of claim 10, wherein
the contact plugs are in contact with portions of the contact pads, respectively; and
the bit line spacers are between the bit lines and the contact plugs.

13. The semiconductor device of claim 12, wherein a width of the bit line contact patterns is substantially equal to a width of the bit lines, and
a distance between the bit line contact patterns and adjacent contact pads among the contact pads is greater than a distance between the bit lines and adjacent contact plugs among the contact plugs.

14. The semiconductor device of claim 12, wherein a bottom surface of the contact pads is lower than a top surface of the bit line contact spacers.

15. The semiconductor device of claim 12, wherein a bottom surface of the bit line contact patterns is lower than a bottom surface of the contact pads.

16. The semiconductor device of claim 12, wherein an overlapping area between the contact pads and the active portions is greater than an overlapping area between the contact plugs and the active portions when viewed from the plan view.

17. A semiconductor device comprising:
a semiconductor substrate including a trench that defines a plurality of active portions spaced apart from each other, each of the active portions including first and second dopant regions that are spaced apart from each other;
word lines on the substrate, the word lines intersecting the active portions and extending in a first direction, the word lines spaced apart from each other in a second direction crossing the first direction;
bit lines on the substrate, the bit lines extending in the second direction and being spaced apart from each other in the first direction,
bit line contact patterns spaced apart from each other, the bit line contact patterns electrically connecting the first dopant regions to the bit lines;
contact pads on top of the second dopant regions, each of the contact pads including a portion that extends from a side of a corresponding one of the second dopant regions towards an adjacent one of the bit line contact patterns and is spaced apart from the adjacent one of the bit line contact patterns; and
contact plugs electrically connected to the second dopant regions through the contact pads, each of the contact plugs having a bottom width that is less than a width of the contact pads, each of the contact plugs being on top of the portion of a corresponding one of the contact pads and on top of a corresponding one of the second dopant regions.

18. The semiconductor device of claim 17, wherein
the contact pads and contact plugs define contact structures,
each one of the contact structures includes one of the contact plugs on one of the contact pads,
in at least one of the contact structures, a separation distance between a side of the contact plug of the contact structure and a side of one of the bit line contact patterns closest to the contact structure is less than a separation distance between the contact pad of the contact structure and the side of the one of the bit line contact patterns closest to the contact structure.

19. The semiconductor device of claim 17, further comprising:
bit line spacers on the substrate between the contact plugs and the bit line contact patterns, wherein
parts of the bit line spacers are on top of the contact pads at sides of the contact pads opposite the portions of the contact pads.

20. The semiconductor device of claim 17, further comprising:
data storage structures on the contact plugs.

21. The semiconductor device of claim 17, wherein a top surface of the first dopant regions is below a top surface of the second dopant regions.

* * * * *